US012622128B2

(12) United States Patent
Seo et al.

(10) Patent No.: US 12,622,128 B2
(45) Date of Patent: May 5, 2026

(54) LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Satoshi Seo, Sagamihara (JP); Tsunenori Suzuki, Yokohama (JP); Takumu Okuyama, Atsugi (JP); Yusuke Takita, Yokohama (JP); Naoaki Hashimoto, Sagamihara (JP); Hiromi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 505 days.

(21) Appl. No.: 16/977,663

(22) PCT Filed: Sep. 20, 2019

(86) PCT No.: PCT/IB2019/057955
§ 371 (c)(1),
(2) Date: Sep. 2, 2020

(87) PCT Pub. No.: WO2020/065471
PCT Pub. Date: Apr. 2, 2020

(65) Prior Publication Data

US 2021/0367177 A1 Nov. 25, 2021

(30) Foreign Application Priority Data

| | | |
|---|---|---|
| Sep. 26, 2018 | (JP) | 2018-180795 |
| Oct. 10, 2018 | (JP) | 2018-191552 |
| Nov. 29, 2018 | (JP) | 2018-224074 |

(51) Int. Cl.
*H10K 50/11* (2023.01)
*H10K 50/15* (2023.01)
(Continued)

(52) U.S. Cl.
CPC .......... *H10K 50/11* (2023.02); *H10K 85/624* (2023.02); *H10K 85/626* (2023.02);
(Continued)

(58) Field of Classification Search
None
See application file for complete search history.

(56) References Cited

U.S. PATENT DOCUMENTS 6,864,628 B2 3/2005 Yamazaki et al.
7,042,151 B2 5/2006 Yamazaki et al.
(Continued)

FOREIGN PATENT DOCUMENTS

CN 102142525 A 8/2011
CN 107665955 A 2/2018
(Continued)

OTHER PUBLICATIONS

The English translation of JP 2009/029726 A and the original JP 2009/029726 A, Jan. 12, 2009, Michiko Tamano (Year: 2009).*
(Continued)

*Primary Examiner* — Seokmin Jeon
(74) *Attorney, Agent, or Firm* — Fish & Richardson P.C.

(57) ABSTRACT

A light-emitting device including an EL layer including a first layer, a second layer, a third layer, a light-emitting layer, and a fourth layer in this order from the anode side is provided. The first layer contains a first organic compound and a second organic compound. The light-emitting layer contains a sixth organic compound. The fourth layer contains a seventh organic compound. The first organic compound exhibits an electron-accepting property with respect
(Continued)

to the second organic compound. A HOMO level of the second organic compound is higher than or equal to −5.7 eV and lower than or equal to −5.2 eV. A HOMO level of the third organic compound is equal to or deeper than the HOMO level of the second organic compound. A difference between the HOMO levels of the second organic compound and the third organic compound is less than or equal to 0.2 eV.

28 Claims, 50 Drawing Sheets

(51) Int. Cl.
*H10K 50/17* (2023.01)
*H10K 59/12* (2023.01)
*H10K 85/60* (2023.01)
*H10K 101/10* (2023.01)
*H10K 101/30* (2023.01)
*H10K 101/40* (2023.01)

(52) U.S. Cl.
CPC ......... *H10K 85/633* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 50/15* (2023.02); *H10K 50/17* (2023.02); *H10K 59/12* (2023.02); *H10K 2101/10* (2023.02); *H10K 2101/30* (2023.02); *H10K 2101/40* (2023.02)

(56) References Cited

U.S. PATENT DOCUMENTS

| | | | | |
|---|---|---|---|---|
| 7,199,519 | B2 | 4/2007 | Yamazaki et al. | |
| 7,372,199 | B2 | 5/2008 | Yamazaki et al. | |
| 8,049,418 | B2 | 11/2011 | Yamazaki et al. | |
| 8,057,712 | B2 | 11/2011 | Zeika et al. | |
| 8,415,876 | B2 | 4/2013 | Yamazaki et al. | |
| 8,421,346 | B2 | 4/2013 | Osaka et al. | |
| 8,431,243 | B2 | 4/2013 | Kwong et al. | |
| 8,614,334 | B2 | 12/2013 | Osaka et al. | |
| 8,975,813 | B2 | 3/2015 | Yamazaki et al. | |
| 9,040,720 | B2 | 5/2015 | Osaka et al. | |
| 9,059,421 | B2 | 6/2015 | Seo et al. | |
| 9,130,177 | B2 | 9/2015 | Ma et al. | |
| 9,142,786 | B2 | 9/2015 | Kwong et al. | |
| 9,190,621 | B2 | 11/2015 | Ma et al. | |
| 9,368,741 | B2 | 6/2016 | Ishisone et al. | |
| 9,391,289 | B2 | 7/2016 | Seo et al. | |
| 9,577,201 | B2 | 2/2017 | Kwong et al. | |
| 9,614,164 | B2 | 4/2017 | Osaka et al. | |
| 9,653,697 | B2 | 5/2017 | Ishisone et al. | |
| 9,660,211 | B2 | 5/2017 | Seo et al. | |
| 9,673,415 | B2 | 6/2017 | Gao et al. | |
| 9,698,365 | B2 | 7/2017 | Seo et al. | |
| 9,853,227 | B2 | 12/2017 | Ma et al. | |
| 9,911,930 | B2 | 3/2018 | Kwong et al. | |
| 10,008,677 | B2 | 6/2018 | Xia et al. | |
| 10,230,060 | B2 | 3/2019 | Kwong et al. | |
| 10,263,195 | B2 | 4/2019 | Osaka et al. | |
| 10,361,389 | B2 | 7/2019 | Seo et al. | |
| 10,411,193 | B2 | 9/2019 | Kawakami et al. | |
| 10,424,755 | B2 | 9/2019 | Seo et al. | |
| 10,454,054 | B2 | 10/2019 | Ishisone et al. | |
| 10,497,880 | B2 | 12/2019 | Osaka et al. | |
| 10,600,975 | B2 | 3/2020 | Kwong et al. | |
| 10,680,189 | B2 | 6/2020 | Xia et al. | |
| 10,862,059 | B2 | 12/2020 | Seo et al. | |
| 10,930,855 | B2 | 2/2021 | Takita et al. | |
| 11,101,432 | B2 | 8/2021 | Kawakami et al. | |
| 11,107,995 | B2 | 8/2021 | Hara et al. | |
| 11,233,201 | B2 | 1/2022 | Li et al. | |
| 11,322,709 | B2 | 5/2022 | Seo et al. | |
| 11,374,180 | B2 | 6/2022 | Xia et al. | |
| 11,495,755 | B2 | 11/2022 | Kwong et al. | |
| 12,089,490 | B2 | 9/2024 | Kawakami et al. | |
| 12,089,491 | B2 | 9/2024 | Kawakami et al. | |
| 2009/0072725 | A1 | 3/2009 | Suzuki et al. | |
| 2009/0102368 | A1* | 4/2009 | Shitagaki | 313/504 |
| 2010/0001636 | A1* | 1/2010 | Yabunouchi | 313/504 |
| 2010/0059741 | A1 | 3/2010 | Ohsawa et al. | |
| 2011/0057178 | A1* | 3/2011 | Shitagaki | 257/40 |
| 2011/0127510 | A1 | 6/2011 | Seo et al. | |
| 2011/0156013 | A1* | 6/2011 | Kim | 257/40 |
| 2011/0210316 | A1* | 9/2011 | Kadoma | 257/40 |
| 2012/0133273 | A1 | 5/2012 | Inoue et al. | |
| 2013/0020561 | A1* | 1/2013 | Suzuki | 257/40 |
| 2013/0032785 | A1 | 2/2013 | Ma et al. | |
| 2013/0207082 | A1* | 8/2013 | Cho | 257/40 |
| 2015/0115239 | A1 | 4/2015 | Pflumm et al. | |
| 2015/0243892 | A1 | 8/2015 | Ogita et al. | |
| 2015/0340636 | A1 | 11/2015 | Kroeber et al. | |
| 2016/0093812 | A1 | 3/2016 | Stoessel et al. | |
| 2016/0248033 | A1 | 8/2016 | Uesaka et al. | |
| 2016/0268513 | A1 | 9/2016 | Ishisone. et al. | |
| 2016/0351833 | A1 | 12/2016 | Hosoumi et al. | |
| 2017/0040535 | A1* | 2/2017 | Ogita | H01L 51/006 |
| 2017/0062734 | A1* | 3/2017 | Suzuki | H01L 51/0072 |
| 2017/0077418 | A1 | 3/2017 | Stoessel et al. | |
| 2017/0222156 | A1* | 8/2017 | Kawakami | H01L 51/0061 |
| 2017/0271610 | A1 | 9/2017 | Takahashi | |
| 2018/0033993 | A1 | 2/2018 | Seo et al. | |
| 2018/0114916 | A1 | 4/2018 | Hayashi et al. | |
| 2019/0019961 | A1 | 1/2019 | Heo et al. | |
| 2019/0115541 | A1* | 4/2019 | Xia | H01L 51/0055 |
| 2019/0363259 | A1 | 11/2019 | Kawakami et al. | |
| 2020/0321541 | A1 | 10/2020 | Hosoumi et al. | |
| 2022/0271248 | A1 | 8/2022 | Seo et al. | |
| 2022/0285632 | A1 | 9/2022 | Xia et al. | |

FOREIGN PATENT DOCUMENTS

| | | | |
|---|---|---|---|
| CN | 107925009 | A | 4/2018 |
| DE | 112019003850 | | 4/2021 |
| EP | 2330652 | A | 6/2011 |
| EP | 2433929 | A | 3/2012 |
| EP | 2465912 | A | 6/2012 |
| EP | 2489716 | A | 8/2012 |
| EP | 2554548 | A | 2/2013 |
| EP | 3024045 | A | 5/2016 |
| EP | 3282496 | A | 2/2018 |
| EP | 3327100 | A | 5/2018 |
| EP | 3389108 | A | 10/2018 |
| EP | 3567646 | A | 11/2019 |
| EP | 3719099 | A | 10/2020 |
| JP | 2002-151269 | A | 5/2002 |
| JP | 2010-225975 | A | 10/2010 |
| JP | 2011-139044 | A | 7/2011 |
| JP | 2012-092087 | A | 5/2012 |
| JP | 2012-169613 | A | 9/2012 |
| JP | 2013-040159 | A | 2/2013 |
| JP | 2013-232629 | A | 11/2013 |
| JP | 2014-241405 | A | 12/2014 |
| JP | 2015-173263 | A | 10/2015 |
| JP | 2016-100595 | A | 5/2016 |
| JP | 2016-157692 | A | 9/2016 |
| JP | 2016-225619 | A | 12/2016 |
| JP | 2017-076780 | A | 4/2017 |
| JP | 2017-139457 | A | 8/2017 |
| JP | 2018-002710 | A | 1/2018 |
| JP | 2018-026552 | A | 2/2018 |
| KR | 2011-0061500 | A | 6/2011 |
| KR | 2016-0059402 | A | 5/2016 |
| KR | 2016-0103932 | A | 9/2016 |
| KR | 2018-0013773 | A | 2/2018 |
| KR | 2018-0044985 | A | 5/2018 |
| TW | 201133976 | | 10/2011 |
| TW | 201311704 | | 3/2013 |
| TW | 201407854 | | 2/2014 |
| TW | 201700452 | | 1/2017 |
| TW | 201724611 | | 7/2017 |

(56) References Cited

FOREIGN PATENT DOCUMENTS

| | | |
|---|---|---|
| TW | 201735392 | 10/2017 |
| TW | 201736357 | 10/2017 |
| TW | 201832395 | 9/2018 |
| WO | WO-2008/109824 | 9/2008 |
| WO | WO-2010/110034 | 9/2010 |
| WO | WO-2011/027653 | 3/2011 |
| WO | WO-2011/065136 | 6/2011 |
| WO | WO-2012/070596 | 5/2012 |
| WO | WO-2012/148511 | 11/2012 |
| WO | WO-2013/150968 | 10/2013 |
| WO | WO-2014/021443 | 2/2014 |
| WO | WO-2017/037559 | 3/2017 |
| WO | WO-2017/103732 | 6/2017 |
| WO | WO-2017/130079 | 8/2017 |
| WO | WO-2017/158475 | 9/2017 |
| WO | WO-2017/188680 | 11/2017 |
| WO | WO-2018/158659 | 9/2018 |
| WO | WO-2019/082024 | 5/2019 |
| WO | WO-2020/026077 | 2/2020 |

OTHER PUBLICATIONS

The English translation of KR 2015/0090836 A and the original KR 2015/0090836 A, Hyung Sun Kim et al., Aug. 6, 2015 (Year: 2015).*

R. G. Kepler et al. "Electron and hole mobility in tris(8-hydroxyquinolinolato-N1,O8) aluminum", Appl. Phys. Lett. 1995, vol. 66, p. 3618-3620 (Year: 1995).*

The material property of Alq by Ossila, web page address—https://www.ossila.com/products/alq3 ?_ pos=1&_sid=84d2d64c6&_ss=r (Year: 2025).*

Kang et al. ("Silane- and triazine-containing hole and exciton blocking material for high-efficiency phosphorescent organic light emitting diodes", J. Mater. Chem. 2007, vol. 17, p. 3714- 3719.*

Taiwanese Office Action (Application No. 110112524) Dated May 17, 2021.

International Search Report (Application No. PCT/IB2019/057955) Dated Nov. 12, 2019.

Written Opinion (Application No. PCT/IB2019/057955) Dated Nov. 12, 2019.

Okachi.T et al., "Determination of Charge-Carrier Mobility in Organic Light-Emitting Diodes by Impedance Spectroscopy in Presence of Localized States", Jpn. J. Appl. Phys. (Japanese Journal of Applied Physics) , Dec. 19, 2008, vol. 47, No. 12, pp. 8965-8972.

Chinese Office Action (Application No. 202110361826.0) Dated Dec. 20, 2021.

Taiwanese Office Action (Application No. 108134326) Dated Apr. 27, 2023.

Nullity Action (German Patent No. 112019004819), Oct. 8, 2024.

Supplementary submission to the Nullity Action (German Patent No. 112019004819), Oct. 8, 2024.

Excerpts from the statement of claim in the parallel patent infringement action against the nullity plaintiff before the Dusseldorf Regional Court (4b O 35/24), Oct. 8, 2024.

Hans P.L. et al., Organische Chemie—Chemie-Basiswissen II, 7th edition, Chapters 5, 22 and 29, 2016, Springer-Verlag Berlin Heidelberg.

Quinoxaline, Benzimidazole, 1,3,5-Triazine, Carbazole, Dibenzofuran, Dibenzothiophene, and Anthracene, Aug. 5, 2024.

Bathocuproine, Aug. 8, 2024.

Helmut.Y, Highly Efficient OLEDs with Phosphorescent Materials, 1st edition, Chapter 1, 2007, Wiley-VCH Verlag Gmbh & Co. KGaA, Weinheim, Germany.

NPB (NPD), Aug. 20, 2024.

Wang.Y et al., "Investigation of the hole transport characterization and mechanisms in co-evaporated organic semiconductor mixtures", RSC Advances, May 30, 2017, vol. 7, No. 45, pp. 28494-28498, The Royal Society of Chemistry.

Nullity Action (German Patent No. 112019004819), Feb. 7, 2025.

Xue.W et al., "Identifying the Electrostatic and Entropy-Related Mechanisms for Charge-Transfer Exciton Dissociation at Doped Organic Heterojunctions", Adv. Funct. Mater. (Advanced Functional Materials), Apr. 17, 2021, vol. 31, No. 25, pp. 2101892-1-2101892-11.

The priority document JP 2018-144189 dated Jul. 31, 2018 of WO2020/026077A.

* cited by examiner

LIGHT-EMITTING DEVICE, LIGHT-EMITTING APPARATUS, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2019/057955, filed on Sep. 20, 2019, and claims the benefit of foreign priority applications filed in Japan on Sep. 26, 2018, as Application No. 2018-180795, on Oct. 10, 2018, as Application No. 2018-191552, and on Nov. 29, 2018, as Application No. 2018-224074, all of which are incorporated by reference.

TECHNICAL FIELD

Embodiments of the present invention relate to a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL elements) including organic compounds and utilizing electroluminescence (EL) have been put to more practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Since such light-emitting devices are of self-light-emitting type, light-emitting devices have advantages over liquid crystal displays when used as pixels of a display in that visibility of pixels is high and backlight is not required. Displays including such light-emitting devices are also highly advantageous in that they can be thin and lightweight. Moreover, such a light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps. Thus, light-emitting devices also have great potential as planar light sources, which can be applied to lighting devices and the like.

Displays or lighting devices including light-emitting devices can be suitably used for a variety of electronic devices as described above, and research and development of light-emitting devices have progressed for higher efficiency or longer lifetimes.

In a structure disclosed in Patent Document 1, a hole-transport material whose HOMO level is between the HOMO level of a first hole-injection layer and the HOMO level of a host material is provided between a light-emitting layer and a first hole-transport layer in contact with the hole-injection layer.

Although the characteristics of light-emitting devices have been improved remarkably, advanced requirements for various characteristics including efficiency and durability are not yet satisfied.

REFERENCE

[Patent Document]

[Patent Document 1] PCT International Publication No. WO2011/065136

DISCLOSURE OF INVENTION

An object of one embodiment of the present invention is to provide a novel light-emitting device. Another object of one embodiment of the present invention is to provide a light-emitting device with high emission efficiency. Another object of one embodiment of the present invention is to provide a light-emitting device with a long lifetime. Another object of one embodiment of the present invention is to provide a light-emitting device with low driving voltage.

Another object of one embodiment of the present invention is to provide a light-emitting apparatus, an electronic device, and a display device each having high reliability. Another object of one embodiment of the present invention is to provide a light-emitting apparatus, an electronic device, and a display device each with low power consumption.

It is only necessary that at least one of the above-described objects be achieved in the present invention.

One embodiment of the present invention is a light-emitting device including an anode, a cathode, and an EL layer between the anode and the cathode. The EL layer includes a light-emitting layer. A decay curve showing a change in luminance of light emission obtained when a constant current is supplied to the light-emitting device has a maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The fifth organic compound is an emission center substance. The HOMO level of the second organic compound is higher than or equal to −5.7 eV and lower than or equal to −5.2 eV. The electron mobility of the seventh organic compound when a square root of electric field strength [V/cm] is 600 is higher than or equal to $1\times10^{-7}$ $cm^2/Vs$ and lower than or equal to $5\times10^{-5}$ $cm^2/Vs$. A decay curve showing a change in luminance of light emission obtained when a constant current is supplied to the light-emitting device has a maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The fifth organic compound is an emission center substance. The HOMO level of the second organic compound is higher than or equal to −5.7 eV and lower than or equal to −5.2 eV. The HOMO level of the third organic compound is equal to or deeper than the HOMO level of the second organic compound. A difference between the HOMO levels of the second organic compound and the third organic compound is less than or equal to 0.2 eV. The electron mobility of the seventh organic compound when a square root of electric field strength [V/cm] is 600 is higher than or equal to $1\times10^{-7}$ $cm^2/Vs$ and lower than or equal to $5\times10^{-5}$ $cm^2/Vs$. A decay curve showing a change in luminance of light emission obtained when a constant current is supplied to the light-emitting device has a maximum value.

Another embodiment of the present invention is a light-emitting device having the above structure, in which the decay curve has a portion exceeding 100%.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The fifth organic compound is an emission center substance. The HOMO level of the second organic compound is higher than or equal to −5.7 eV and lower than or equal to −5.2 eV. The HOMO level of the third organic compound is equal to or deeper than the HOMO level of the second organic compound. A difference between the HOMO levels of the second organic compound and the third organic compound is less than or equal to 0.2 eV. The electron mobility of the seventh organic compound when a square root of electric field strength [V/cm] is 600 is higher than or equal to $1\times10^{-7}$ $cm^2/Vs$ and lower than or equal to $5\times10^{-5}$ $cm^2/Vs$.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The fifth organic compound is an emission center substance. The HOMO level of the second organic compound is higher than or equal to −5.7 eV and lower than or equal to −5.2 eV. The HOMO level of the third organic compound is equal to or deeper than the HOMO level of the second organic compound. A difference between the HOMO levels of the second organic compound and the third organic compound is less than or equal to 0.2 eV. The LUMO level of the sixth organic compound is shallower than the LUMO level of the seventh organic compound. A difference between the LUMO levels of the sixth organic compound and the seventh organic compound is greater than or equal to 0.1 eV and less than or equal to 0.3 eV.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The fifth organic compound is an emission center substance. The HOMO level of the second organic compound is higher than or equal to −5.7 eV and lower than or equal to −5.2 eV. The HOMO level of the third organic compound is equal to or deeper than the HOMO level of the second organic compound. A difference between the HOMO levels of the second organic compound and the third organic compound is less than or equal to 0.2 eV. The seventh organic compound is a π-electron deficient heteroaromatic compound.

Another one embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The second organic compound has a first hole-transport skeleton. The third organic compound has a second hole-transport skeleton. The fourth organic compound has a third hole-transport skeleton. The fifth organic compound is an emission center substance. The HOMO level of the second organic compound is higher than or equal to −5.7 eV and lower than or equal to −5.2 eV. Each of the first hole-transport skeleton, the second hole-transport skeleton, and the third hole-transport skeleton is independently any one of a carbazole skeleton, a dibenzofuran skeleton, a dibenzothiophen skeleton, and an anthracene skeleton. The electron mobility of the seventh organic compound when a square root of electric field strength [V/cm] is 600 is higher than or equal to $1\times10^{-7}$ $cm^2/Vs$ and lower than or equal to $5\times10^{-5}$ $cm^2/Vs$.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The second organic compound has a first hole-transport skeleton. The third organic compound has a second hole-transport skeleton. The fourth organic compound has a third hole-transport skeleton. The fifth organic compound is an emission center substance. The HOMO level of the second organic compound is higher than or equal to −5.7 eV and lower than or equal to −5.2 eV. Each of the first hole-transport skeleton, the second hole-transport skeleton, and the third hole-transport skeleton is independently any one of a carbazole skeleton, a dibenzofuran skeleton, a dibenzothiophen skeleton, and an anthracene skeleton. The LUMO level of the sixth organic compound is shallower than the LUMO level of the seventh organic compound. A difference between the LUMO levels of the sixth organic compound and the seventh organic compound is greater than or equal to 0.1 eV and less than or equal to 0.3 eV.

Another embodiment of the present invention is a light-emitting device including an anode, a cathode, and an EL layer between the anode and the cathode. The EL layer comprises a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound. The first organic compound exhibits an electron-accepting property with respect to the second organic compound. The second organic compound has a first hole-transport skeleton. The third organic compound has a second hole-transport skeleton. The fourth organic compound has a third hole-transport skeleton. The fifth organic compound is an emission center substance. The HOMO level of the second organic compound is higher than or equal to −5.7 eV and lower than or equal to −5.2 eV. Each of the first hole-transport skeleton, the second hole-transport skeleton, and the third hole-transport skeleton is independently any one of a carbazole skeleton, a dibenzofuran skeleton, a dibenzothiophen skeleton, and an anthracene skeleton. The seventh organic compound is a π-electron deficient heteroaromatic compound.

Another embodiment of the present invention is a light-emitting device having the above structure, in which the π-electron deficient heteroaromatic compound has any of a quinoxaline skeleton, a benzimidazole skeleton, and a triazine skeleton.

Another embodiment of the present invention is a light-emitting device having the above structure, in which the sixth organic compound consists of hydrocarbon, the HOMO level of the sixth organic compound is deeper than the HOMO level of the fourth organic compound, and a difference between the HOMO levels of the fourth organic compound and the sixth organic compound is greater than or equal to 0.2 eV and less than or equal to 0.4 eV.

Another embodiment of the present invention is a light-emitting device having the above structure, in which the sixth organic compound has an anthracene skeleton and a heterocyclic skeleton and a difference between the HOMO levels of the fourth organic compound and the sixth organic compound is less than 0.2 eV.

Another embodiment of the present invention is a light-emitting device having the above structure, in which the sixth organic compound has an anthracene skeleton and a heterocyclic skeleton, and two carbazole rings are bonded to a naphthalene ring in the fourth organic compound.

Another embodiment of the present invention is a light-emitting device having the above structure, in which the sixth organic compound has an anthracene skeleton and a heterocyclic skeleton and the fourth organic compound is 3,3'-(naphthalene-1,4-diyl)bis(9-phenyl-9H-carbazole).

Another embodiment of the present invention is a light-emitting device having the above structure, in which the sixth organic compound has an anthracene skeleton and a heterocyclic skeleton, the HOMO level of the second organic compound is higher than or equal to −5.4 eV and lower than or equal to −5.7 eV, and the electron mobility of the seventh organic compound is lower than the electron mobility of the sixth organic compound in the case where a square root of electric field strength [V/cm] is 600.

Another embodiment of the present invention is a light-emitting device having the above structure, in which a difference between the HOMO levels of the third organic compound and the fourth organic compound is less than or equal to 0.2 eV.

Another embodiment of the present invention is a light-emitting device having the above structure, in which the HOMO level of the fourth organic compound is deeper than the HOMO level of the third organic compound.

Another embodiment of the present invention is a light-emitting device having the above structure, in which the second organic compound has a dibenzofuran skeleton.

Another embodiment of the present invention is a light-emitting device having the above structure, in which the seventh organic compound has a quinoxaline skeleton.

Another embodiment of the present invention is a light-emitting device having the above structure, in which the second organic compound and the third organic compound are the same substance.

Another embodiment of the present invention is a light-emitting device having the above structure, in which the fifth organic compound is a blue fluorescent material.

Another embodiment of the present invention is an electronic device including a sensor, an operation button, a speaker, or a microphone in the above structure.

Another embodiment of the present invention is a light-emitting apparatus including a transistor or a substrate in the above structure.

Another embodiment of the present invention is a lighting device including a housing in the above structure.

Note that the light-emitting apparatus in this specification includes, in its category, an image display device that uses a light-emitting device. The light-emitting apparatus may be included in a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. The light-emitting apparatus may be included in a lighting device or the like.

One embodiment of the present invention can provide a novel light-emitting device. Another embodiment of the present invention can provide a light-emitting device with a long lifetime. Another embodiment of the present invention can provide a light-emitting device with high emission efficiency.

Another embodiment of the present invention can provide a light-emitting apparatus, an electronic device, and a display device each having high reliability. Another embodiment of the present invention can provide a light-emitting apparatus, an electronic device, and a display device each with low power consumption.

Note that the descriptions of the effects do not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 7A, 7B1, 7B2, and 7C illustrate electronic devices;

BEST MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

Figure 1A:
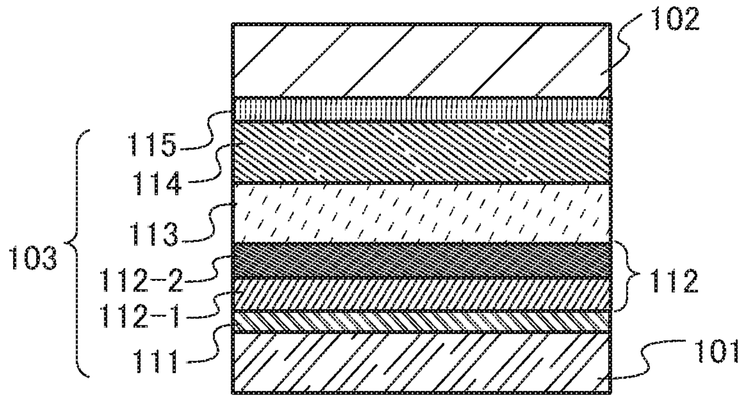
FIGS. 1A to 1C are schematic diagrams of light-emitting devices.

FIG. 1A illustrates a light-emitting device of one embodiment of the present invention. The light-emitting device of one embodiment of the present invention includes an anode 101, a cathode 102, and an EL layer 103. The EL layer 103 includes a hole-injection layer 111, a hole-transport layer 112, a light-emitting layer 113, and an electron-transport layer 114.

Although FIG. 1A additionally illustrates an electron-injection layer 115 in the EL layer 103, the structure of the light-emitting device is not limited thereto. As long as the above-described components are included, a layer having another function may be included.

The hole-injection layer 111 contains a first organic compound and a second organic compound. The first organic compound exhibits an electron-accepting property with respect to the second organic compound. The second organic compound has a relatively deep HOMO level which is higher than or equal to −5.7 eV and lower than or equal to −5.2 eV. The second organic compound with a relatively deep HOMO level allows easy hole injection into the hole-transport layer 112.

As the first organic compound, organic compounds having an electron-withdrawing group (in particular, a cyano group or a halogen group such as a fluoro group) can be used, for example. A substance that exhibits an electron-accepting property with respect to the second organic compound is appropriately selected from such organic compounds. Examples of such an organic compound include 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyrene-2-ylidene)malononitrile. A compound in which electron-withdrawing groups are bonded to a condensed aromatic ring having a plurality of heteroatoms, such as HAT-CN, is preferable because it is thermally stable. A [3]radialene derivative having an electron-withdrawing group (in particular, a cyano group or a halogen group such as a fluoro group) has a very high electron-accepting property and thus is preferred. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second organic compound is preferably an organic compound having a hole-transport property and any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group may be used. Note that the second organic compound having an N,N-bis(4-biphenyl)amino group is preferable because a light-emitting device with a long lifetime can be manufactured. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4- yl)phenyl]-4-amino-p-terphenyl (abbreviation: DBfBBlP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4-(2;1'-binaphthyl-6-yl)-4',4"-diphenyltriphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl) naphthyl-2-yltriphenylamine (abbreviation: BBAPβNB-03), 4-(6;2'-binaphthyl-2-yl)-4',4"-diphenyltriphenylamine (abbreviation: BBA(βN2)B), 4-(2;2'-binaphthyl-7-yl)-4',4"-diphenyltriphenylamine (abbreviation: BBA(βN2)B-03), 4-(1;2'-binaphthyl-4-yl)-4',4"-diphenyltriphenylamine (abbreviation: BBAβNaNB), 4-(1;2'-binaphthyl-5-yl)-4',4"-diphenyltriphenylamine (abbreviation: BBAβNaNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-(1-naphthyl)-4'-phenyltriphenylamine (abbreviation: αNBA1BP), 4,4'-bis(1-naphthyl)triphenylamine (abbreviation: aNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl) amine (abbreviation: YGTBi1BP-02), 4-[4'-(carbazol-9-yl) biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi [9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

The hole-transport layer 112 includes a first hole-transport layer 112-1 and a second hole-transport layer 112-2. The first hole-transport layer 112-1 is closer to the anode 101 side than the second hole-transport layer 112-2 is. Note that the second hole-transport layer 112-2 also functions as an electron-blocking layer in some cases.

The first hole-transport layer 112-1 and the second hole-transport layer 112-2 contain a third organic compound and a fourth organic compound, respectively.

The third organic compound and the fourth organic compound are preferably organic compounds having a hole-transport property. As the third organic compound and the fourth organic compound, the organic compound that can be used as the second organic compound can be similarly used.

It is preferable that materials of the second organic compound and the third organic compound be selected so that the HOMO level of the third organic compound is deeper than that of the second organic compound and a difference between the HOMO levels is less than or equal to 0.2 eV. Note that it is more preferable that the second organic compound and the third organic compound be the same substance. In addition, the HOMO level of the fourth organic compound is preferably deeper than that of the third organic compound. It is preferable that materials of the third organic compound and the fourth organic compound be selected so that a difference between the HOMO levels is less than or equal to 0.2 eV. Owing to the above-described relation between the HOMO levels of the second organic compound to the fourth organic compound, holes are injected into each layer smoothly, which prevents an increase in driving voltage and deficiency of holes in the light-emitting layer.

Note that each of the second organic compound to the fourth organic compound preferably has a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. In addition, materials of adjacent layers (e.g., the second organic compound and the third organic compound or the third organic compound and the fourth organic compound) preferably have the same hole-transport skeleton, in which case holes can be injected smoothly. In particular, a dibenzofuran skeleton is preferably used as the hole-transport skeleton.

Furthermore, materials contained in adjacent layers (e.g., the second organic compound and the third organic compound or the third organic compound and the fourth organic compound) are preferably the same, in which case holes can be injected smoothly. In particular, the second organic compound and the third organic compound are preferably the same material.

The light-emitting layer 113 contains a fifth organic compound and a sixth organic compound. The fifth organic compound is an emission center substance, and the sixth organic compound is a host material in which the fifth organic compound is to be dispersed.

As the emission center substance, fluorescent substances, phosphorescent substances, substances exhibiting thermally activated delayed fluorescence (TADF), or other light-emitting materials may be used. Furthermore, the light-emitting layer 113 may be a single layer or include a plurality of layers containing different light-emitting materials. Note that one embodiment of the present invention is more preferably used in the case where the light-emitting layer 113 emits fluorescence, specifically, blue fluorescence.

Examples of the material that can be used as a fluorescent substance in the light-emitting layer 113 are as follows. Fluorescent substances other than those can also be used.

Examples of the fluorescent substance include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N'-bis(3-methylphenyl)-N,N-bis[3-(9-phenyl-9H-fluoren-9-yl) phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N, 9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N'-triphenyl-1,4-phenylenediamine (abbreviation: 2DPAPPA), N,N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N,N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N,N'-tetrakis(4-methylphenyl) tetracene-5,11-diamine (abbreviation: p-mPhTD), 7,14-diphenyl-N,N,N,N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the emission center substance in the light-emitting layer 113 are as follows.

Examples of the material include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: $Ir(mpptz\text{-}dmp)_3$), tris(5-methyl-3,4-diphenyl-4H-1,2,4-triazolato)iridium(III) (abbreviation: $Ir(Mptz)_3$), and tris[4-(3-biphenyl)-5-isopropyl-3-phenyl-4H-1,2,4-triazolato]iridium(III) (abbreviation: $Ir(iPrptz\text{-}3b)_3$); organometallic iridium complexes having a 1H-triazole skeleton, such as tris[3-methyl-1-(2-methylphenyl)-5-phenyl-1H-1,2,4-triazolato] iridium(III) (abbreviation: $Ir(Mptz1\text{-}mp)_3$) and tris(1-methyl-5-phenyl-3-propyl-1H-1,2,4-triazolato)iridium(III) (abbreviation: $Ir(Prptz1\text{-}Me)_3$); organometallic iridium complexes having an imidazole skeleton, such as fac-tris[1-(2,6-diisopropylphenyl)-2-phenyl-1H-imidazole]iridium(III) (abbreviation: $Ir(iPrpmi)_3$) and tris[3-(2,6-dimethylphenyl)-7-methylimidazo[1,2-f]phenanthridinato]iridium(III) (abbreviation: $Ir(dmpimpt\text{-}Me)_3$); and organometallic iridium complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $Ir(CF_3ppy)_2(pic)$), and bis[2-(4',6v-difluorophenyl)pyridinato-N,$C^{2'}$]iridium(III) acetylacetonate (abbreviation: FIr(acac)). These compounds emit blue phosphorescence having an emission peak at 440 nm to 520 nm.

Other examples include organometallic iridium complexes having a pyrimidine skeleton, such as tris(4-methyl-6-phenylpyrimidinato)iridium(III) (abbreviation: $Ir(mppm)_3$), tris(4-tert-butyl-6-phenylpyrimidinato)iridium(III) (abbreviation: $Ir(tBuppm)_3$), (acetylacetonato)bis(6-methyl-4-phenylpyrimidinato)iridium(III) (abbreviation: $Ir(mppm)_2(acac)$), (acetylacetonato)bis(6-tert-butyl-4-phenylpyrimidinato)iridium(III) (abbreviation: $Ir(tBuppm)_2(acac)$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $Ir(mpmppm)_2(acac)$), and (acetylacetonato)bis(4,6-diphenylpyrimidinato)iridium(III) (abbreviation: $Ir(dppm)_2(acac)$); organometallic iridium complexes having a pyrazine skeleton, such as (acetylacetonato)bis(3,5-dimethyl-2-phenylpyrazinato) iridium(III) (abbreviation: $Ir(mppr\text{-}Me)_2(acac)$) and (acetylacetonato)bis(5-isopropyl-3-methyl-2-phenylpyrazinato) iridium(III) (abbreviation: $Ir(mppr\text{-}iPr)_2(acac)$); organometallic iridium complexes having a pyridine skeleton, such as tris(2-phenylpyridinato-N,$C^{2'}$)iridium(III) (abbreviation: $Ir(ppy)_3$), bis(2-phenylpyridinato-N,$C^{2'}$)iridium(III) acetylacetonate (abbreviation: $Ir(ppy)_2acac$), bis(benzo[h]quinolinato)iridium(III) acetylacetonate (abbreviation: $Ir(bzq)_2(acac)$), tris(benzo[h]quinolinato)iridium(III) (abbreviation: $Ir(bzq)_3$), tris(2-phenylquinolinato-N,$C^{2'}$)iridium(III) (abbreviation: $Ir(pq)_3$), and bis(2-phenylquinolinato-N,$C^{2'}$)iridium(III) acetylacetonate (abbreviation: $Ir(pq)_2(acac)$); and a rare earth metal complex such as tris(acetylacetonato) (monophenanthroline)terbium(III) (abbreviation: $Tb(acac)_3(Phen)$). These are mainly compounds that emit green phosphorescence and have an emission peak at 500 nm to 600 nm. Note that organometallic iridium complexes having a pyrimidine skeleton have distinctively high reliability and emission efficiency and thus are especially preferable.

Other examples include organometallic iridium complexes having a pyrimidine skeleton, such as (diisobutyrylmethanato)bis[4,6-bis(3-methylphenyl)pyrimidinatoiridium(III) (abbreviation: $Ir(5mdppm)_2(dibm)$), bis[4,6-bis(3-methylphenyl)pyrimidinato (dipivaloylmethanato)iridium(III) (abbreviation: $Ir(5mdppm)_2(dpm)$), and bis[4,6-di(naphthalen-1-yl)pyrimidinato(dipivaloylmethanato)iridium(III) (abbreviation: $Ir(d1npm)_2(dpm)$); organometallic iridium complexes having a pyrazine skeleton, such as (acetylacetonato)bis(2,3,5-triphenylpyrazinato)iridium(III) (abbreviation: $Ir(tppr)_2(acac)$), bis(2,3,5-triphenylpyrazinato) (dipivaloylmethanato)iridium(III) (abbreviation: $Ir(tppr)_2(dpm)$), and (acetylacetonato)bis[2,3-bis(4-fluorophenyl)quinoxalinatoiridium(III) (abbreviation: $Ir(Fdpq)_2(acac)$); organometallic iridium complexes having a pyridine skeleton, such as tris(1-phenylisoquinolinato-N,$C^{2'}$)iridium (III) (abbreviation: $Ir(piq)_3$) and bis(1-phenylisoquinolinato-N,$C^{2'}$)iridium(III) acetylacetonate (abbreviation: $Ir(piq)_2acac$); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato) (monophenanthroline)europium(III) (abbreviation: $Eu(DBM)_3(Phen)$) and tris[1-(2-thenoyl)-3,3,3-trifluoroacetonato (monophenanthroline) europium(III) (abbreviation: $Eu(TTA)_3(Phen)$). These compounds emit red phosphorescence having an emission peak at 600 nm to 700 nm. Furthermore, the organometallic iridium complexes having a pyrazine skeleton can provide red light emission with favorable chromaticity.

Besides the above phosphorescent compounds, known phosphorescent materials may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 1]

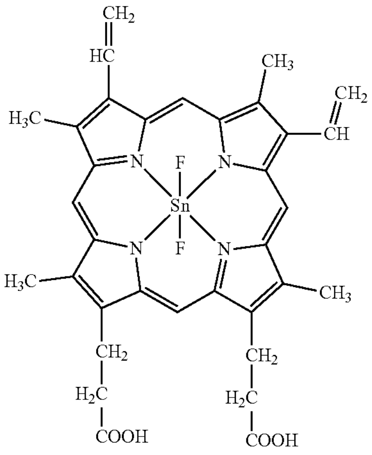

$SnF_2$(Proto IX)

-continued

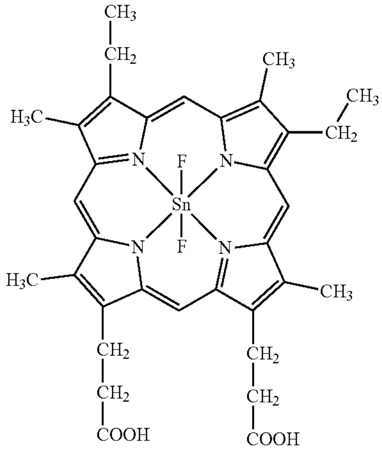

$SnF_2$(Meso IX)

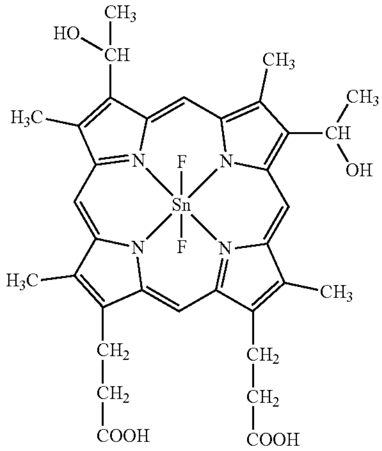

$SnF_2$(Hemato IX)

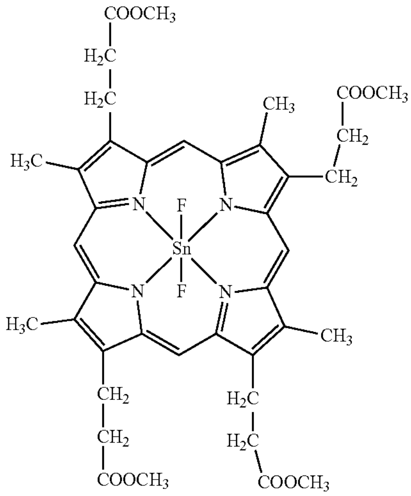

$SnF_2$(Copro III-4Me)

-continued

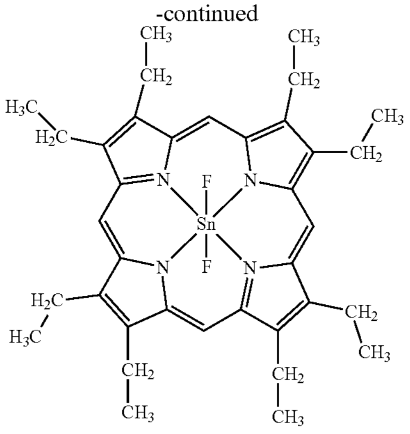

$SnF_2(OEP)$

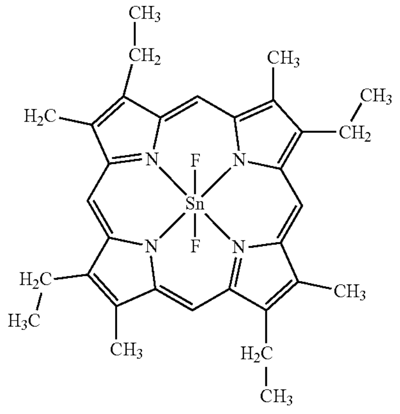

$SnF_2(Etio\ I)$

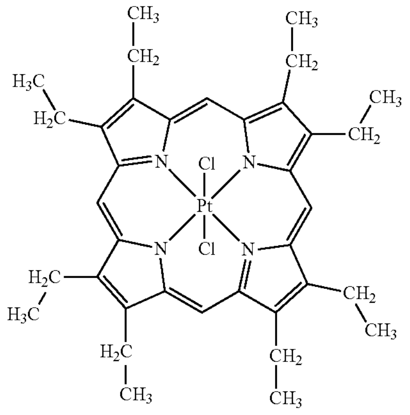

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro [acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]
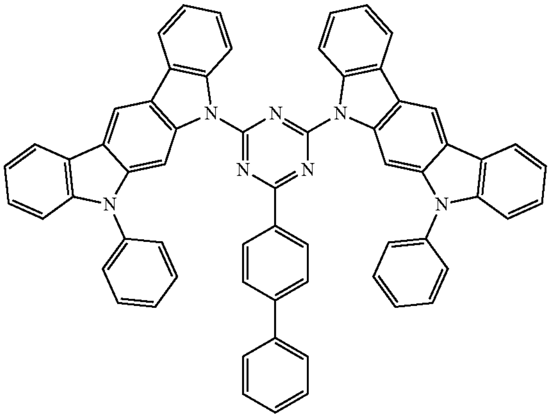
PIC-TRZ
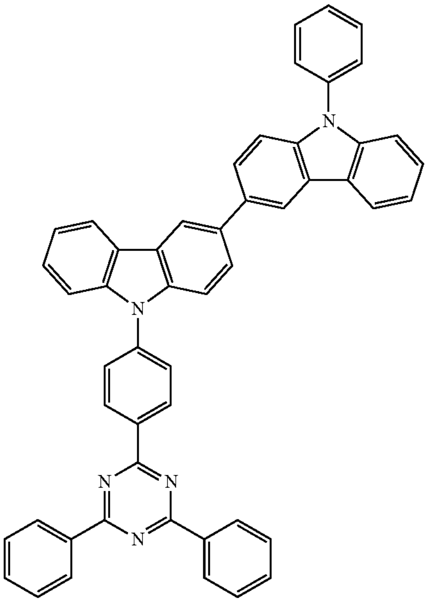
PCCzPTzn
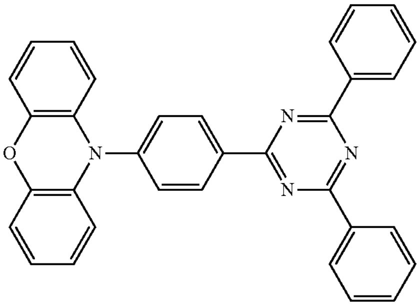
PXZ-TRZ
-continued
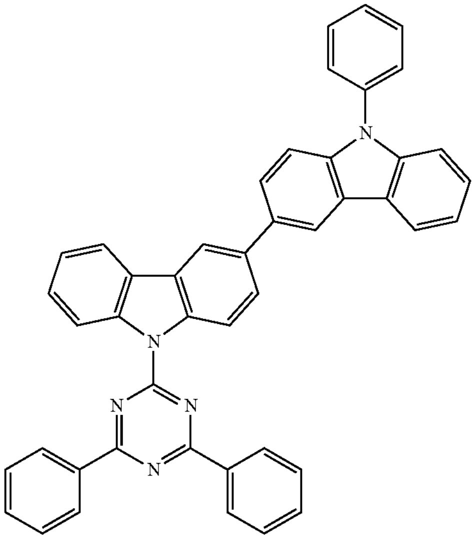
PCCzTzn
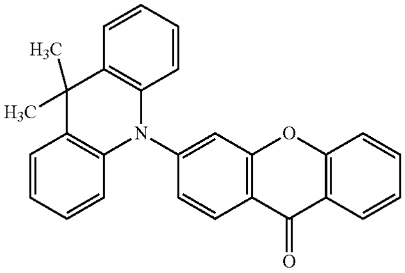
ACRXTN
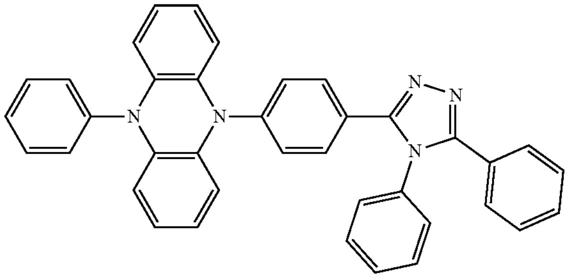
PPZ-3TPT
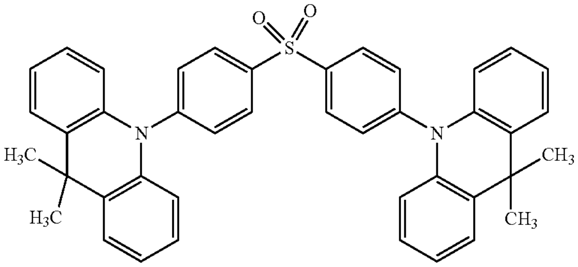
DMAC-DPS -continued

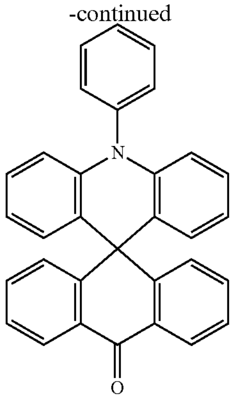

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When the TADF material is used as an emission center substance, the S1 level and the T1 level of the host material are preferably higher than those of the TADF material.

As the host material in the light-emitting layer, various carrier-transport materials such as materials having an electron-transport property, materials having a hole-transport property, and TADF materials can be used.

Examples of the hole-transport material include compounds having an aromatic amine skeleton such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)tri phenyl amine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the above second organic compound can also be used.

Examples of the electron-transport material include metal complexes such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has an excellent electron-transport property to contribute to a reduction in driving voltage.

As the TADF material that can be used as the host material, the above-mentioned materials can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. Here, the TADF material functions as an energy donor, and the emission center substance functions as an energy acceptor.

This is very effective in the case where the emission center substance is a fluorescent substance. In that case, it is preferable that the S1 level of the TADF material be higher than the S1 level of the fluorescent substance in order that high emission efficiency be achieved. Furthermore, the T1 level of the TADF material is preferably higher than the S1 level of the fluorescent substance. Therefore, the T1 level of the TADF material is preferably higher than the T1 level of the fluorescent substance.

A TADF material that emits light whose wavelength overlaps with the wavelength on a lowest-energy-side absorption band of the fluorescent substance is preferably used, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the emission center substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo [c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix an electron-transport material with a hole-transport material. By mixing the electron-transport material with the hole-transport material, the transport property of the light-emitting layer 113 can be easily adjusted and a recombination region can be easily controlled. The weight ratio of the content of the hole-transport material to the content of the electron-transport material may be 1:19 to 19:1.

Note that a phosphorescent substance can be used as part of the mixed material. When a fluorescent substance is used as the emission center substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting material, energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of an electron-transport material and a hole-transport material whose HOMO level is higher than or equal to that of the electron-transport material is preferable for forming an exciplex efficiently. In addition, the LUMO level of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by, for example, comparing the emission spectra of the hole-transport material, the electron-transport material, and a mixed film of these materials and observing a phenomenon in which the emission spectrum of the mixed film is shifted to the longer wavelength side than the emission spectra of each of the materials (or has another peak on the longer wavelength side). Alternatively, the formation of an exciplex can be confirmed by comparing transient photoluminescence (PL) of the hole-transport material, the electron-transport material, and the mixed film of the materials and observing a difference in transient response (e.g., a phenomenon in which the transient PL lifetime of the mixed film has more long lifetime components or has a larger proportion of delayed components than that of each of the materials). The transient PL can be rephrased as transient electroluminescence (EL). That is, the formation of an exciplex can also be confirmed by comparing the transient EL of the hole-transport material, the electron-transport material, and the mixed film of the materials and observing a difference in transient response.

Here, in the case where the sixth organic compound is an organic compound consisting hydrocarbon such as αN-βNPAnth mentioned above, it is preferable that the HOMO level of the sixth organic compound be deeper than that of the fourth organic compound and the difference be greater than or equal to 0.2 eV and less than or equal to 0.4 eV, in which case hole transport is moderately hindered by a barrier.

When the sixth organic compound is an organic compound having an anthracene skeleton and a heterocyclic skeleton such as cgDBCzPA or CzPA described above, a difference between the HOMO levels of the fourth organic compound and the sixth organic compound is preferably less than 0.2 eV, in which case hole injection is not hindered by an injection barrier. In this case, the fourth organic compound is preferably an organic compound in which two carbazole rings are bonded to a naphthalene ring, typified by 3,3'-(naphthalene-1,4-diyl)bis(9-phenyl-9H-carbazole).

When the sixth organic compound is an organic compound having an anthracene skeleton and a heterocyclic skeleton such as cgDBCzPA or CzPA described above, the HOMO level of the second organic compound is preferably higher than or equal to −5.4 eV and lower than or equal to −5.7 eV, in which case degradation is further suppressed.

The electron-transport layer 114 contains a seventh organic compound. The seventh organic compound is an organic compound having an electron-transport property and is preferably a π-electron deficient heteroaromatic compound. Note that in particular, the seventh organic compound preferably has any of a quinoxaline skeleton, a benzimidazole skeleton, and a triazine skeleton. As the electron-transport organic compound, any of the above-mentioned electron-transport organic compounds that can be used as the host material, and the above-mentioned organic compounds that can be used as the host material for the fluorescent substance can be used.

The electron mobility of the seventh organic compound is preferably higher than or equal to $1\times10^{-7}$ $cm^2/Vs$ and lower than or equal to $5\times10^{-5}$ $cm^2/Vs$. When the LUMO level of the sixth organic compound and the LUMO level of the seventh organic compound are compared, the LUMO level of the sixth organic compound is preferably shallower than that of the seventh organic compound, and it is further preferable that a difference between the LUMO levels is greater than or equal to 0.1 eV and less than or equal to 0.3 eV. It is also preferable that the electron mobility of the seventh organic compound is lower than that of the sixth organic compound in the case where the square root of the electric field strength is 600 [V/cm]. The electron-transport property in the electron-transport layer is decreased in the former case and the amount of electrons injected into the light-emitting layer is controlled by the difference between LUMO levels in the latter case, whereby the light-emitting layer can be prevented from having excess electrons.

When the light-emitting layer has excess electrons, a light-emitting region is localized and a large load is put thereon, which promotes degradation. Furthermore, electrons pass through the light-emitting layer without recombination, so that the emission efficiency is also decreased. One embodiment of the present invention can prevent such a situation and provide a light-emitting device with a long lifetime and high emission efficiency.

The luminance decay curve of a light-emitting device having such a structure, which is obtained by a driving test at a constant current density, slightly falls from 100% in the initial stage, and then is slightly raised and falls again. The light-emitting device of one embodiment of the present invention which shows such a behavior, that is, the light-emitting device whose luminance decay curve has a maximum value, has an extremely long lifetime. Note that a differential value of such a luminance decay curve is 0 in a part; therefore, the light-emitting device of one embodiment of the present invention whose luminance decay curve has a differential value of 0 in a part can have an extremely long lifetime.

The light-emitting device of one embodiment of the present invention having the above-described structure can have a long lifetime.

Embodiment 2

Next, examples of specific structures and materials of the aforementioned light-emitting device will be described. As described above, the light-emitting device of one embodiment of the present invention includes the EL layer 103 that is positioned between the pair of electrodes (the anode 101 and the cathode 102) and has a plurality of layers. In the EL layer 103, the hole-injection layer 111, the first hole-transport layer 112-1, the second hole-transport layer 112-2, the light-emitting layer 113, and the electron-transport layer 114 are provided from the anode 101 side.

There is no particular limitation on the other layers included in the EL layer 103, and various layers such as a hole-injection layer, a hole-transport layer, an electron-transport layer, an electron-injection layer, a carrier-blocking layer, an exciton-blocking layer, and a charge-generation layer can be employed.

The anode 101 is preferably formed using any of metals, alloys, conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical materials for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Figure 1B:
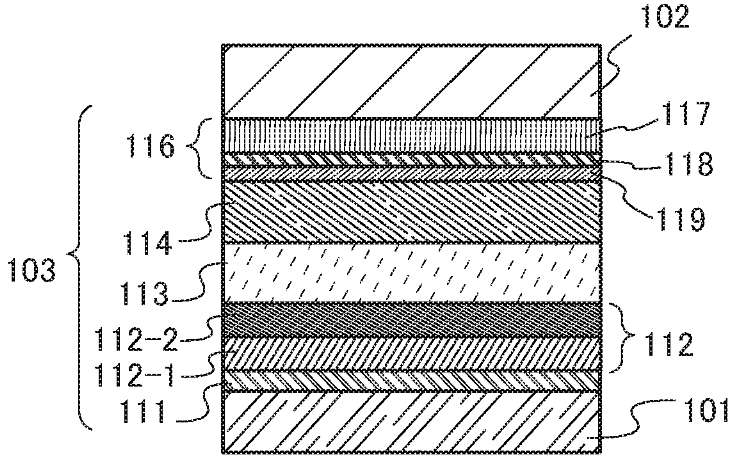

Two kinds of stacked layer structure of the EL layer 103 are described: a structure illustrated in FIG. 1A, which includes the electron-injection layer 115 in addition to the hole-injection layer 111, the first hole-transport layer 112-1, the second hole-transport layer 112-2, the light-emitting layer 113, the electron-transport layer 114; and a structure illustrated in FIG. 1B, which includes the electron-injection layer 115 and a charge generation layer 116 in addition to the hole-injection layer 111, the first hole-transport layer 112-1, the second hole-transport layer 112-2, the light-emitting layer 113, the electron-transport layer 114. Materials for forming each layer will be specifically described below.

Since the hole-injection layer 111, the hole-transport layer 112 (the hole-transport layer 112-1 and the hole-transport layer 112-2), the light-emitting layer 113, and the electron-transport layer 114 are described in detail in Embodiment 1, the description thereof is not repeated. Refer to the description in Embodiment 1.

A layer containing an alkali metal, an alkaline earth metal, or a compound thereof such as lithium fluoride (LiF), cesium fluoride (CsF), or calcium fluoride ($CaF_2$) may be provided as the electron-injection layer 115 between the electron-transport layer 114 and the cathode 102. For example, an electride or a layer that is formed using a substance having an electron-transport property and that contains an alkali metal, an alkaline earth metal, or a compound thereof can be used as the electron-injection layer 115. Examples of the electride include a substance in which electrons are added at high concentration to calcium oxide-aluminum oxide.

Instead of the electron-injection layer 115, the charge-generation layer 116 may be provided between the electron-transport layer 114 and the cathode 102 (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described substance exhibiting an electron-accepting property as a material included in the composite material and a film containing a hole-transport material. When a potential is applied to the p-type layer 117, electrons are injected into the electron-transport layer 114 and holes are injected into the cathode 102 serving as a cathode; thus, the light-emitting device operates.

Note that the charge-generation layer 116 preferably includes an electron-relay layer 118 and/or an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having an excellent electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a substance having an electron-donating property, an organic compound such as tetrathianaphthacene (abbreviation: TTN), nickelocene, or decamethylnickelocene can be used as the substance having an electron-donating property, as well as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the cathode 102, a metal, an alloy, an electrically conductive compound, or a mixture thereof each having a low work function (specifically, lower than or equal to 3.8 eV) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, for the cathode 102, a variety of conductive materials such as Al, Ag, ITO, or indium oxide-tin oxide containing silicon or silicon oxide can be used regardless of the work function. Films of these conductive materials can be formed by a dry process such as a vacuum evaporation method or a sputtering method, an inkjet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an inkjet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 1C. This light-emitting device includes a plurality of light-emitting units between an anode and a cathode. One light-emitting unit has substantially the same structure as the EL layer 103 illustrated in FIG. 1A. In other words, the light-emitting device illustrated in FIG. 1A or 1B includes a single light-emitting unit, and the light-emitting device illustrated in FIG. 1C includes a plurality of light-emitting units.

Figure 1C:
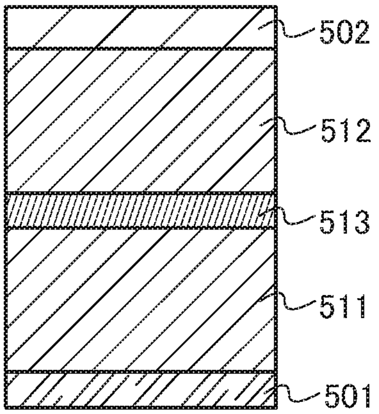

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 1C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life device which can emit light with high luminance at a low current density. A light-emitting apparatus which can be driven at a low voltage and has low power consumption can be provided.

Furthermore, when emission colors of the light-emitting units are different, light emission of a desired color can be obtained from the light-emitting device as a whole. For example, a light-emitting device having two light-emitting units to emit white light as the whole device can be obtained when the emission colors of the first light-emitting unit are red and green and the emission color of the second light-emitting unit is blue. In a light-emitting device having three light-emitting units, when the emission color of the first light-emitting unit is blue, the emission color of the second light-emitting unit has an emission spectrum peak in the range from green to red, and the emission color of the third light-emitting unit is blue, a load on the blue-light-emitting unit can be dispersed, whereby the light-emitting device can have a longer lifetime.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus including the light-emitting device described in Embodiments 1 and 2 will be described.

Figure 2A:
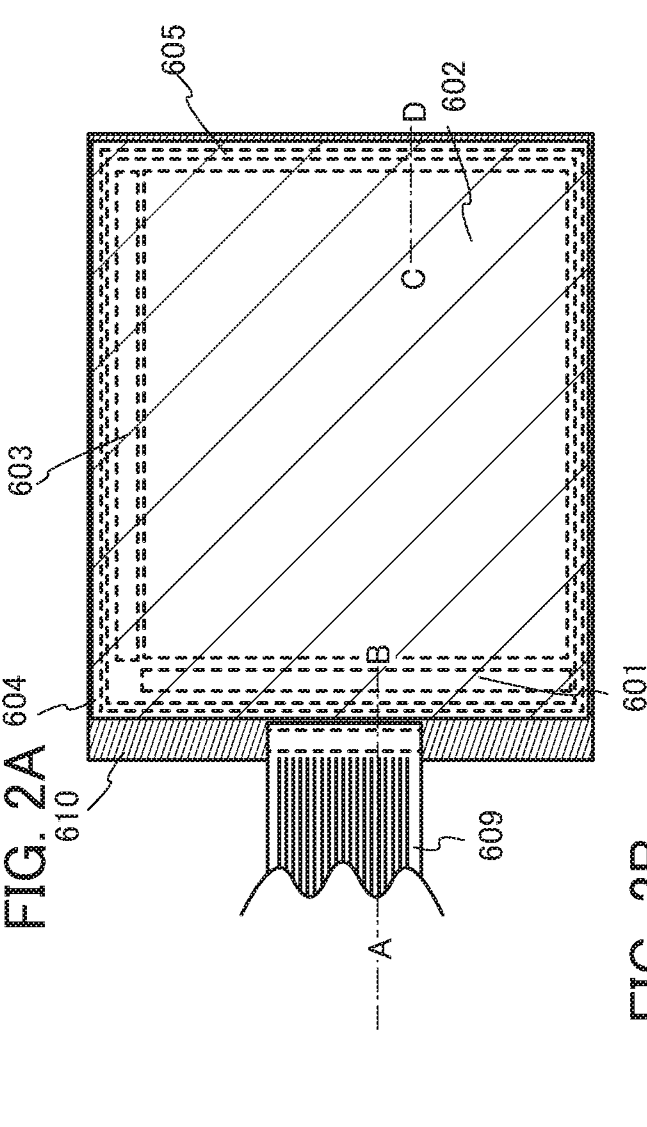
FIGS. 2A and 2B are conceptual diagrams of an active matrix light-emitting apparatus.
Figure 2B:
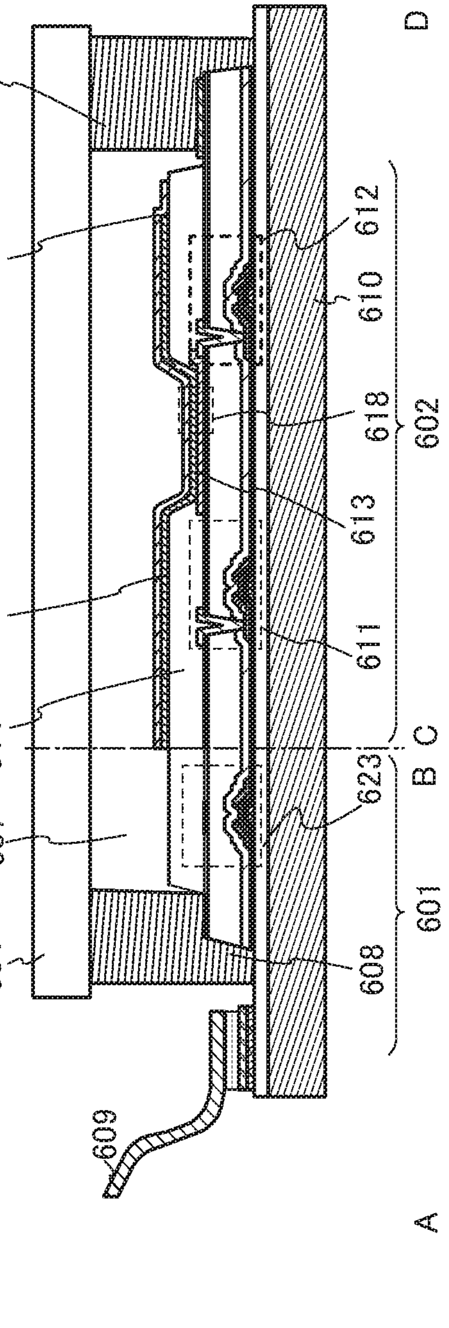

In this embodiment, the light-emitting apparatus manufactured using the light-emitting device described in Embodiments 1 and 2 is described with reference to FIGS. 2A and 2B. Note that FIG. 2A is a top view of the light-emitting apparatus and FIG. 2B is a cross-sectional view taken along the lines A-B and C-D in FIG. 2A. This light-emitting apparatus includes a driver circuit portion (source line driver circuit) 601, a pixel portion 602, and a driver circuit portion (gate line driver circuit) 603, which are to control the light emission of a light-emitting device and illustrated with dotted lines. A reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), polyvinyl fluoride (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. Here, the insulator 614 can be formed using a positive photosensitive acrylic resin film here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance and favorable ohmic contact, and can function as a cathode.

The EL layer 616 is formed by any of a variety of methods such as an evaporation method using an evaporation mask, an inkjet method, and a spin coating method. The EL layer 616 has the structure described in Embodiments 1 and 2. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiments 1 and 2. In the light-emitting apparatus of this embodiment, the pixel portion, which includes a plurality of light-emitting devices, may include both the light-emitting device described in Embodiments 1 and 2 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is desirable that such a material not be permeable to moisture or oxygen as much as possible. As the sealing substrate 604, a glass substrate, a quartz substrate, or a plastic substrate formed of fiber reinforced plastic (FRP), polyvinyl fluoride (PVF), polyester, or acrylic can be used.

Although not illustrated in FIGS. 2A and 2B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the light-emitting apparatus manufactured using the light-emitting device described in Embodiments 1 and 2 can be obtained.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

Figure 3A:
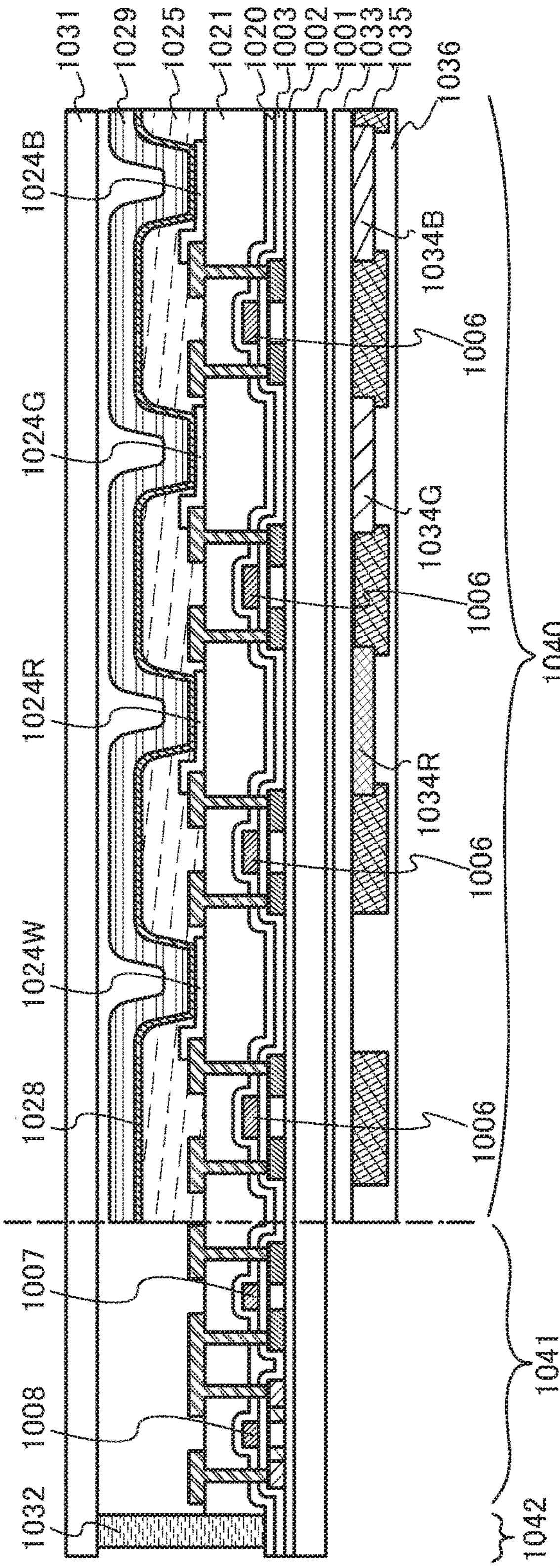
FIGS. 3A and 3B are conceptual diagrams of an active matrix light-emitting apparatus.
Figure 3B:
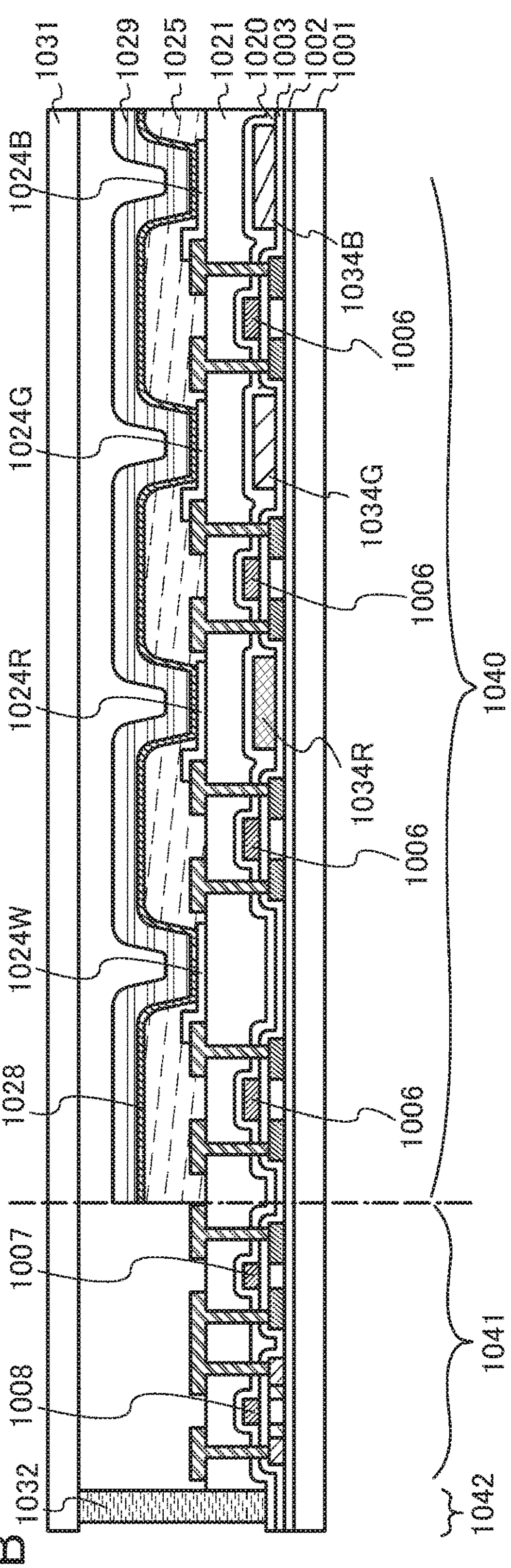

FIGS. 3A and 3B each illustrate an example of a light-emitting apparatus in which full color display is achieved by formation of a light-emitting device exhibiting white light emission and with the use of coloring layers (color filters) and the like. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
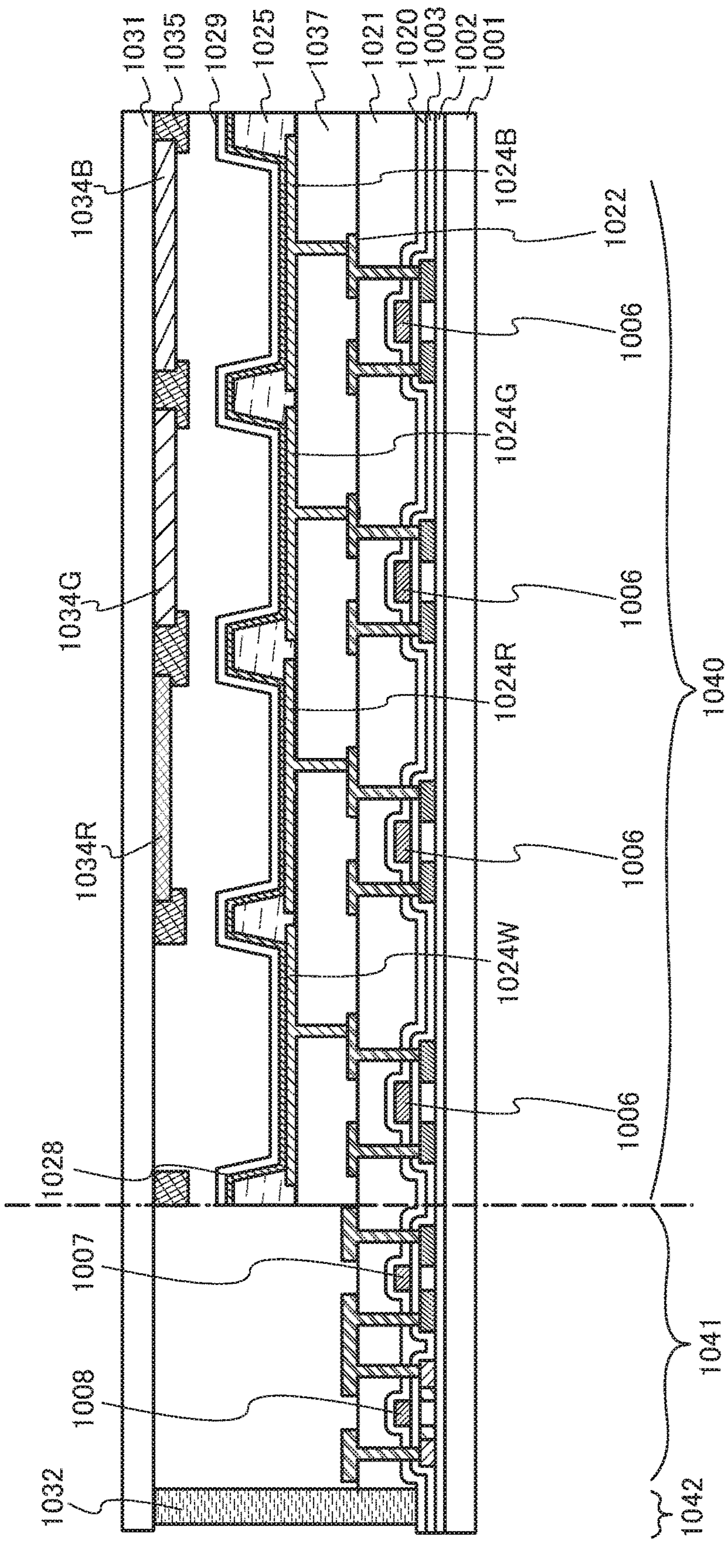
FIG. 4 is a conceptual diagram of an active matrix light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 4 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The anodes 1024W, 1024R, 1024G, and 1024B of the light-emitting devices ternary are each an anode here, but may be formed as a cathode. Furthermore, in the case of a light-emitting apparatus having a top emission structure as illustrated in FIG. 4, the anodes are preferably reflective electrodes. The EL layer 1028 is formed to have a structure similar to the structure of the EL layer 103 described in Embodiments 1 and 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with the use of a reflective electrode as the anode and a semi-transmissive and semi-reflective electrode as the cathode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the semi-transmissive and semi-reflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the semi-transmissive and semi-reflective electrode.

In the light-emitting device, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

Figure 5A:
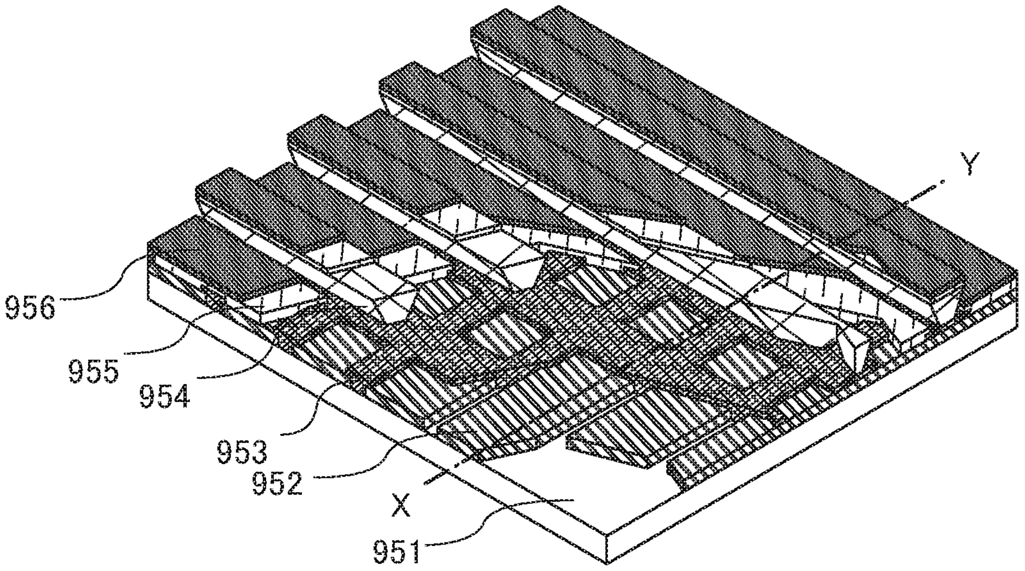
FIGS. 5A and 5B are conceptual diagrams of a passive matrix light-emitting apparatus.
Figure 5B:
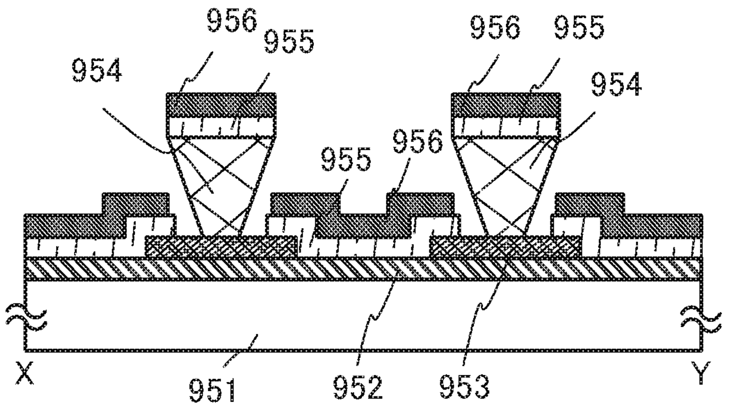

The active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in Embodiments 1 and 2; thus, the light-emitting apparatus can have high reliability or low power consumption.

Since many minute light-emitting devices arranged in a matrix in the light-emitting apparatus described above can each be controlled, the light-emitting apparatus can be suitably used as a display device for displaying images.

This embodiment can be freely combined with any of the other embodiments.

Embodiment 4

Figure 6A:
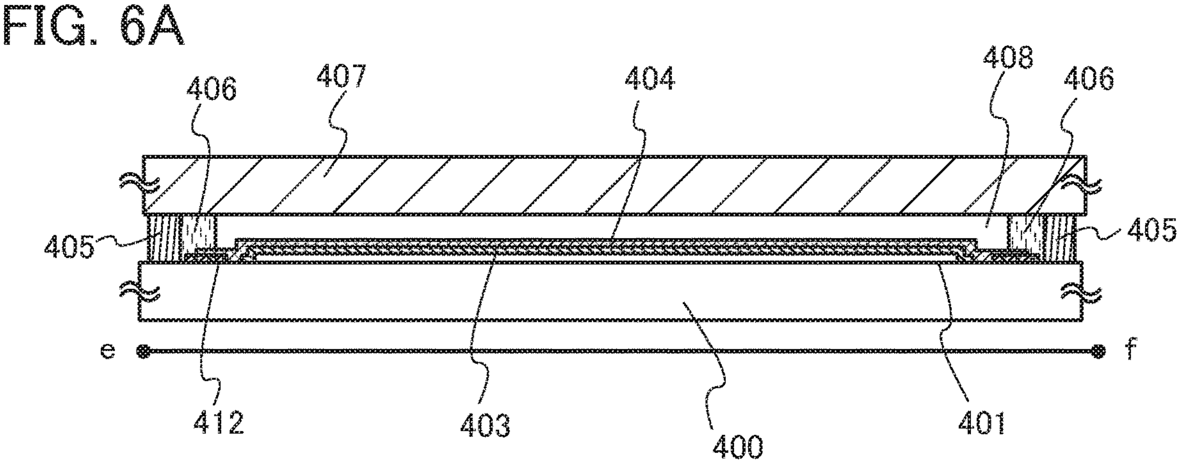
FIGS. 6A and 6B illustrate a lighting device.
Figure 6B:
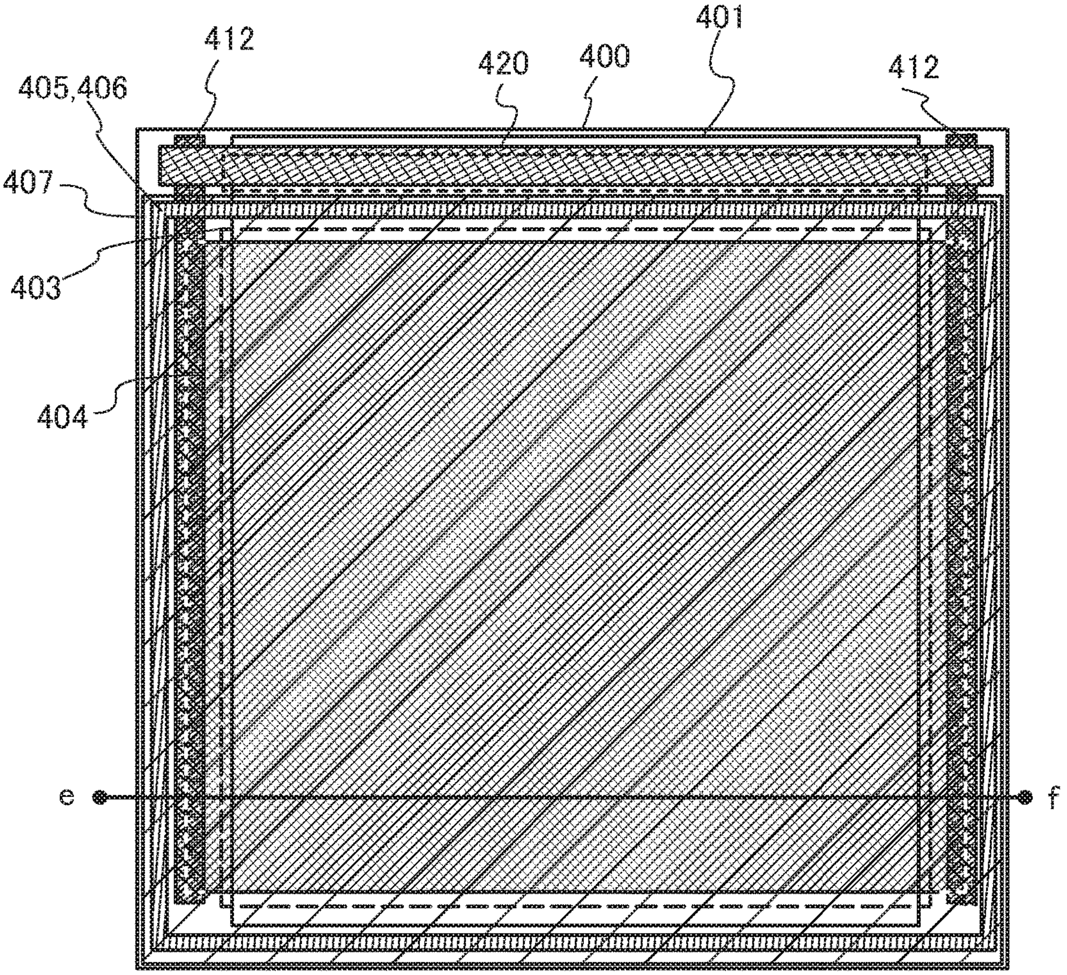

In this embodiment, an example in which the light-emitting device described in Embodiments 1 and 2 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, an anode 401 is formed over a substrate 400 which is a support and has a light-transmitting property. The anode 401 corresponds to the anode 101 in Embodiment 2. When light is extracted through the anode 401 side, the anode 401 is formed using a material having a light-transmitting property.

A pad 412 for applying voltage to a cathode 404 is formed over the substrate 400.

An EL layer 403 is formed over the anode 401. The structure of the EL layer 403 corresponds to, for example, the structure of the EL layer 103 in Embodiments 1 and 2, or the structure in which the light-emitting units 511 and 512 and the charge-generation layer 513 are combined. Refer to the descriptions for the structure.

The cathode 404 is formed to cover the EL layer 403. The cathode 404 corresponds to the cathode 102 in Embodiment 2. The cathode 404 is formed using a material having high reflectance when light is extracted through the anode 401 side. The cathode 404 is connected to the pad 412, whereby voltage is applied.

As described above, the lighting device described in this embodiment includes a light-emitting device including the anode 401, the EL layer 403, and the cathode 404. Since the light-emitting device is a light-emitting device with high emission efficiency, the lighting device in this embodiment can be a lighting device having low power consumption.

The substrate 400 provided with a light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the anode 401 are extended to the outside of the sealing materials 405 and 406, the extended parts can function as external input terminals. An IC chip 420 mounted with a converter or the like may be provided over the external input terminals.

The lighting device described in this embodiment includes as an EL element the light-emitting device described in Embodiments 1 and 2; thus, the light-emitting apparatus can have high reliability. In addition, the light-emitting apparatus can consume less power.

Embodiment 5

In this embodiment, examples of electronic devices each including the light-emitting device described in Embodiments 1 and 2 will be described. The light-emitting device described in Embodiments 1 and 2 has a long lifetime and high reliability. As a result, the electronic devices described in this embodiment can each include a light-emitting portion having high reliability.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 7A:
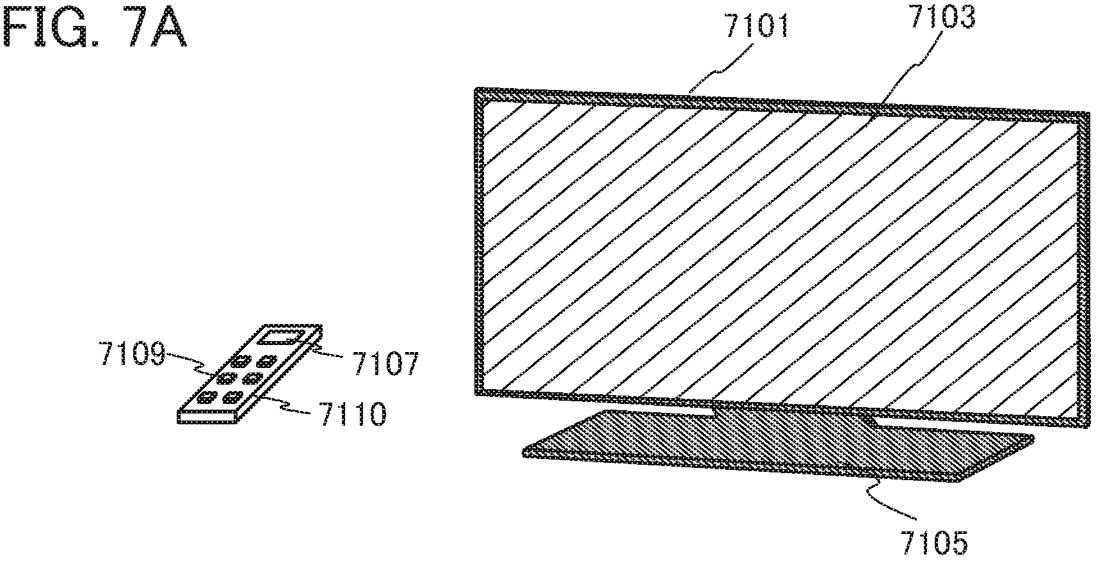
Figure 7A:
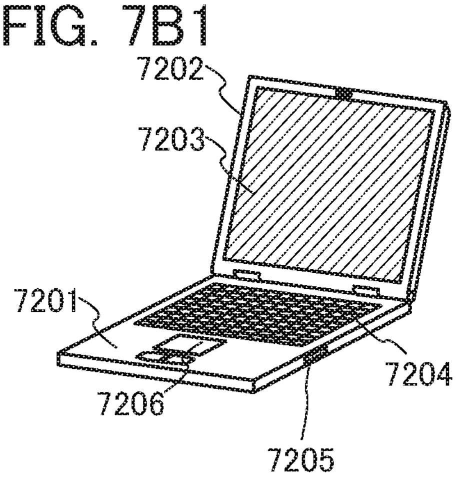
Figure 7A:
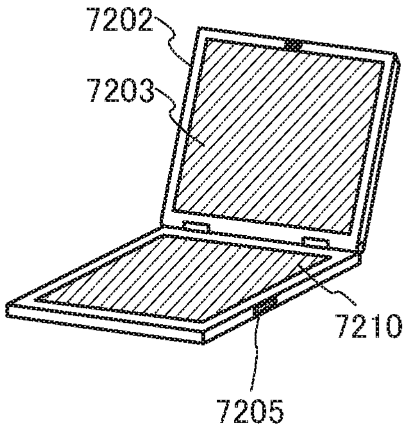

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiments 1 and 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiments 1 and 2 and arranged in a matrix in the display portion 7203. The computer illustrated in FIG. 7B1 may have a structure illustrated in FIG. 7B2. A computer illustrated in FIG. 7B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 7C:
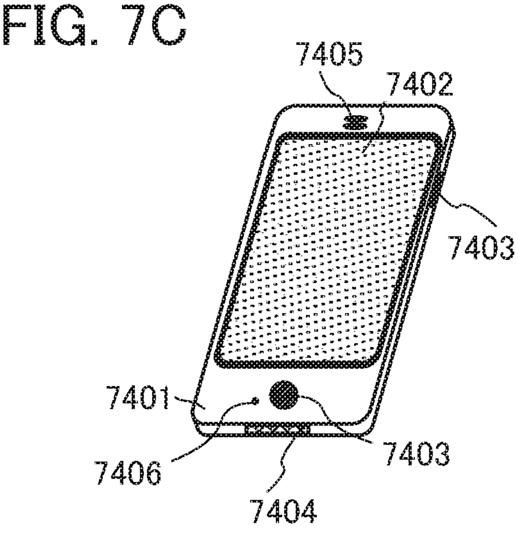

FIG. 7C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiments 1 and 2 and arranged in a matrix.

When the display portion 7402 of the portable terminal illustrated in FIG. 7C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting apparatus having the light-emitting device described in Embodiments 1 and 2 is wide so that this light-emitting apparatus can be applied to electronic devices in a variety of fields. By using the light-emitting device described in Embodiments 1 and 2, an electronic device with high reliability can be obtained.

Figure 8A:
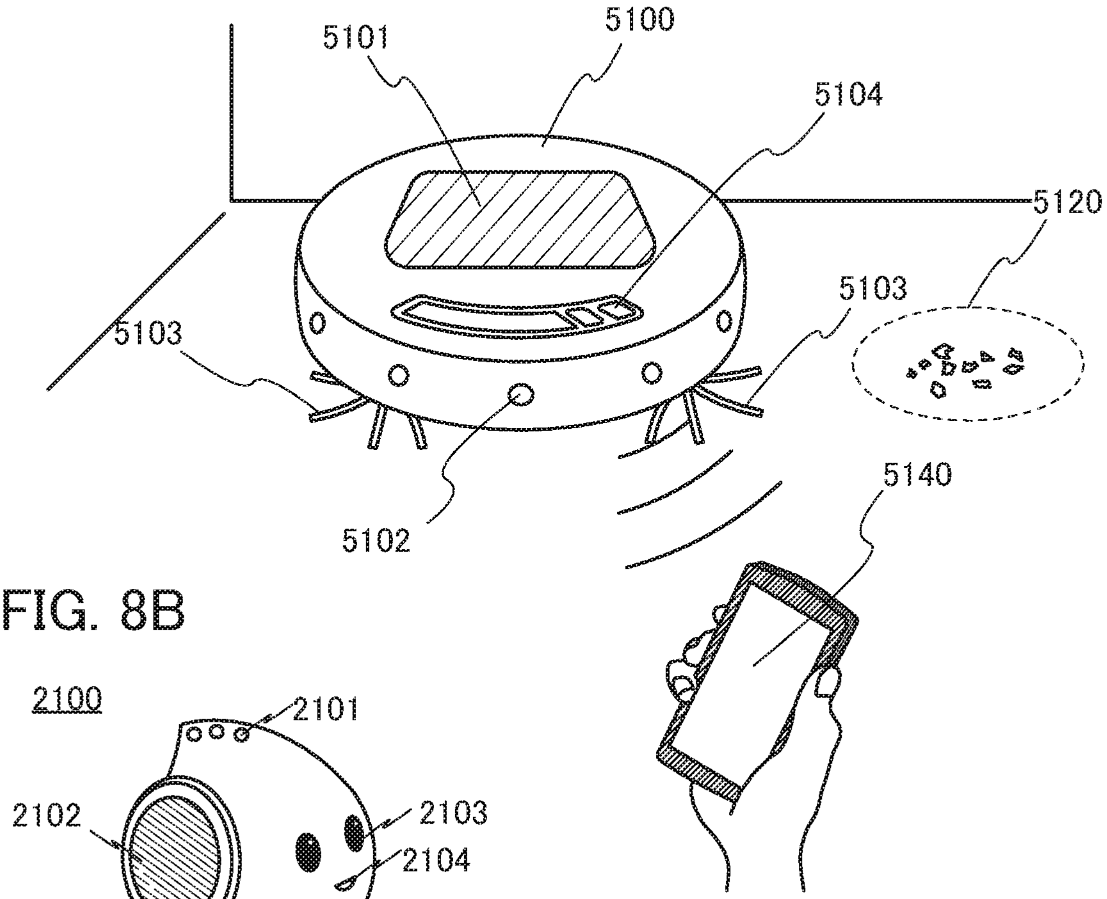
FIGS. 8A to 8C illustrate electronic devices.

FIG. 8A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like.

Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 8B:
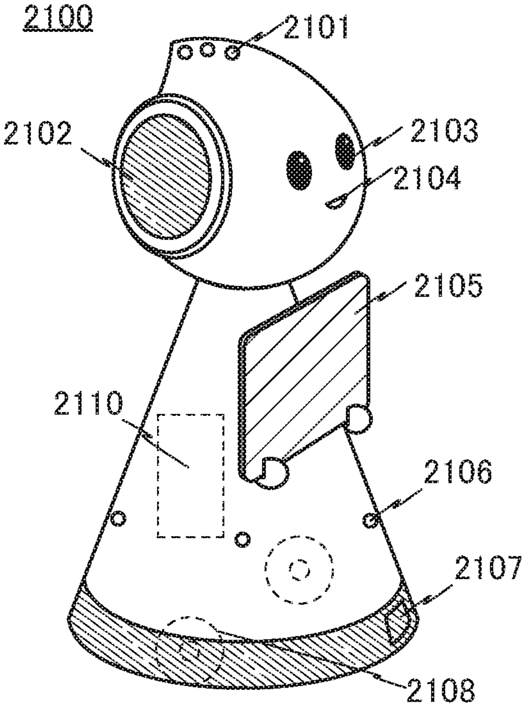

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
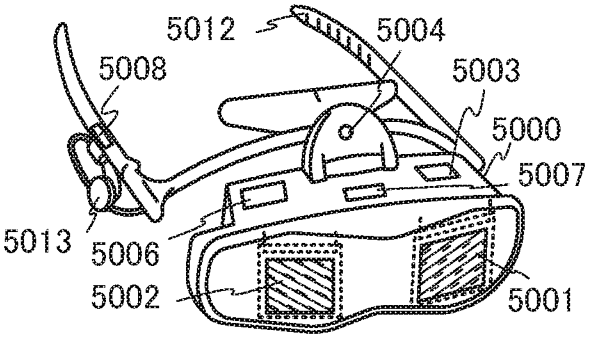

FIG. 8C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 9:
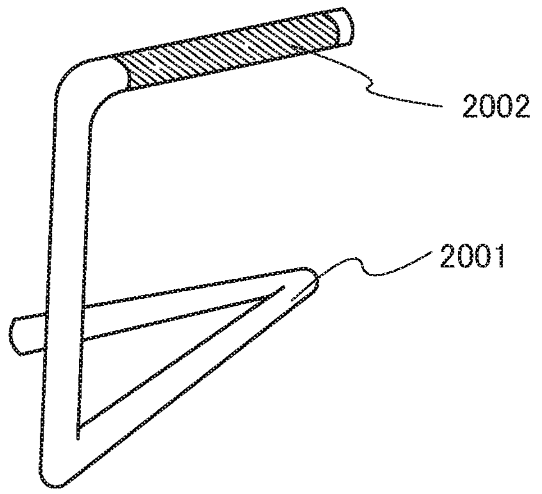
FIG. 9 illustrates a lighting device.

FIG. 9 illustrates an example in which the light-emitting device described in Embodiments 1 and 2 is used for a table lamp which is a lighting device. The table lamp illustrated in FIG. 9 includes a housing 2001 and a light source 2002, and the lighting device described in Embodiment 3 may be used for the light source 2002.

Figure 10:
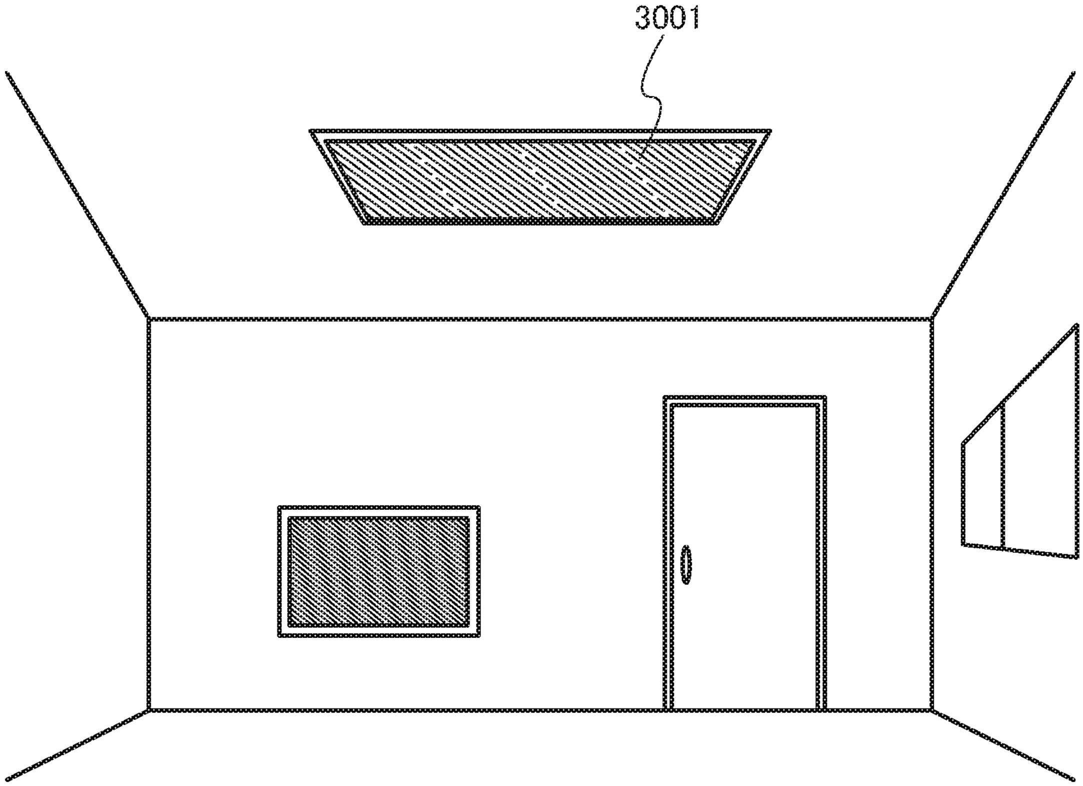
FIG. 10 illustrates a lighting device.

FIG. 10 illustrates an example in which the light-emitting device described in Embodiments 1 and 2 is used for an indoor lighting device 3001. Since the light-emitting device described in Embodiments 1 and 2 has high reliability, the lighting device can have high reliability. Furthermore, since the light-emitting device described in Embodiments 1 and 2 can have a large area, the light-emitting device can be used for a large-area lighting device. Furthermore, since the light-emitting device described in Embodiments 1 and 2 is thin, the light-emitting device can be used for a lighting device having a reduced thickness.

Figure 11:
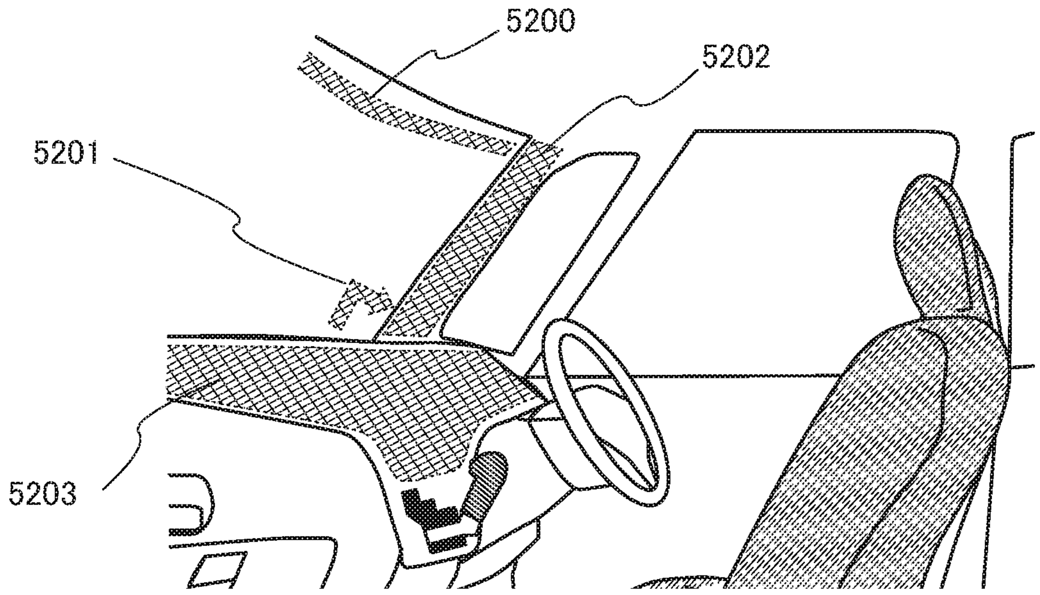
FIG. 11 illustrates in-vehicle display devices and lighting devices.

The light-emitting device described in Embodiments 1 and 2 can also be used for an automobile windshield or an automobile dashboard. FIG. 11 illustrates one mode in which the light-emitting devices described in Embodiments 1 and 2 are used for an automobile windshield and an automobile dashboard. Display regions 5200 to 5203 each include the light-emitting device described in Embodiments 1 and 2.

The display regions 5200 and 5201 are display devices which are provided in the automobile windshield and in which light-emitting devices each of which is described in Embodiments 1 and 2 are incorporated. The light-emitting devices described in Embodiments 1 and 2 can be formed into what is called a see-through display device, through which the opposite side can be seen, by including an anode and a cathode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in Embodiments 1 and 2 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information by displaying navigation data, a speedometer, a tachometer, a mileage, a fuel level, a gearshift state, air-condition setting, and the like. The content or layout of the display can be changed freely by a user as appropriate. Note that such information can also be displayed on the display regions 5200 to 5203. The display regions 5200 to 5203 can also be used as lighting devices.

Figure 12A:
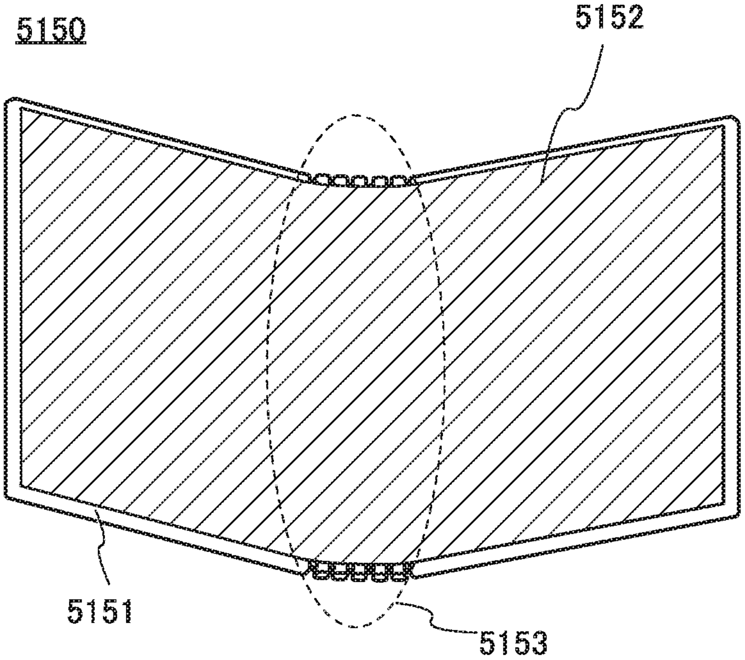
FIGS. 12A and 12B illustrate an electronic device.
Figure 12B:
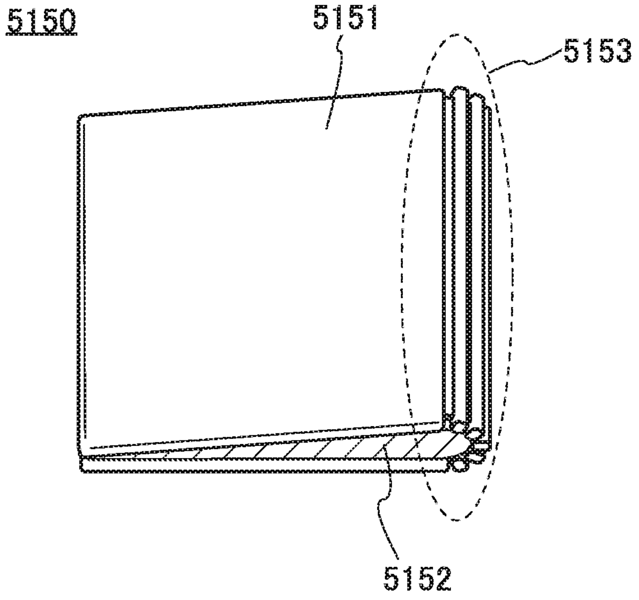

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 13A:
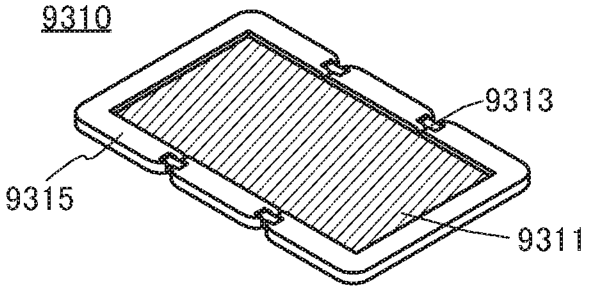
FIGS. 13A to 13C illustrate an electronic device.
Figure 13B:
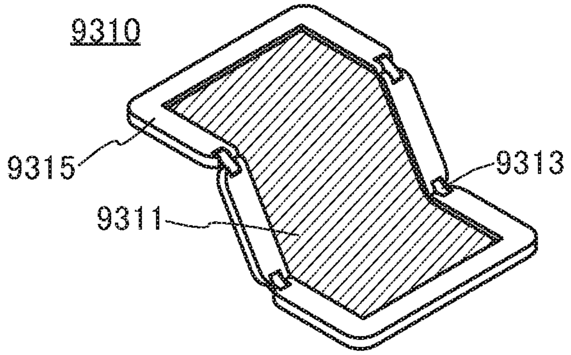
Figure 13C:
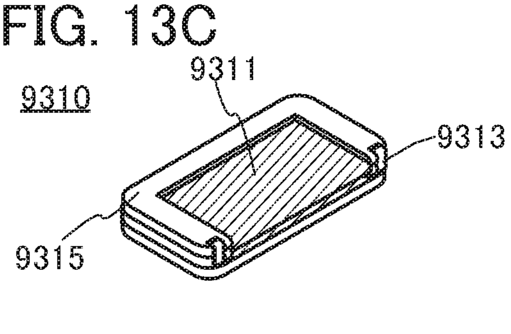

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, light-emitting devices 1 to 3 of one embodiment of the present invention and comparative light-emitting devices 1 and 2 which are comparative examples are described. Structural formulae of organic compounds used for the light-emitting devices 1 to 3 and the comparative light-emitting devices 1 and 2 are shown below.

[Chemical Formula 3]

(i)

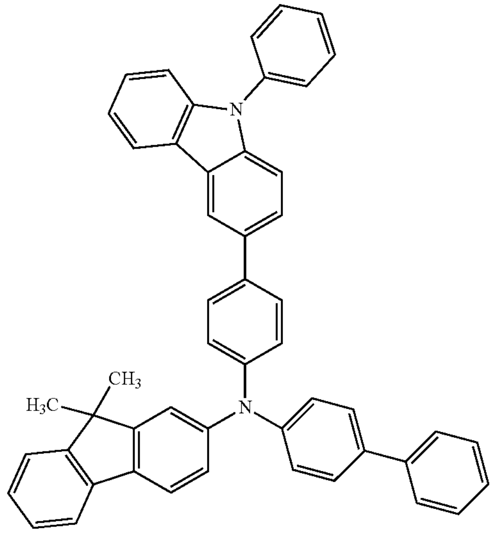

PCBBiF

-continued
(ii)
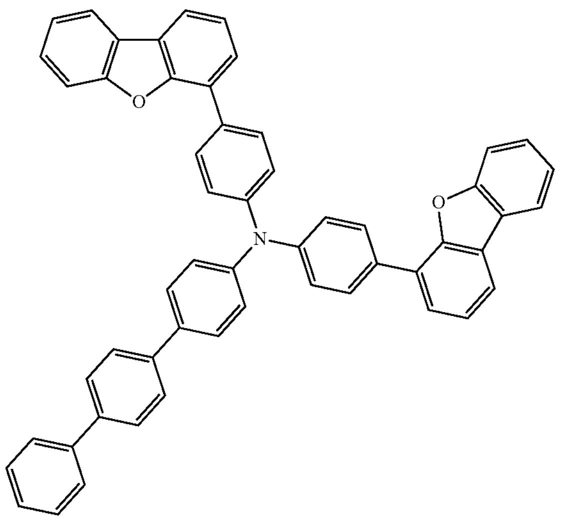
DBfBB1TP
(iii)
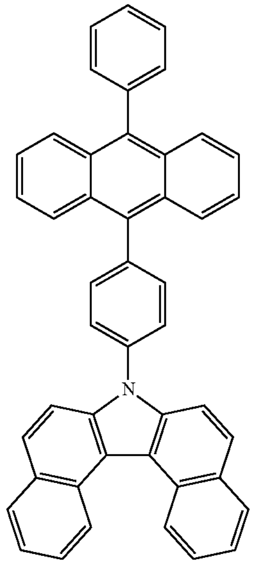
cgDBCzPA
-continued
(iv)
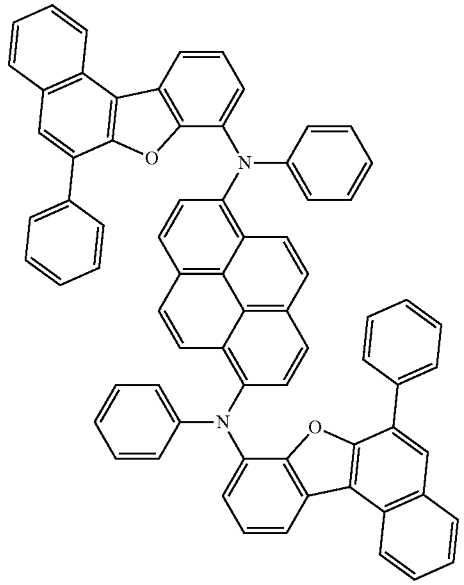
1,6BnfAPrn-03
(v)
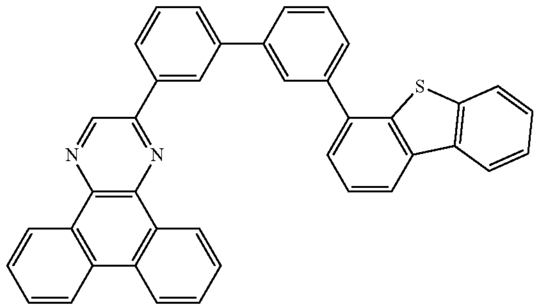
2mDBTBPDBq-II
(vi)
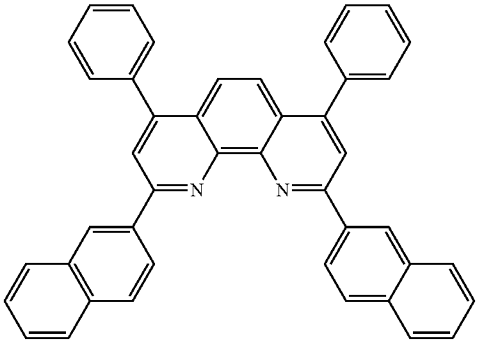
NBPhen -continued (vii)

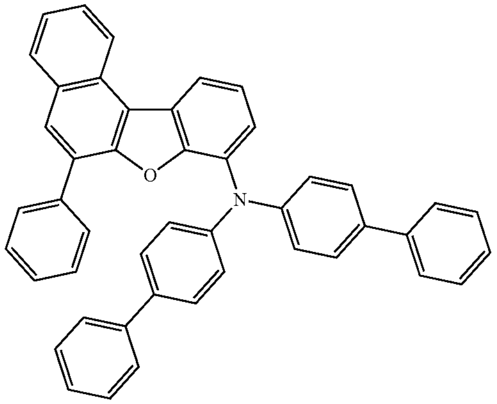

BBABnf (viii)

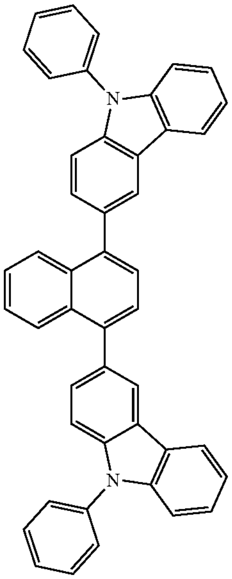

PCzN2

(Method for Fabricating Light-Emitting Device 1)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (i) and NDP-9 (produced by Analysis Atelier Corporation, material serial No. 1S20170124) were deposited on the anode 101 to a thickness of 10 nm by co-evaporation using a resistance-heating method such that the weight ratio of PCBBiF to NDP-9 was 1:0.1, whereby the hole-injection layer 111 was formed.

Subsequently, over the hole-injection layer 111, PCBBiF was deposited to a thickness of 20 nm by evaporation as the first hole-transport layer 112-1, and then N,N-bis[4-(dibenzofuran-4-yl)phenyl]-4-amino-p-terphenyl (abbreviation: DBfBB1TP) represented by the structural formula (ii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 7-[4-(10-phenyl-9-anthryl)phenyl]-7H-dibenzo[c,g]carbazole (abbreviation: cgDBCzPA) represented by the structural formula (iii) and N,N-(pyrene-1,6-diyl)bis[(6,N-diphenylbenzo[b]naphtho[1,2-d]furan)-8-amine] (abbreviation: 1,6BnfAPrn-03) represented by the structural formula (iv) were deposited to a thickness of 25 nm by co-evaporation such that the weight ratio of cgDBCzPA to 1,6BnfAPrn-03 was 1:0.03, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 1 of this example was fabricated.

(Method for Fabricating Light-Emitting Device 2)

The light-emitting device 2 was fabricated in the same manner as the light-emitting device 1 except that PCBBiF of the light-emitting device 1 was replaced with N,N-bis(4-biphenyl)-6-phenylbenzo[b]naphtho[1,2-d]furan-8-amine (abbreviation: BBABnf) represented by the structural formula (vii).

(Method for Fabricating Light-Emitting Device 3)

The light-emitting device 3 was fabricated in the same manner as the light-emitting device 2 except that DBfBB1TP of the light-emitting device 2 was replaced with 3,3'-(naphthalene-1,4-diyl)bis(9-phenyl-9H-carbazole) (abbreviation: PCzN2) represented by the structural formula (viii).

(Method for Fabricating Comparative Light-Emitting Device 1)

The comparative light-emitting device 1 was fabricated in the same manner as the light-emitting device 1 except that 2mDBTBPDBq-II of the light-emitting device 1 was replaced with cgDBCzPA.

(Method for Fabricating Comparative Light-Emitting Device 2)

The comparative light-emitting device 2 was fabricated in the same manner as the comparative light-emitting device 1 except that DBfBB1TP of the comparative light-emitting device 1 was replaced with PCzN2.

The structures of the light-emitting devices 1 to 3 and the comparative light-emitting devices 1 and 2 are listed in the following table.

TABLE 1

| | Hole-injection layer | Hole-transport layer 1 | Hole-transport layer 2 | Light-emitting layer | Electron-transport layer | | Electron-injection layer |
|---|---|---|---|---|---|---|---|
| | 10 nm | 20 nm | 10 nm | 25 nm | 15 nm | 10 nm | 1 nm |
| Light-emitting device 1 | PCBBiF:NDP-9 (1:0.1) | PCBBiF | DBfBB1TP | cgDBCzPA:1,6BnfAPrn-03 (1:0.03) | 2mDBTBPDBq-II | NBPhen | LiF |
| Light-emitting device 2 | BBABnf:NDP-9 (1:0.1) | BBABnf | DBfBB1TP | | | | |
| Light-emitting device 3 | | | PCzN2 | | | | |
| Comparative light-emitting device 1 | PCBBiF:NDP-9 (1:0.1) | PCBBiF | DBfBB1TP | | cgDBCzPA | | |
| Comparative light-emitting device 2 | | | PCzN2 | | | | |

The HOMO levels, the LUMO levels, and the electron mobilities of the organic compounds used in this example are listed in the following table. The electron mobilities were measured when the square root of the electric field strength [V/cm] was 600.

TABLE 2

| | HOMO level (eV) | LUMO level (eV) | Electron mobility ($cm^2/Vs$) |
|---|---|---|---|
| PCBBiF | −5.36 | — | — |
| BBABnf | −5.56 | — | — |
| DBfBB1TP | −5.50 | — | — |
| PCzN2 | −5.71 | — | — |
| cgDBCzPA | −5.69 | −2.74 | $7.7 \times 10^{-5}$ |
| 2mDBTBPDBq-II | — | −2.94 | $2.2 \times 10^{-5}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 14:
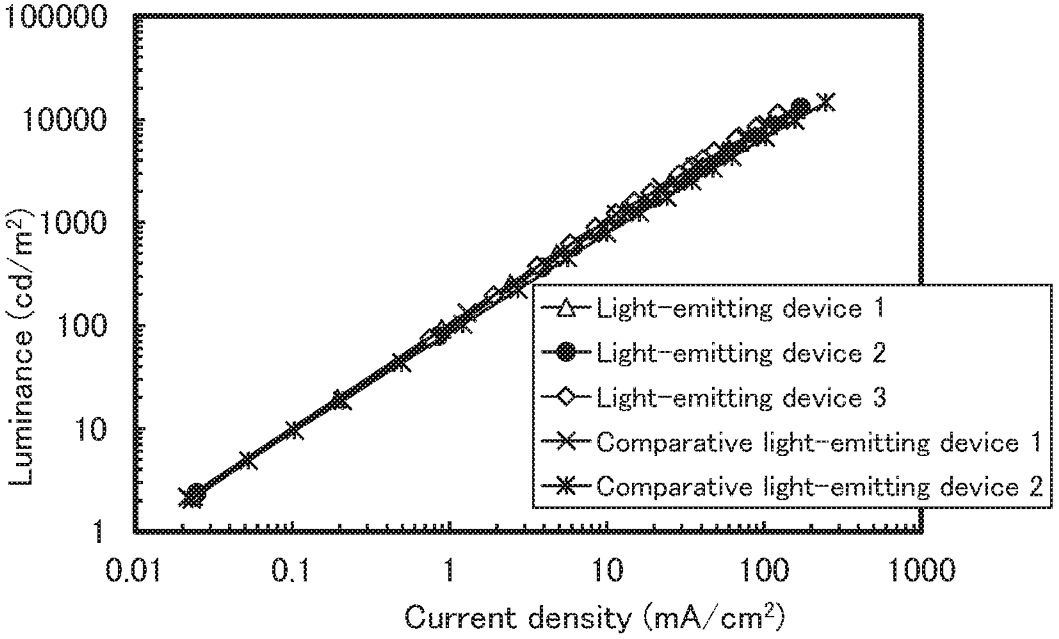
FIG. 14 shows the luminance-current density characteristics of light-emitting devices 1 to 3 and comparative light-emitting devices 1 and 2.
Figure 15:
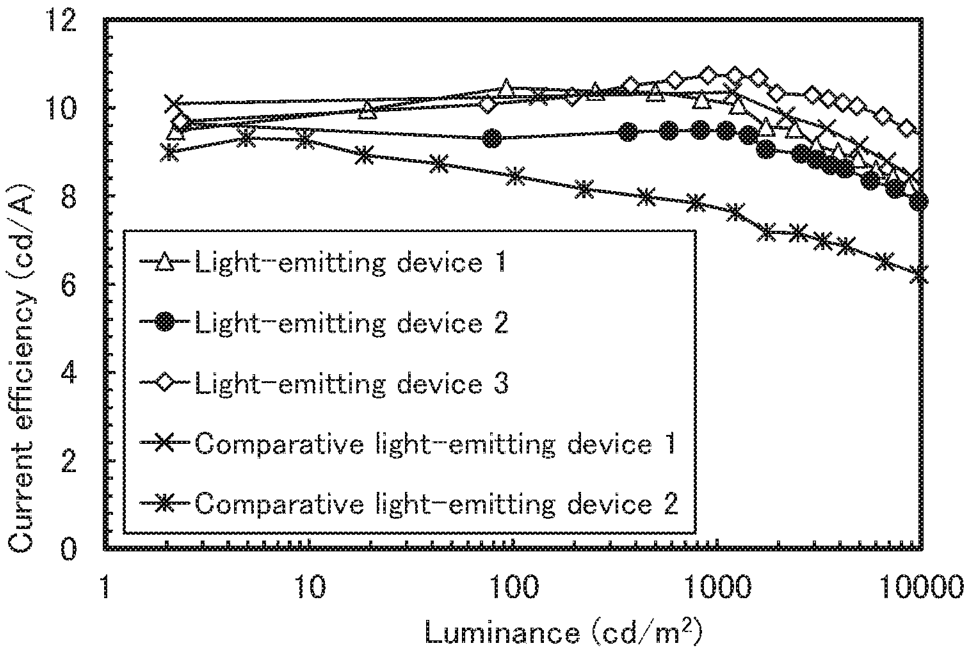
FIG. 15 shows the current efficiency-luminance characteristics of light-emitting devices 1 to 3 and comparative light-emitting devices 1 and 2.
Figure 16:
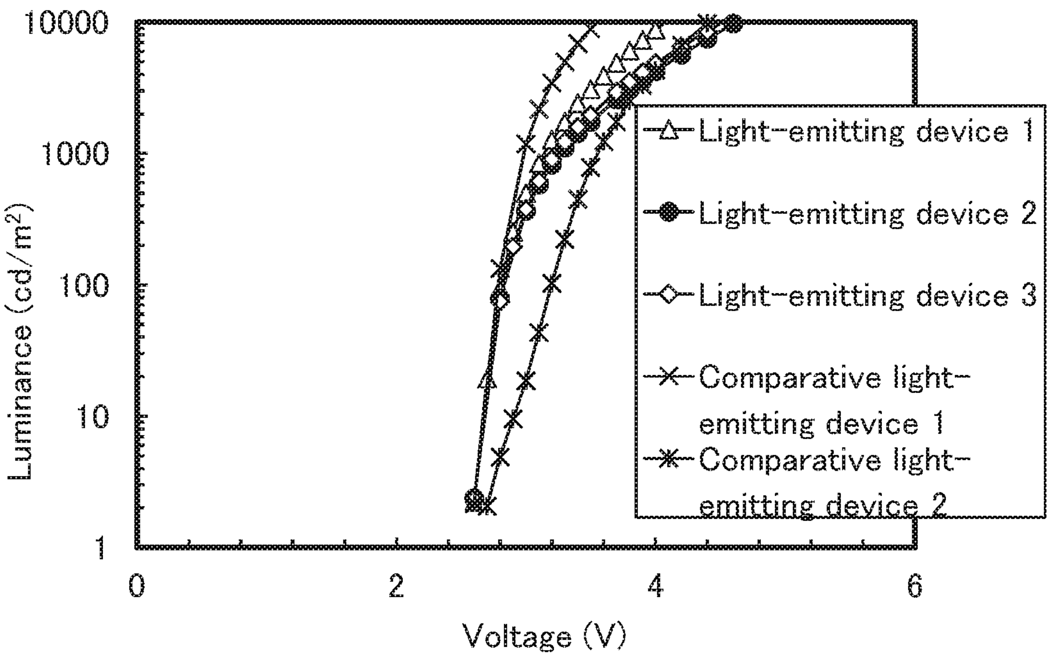
FIG. 16 shows the luminance-voltage characteristics of light-emitting devices 1 to 3 and comparative light-emitting devices 1 and 2.
Figure 17:
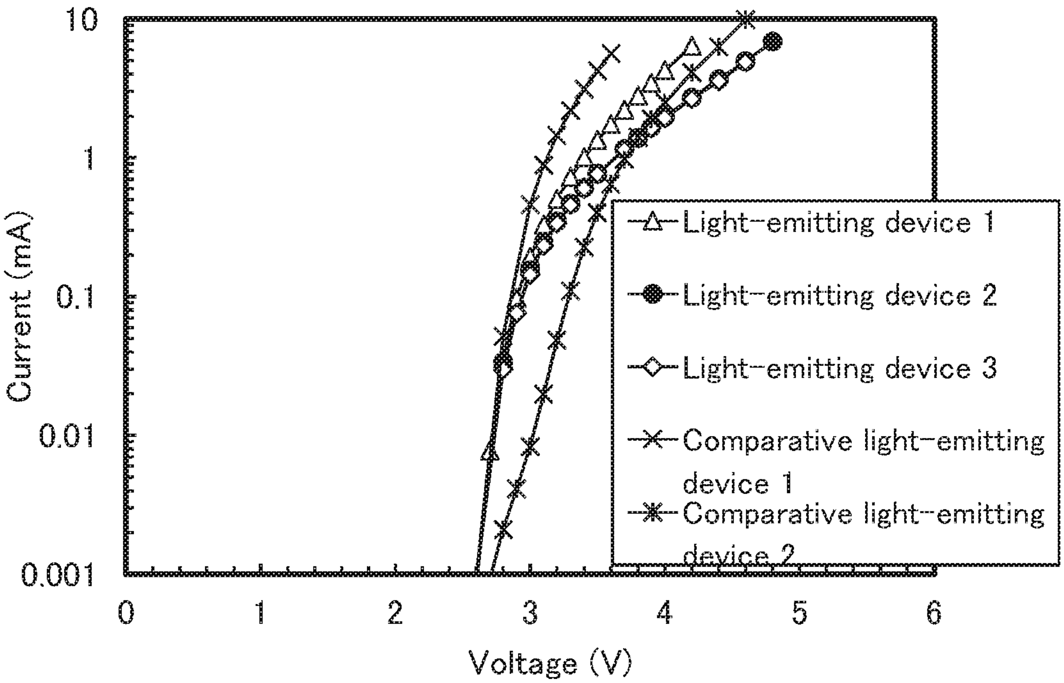
FIG. 17 shows the current-voltage characteristics of light-emitting devices 1 to 3 and comparative light-emitting devices 1 and 2.
Figure 18:
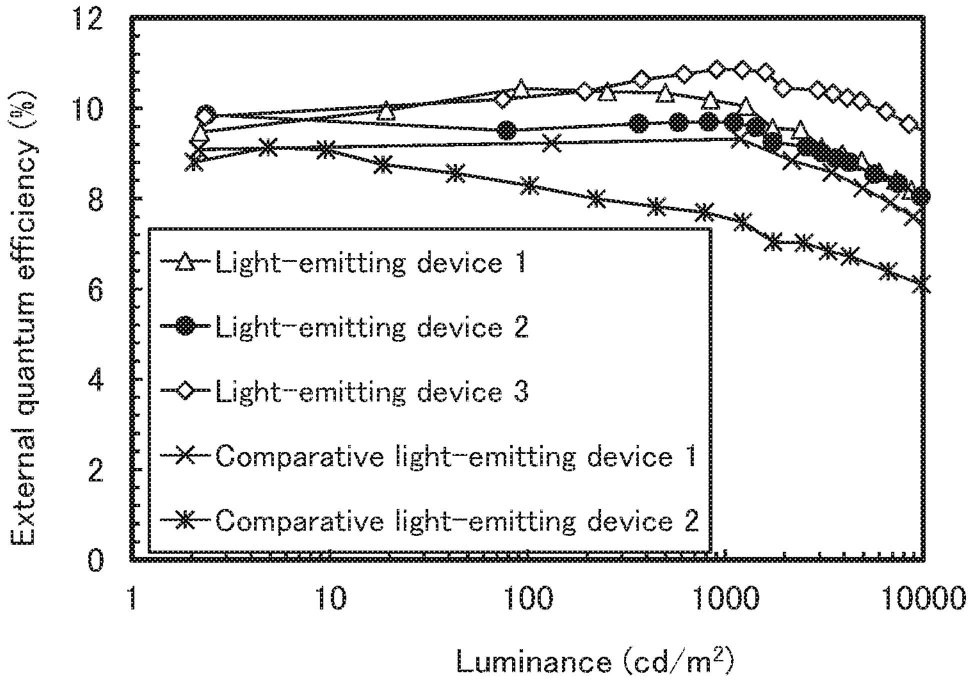
FIG. 18 shows the external quantum efficiency-luminance characteristics of light-emitting devices 1 to 3 and comparative light-emitting devices 1 and 2.
Figure 19:
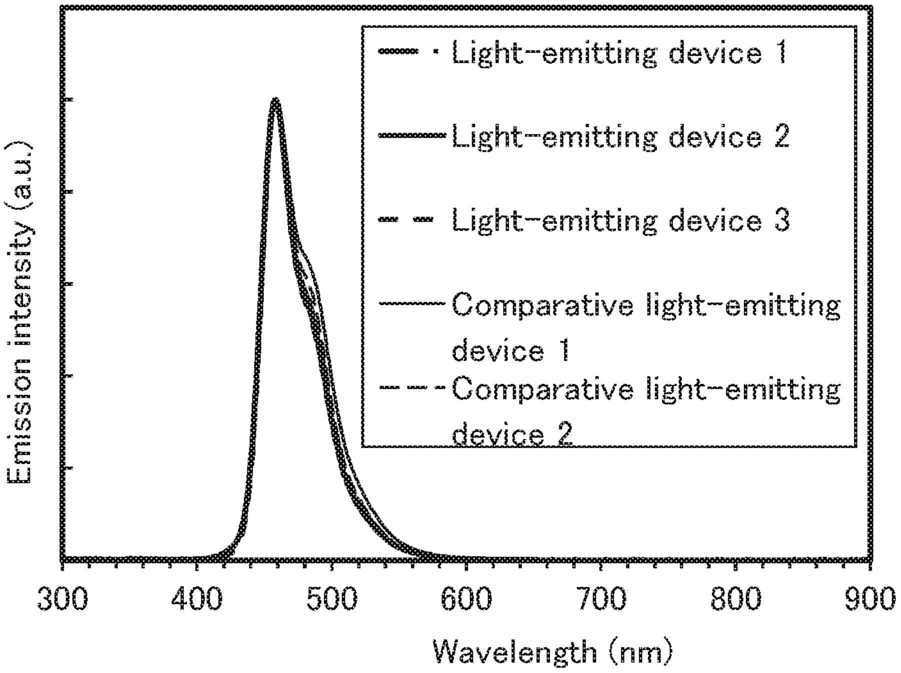
FIG. 19 shows the emission spectra of light-emitting devices 1 to 3 and comparative light-emitting devices 1 and 2.

FIG. 14 shows the luminance-current density characteristics of the light-emitting devices 1 to 3 and the comparative light-emitting devices 1 and 2. FIG. 15 shows the current efficiency-luminance characteristics thereof. FIG. 16 shows the luminance-voltage characteristics thereof. FIG. 17 shows the current-voltage characteristics thereof. FIG. 18 shows the external quantum efficiency-luminance characteristics thereof. FIG. 19 shows the emission spectra thereof. Note that the numbers in legends of FIG. 14 to FIG. 20 correspond to the number of the light-emitting devices. With respect to the comparative light-emitting devices, "comparative" is added before the number. Table 3 shows the main characteristics of the light-emitting devices at a luminance of about 1000 $cd/m^2$.

TABLE 3

| | Voltage (V) | Current (mA) | Current density ($mA/cm^2$) | Chromaticity x | Chromaticity y | Current effeciency (cd/A) | External quantum efficiency (%) |
|---|---|---|---|---|---|---|---|
| Light-emitting device 1 | 3.1 | 0.33 | 8.3 | 0.14 | 0.13 | 10.2 | 10.2 |
| Light-emitting device 2 | 3.3 | 0.47 | 11.7 | 0.14 | 0.12 | 9.5 | 9.7 |
| Light-emitting device 3 | 3.2 | 0.34 | 8.4 | 0.14 | 0.12 | 10.7 | 10.9 |
| Comparative light-emitting device 1 | 3.0 | 0.46 | 11.5 | 0.14 | 0.15 | 10.4 | 9.3 |
| Comparative light-emitting device 2 | 3.5 | 0.40 | 10.0 | 0.14 | 0.13 | 7.8 | 7.7 |

FIGS. 14 to 19 and Table 3 show that the light-emitting devices 1 to 3 of one embodiment of the present invention are blue-light-emitting devices with favorable characteristics.

Figure 20:
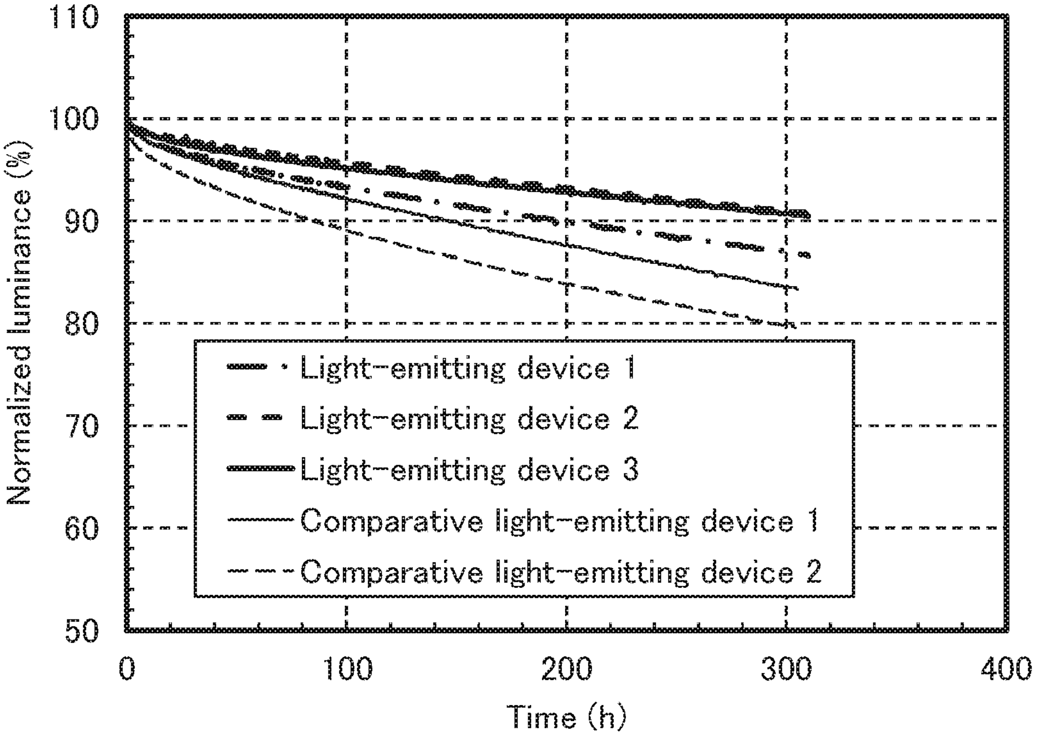
FIG. 20 shows the time dependence of normalized luminance of light-emitting devices 1 to 3 and comparative light-emitting devices 1 and 2.

FIG. 20 is a graph showing luminance changes with respect to driving time at the current density of 50 $mA/cm^2$. As shown in FIG. 20, the light-emitting device 1 of one embodiment of the present invention kept 86% or more of the initial luminance after 300 hours, and the light-emitting devices 2 and 3 of one embodiment of the present invention kept 90% or more of the initial luminance when 300 hours have passed. The light-emitting devices 1 to 3 were found to be long-lifetime light-emitting devices with a small reduction in luminance over driving time.

On the other hand, the comparative light-emitting device 1 and the comparative light-emitting device 2 each including cgDBCzPA in the electron transport layer had 84% or less and 80% or less of the initial luminance, respectively, when 300 hours have passed. Note that cgDBCzPA is a material whose electron mobility when the square root of the electric field strength [V/cm] is 600 is high ($7.7\times10^{-5}$ $cm^2/Vs$). In the comparative light-emitting devices, the electron mobility in the electron-transport layer is too high with respect to the hole-injection capability of the hole-injection layer and the hole-transport capability of the hole-transport layer, which may narrow a light-emitting region in the light-emitting layer and promote degradation.

In addition, each of the sixth organic compound and the seventh organic compound of the comparative light-emitting devices is cgDBCzPA, so that there is no difference between the LUMO levels of the sixth organic compound and the seventh organic compound. Therefore, electrons are easily injected into the light-emitting layer 113, whereby the light-emitting layer 113 is likely to have excess electrons.

The comparative light-emitting device 2 having the electron-transport layer with a high electron-transport property also has a structure in which a difference between the HOMO level of PCBBiF, which is the organic compound used for the first hole-transport layer, and the HOMO level of PCzN2, which is the organic compound used for the second hole-transport layer, is 0.36 eV, exceeding 0.2 V. Accordingly, hole injection from the first hole-transport layer to the second hole-transport layer is suppressed and holes and electrons are not easily balanced, so that the comparative light-emitting device 2 is the most-degraded light-emitting device among the devices. Furthermore, the current efficiency and the external quantum efficiency of the comparative light-emitting device 2 are lower than those of the other devices, which suggest that the number of electrons that pass through the light-emitting layer without recombination is increased due to excess electrons.

Example 2

In this example, light-emitting devices 4 to 6 of one embodiment of the present invention and a comparative light-emitting device 3 which is a comparative light-emitting device are described. Structural formulae of organic compounds used for the light-emitting devices 4 to 6 and the comparative light-emitting device 3 are shown below.

[Chemical Formula 4]

(i)

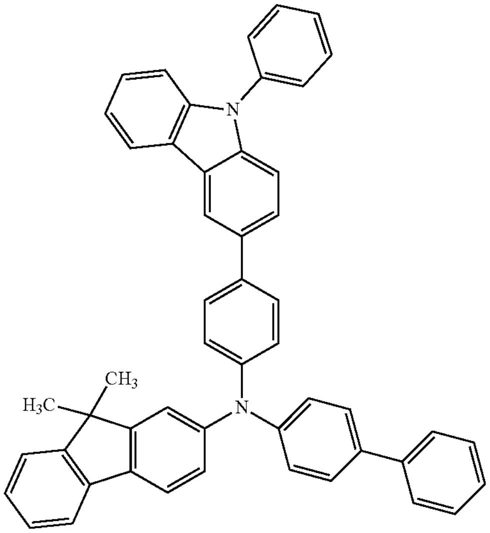

PCBBiF

-continued (ii)

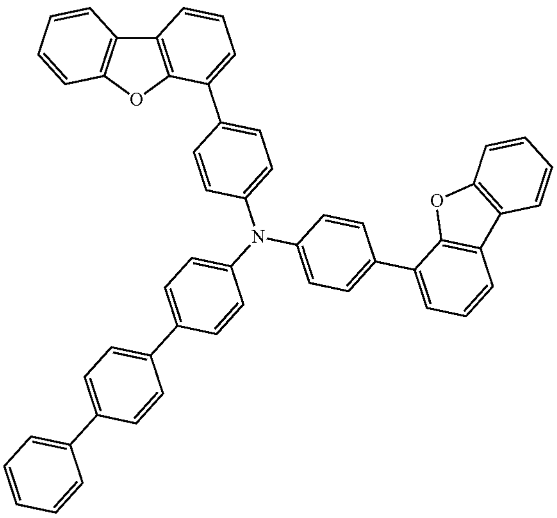

DBfBB1TP (iv)

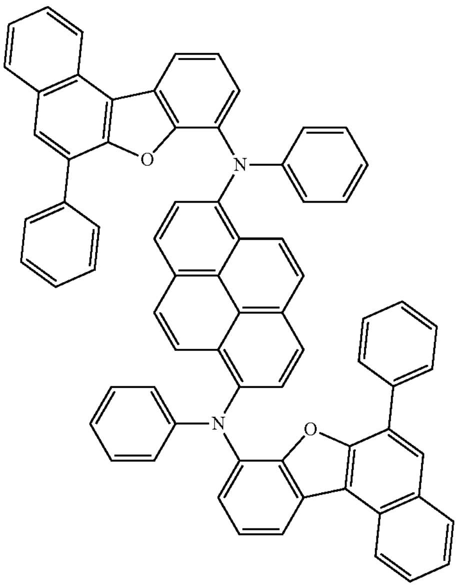

1,6BnfAPrn-03

(v)

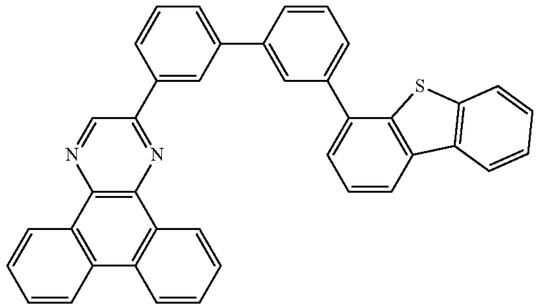

2mDBTBPDBq-II

-continued (vi)

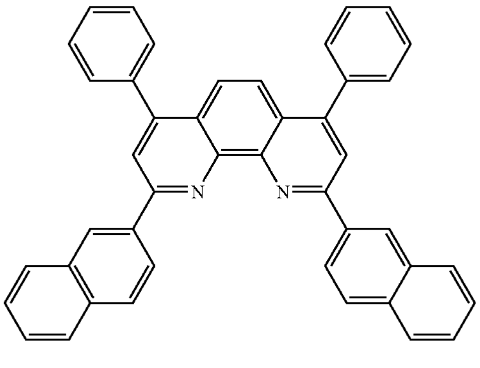

NBPhen (vii)

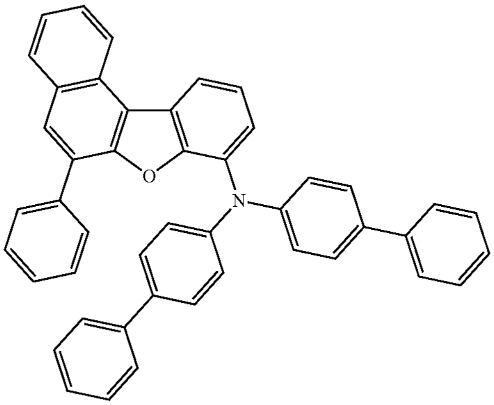

BBABnf (viii)

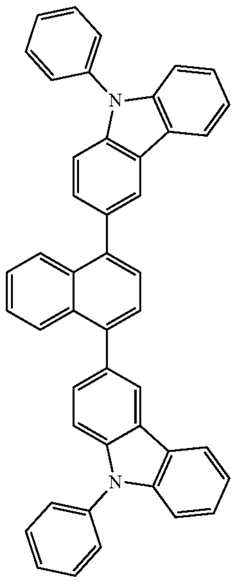

PCzN2

-continued (ix)

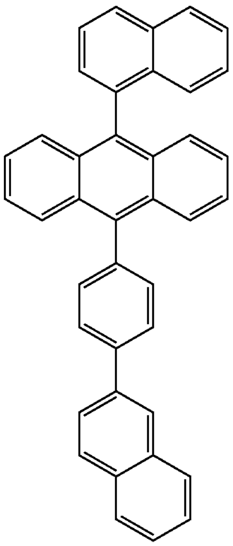

αN-βNPAnth (Method for Fabricating Light-Emitting Device 4)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (i) and NDP-9 (produced by Analysis Atelier Corporation, material serial No. 1S20170124) were deposited on the anode 101 to a thickness of 10 nm by co-evaporation using a resistance-heating method such that the weight ratio of PCBBiF to NDP-9 was 1:0.1, whereby the hole-injection layer 111 was formed.

Subsequently, over the hole-injection layer 111, PCBBiF was deposited to a thickness of 20 nm by evaporation as the first hole-transport layer 112-1, and then N,N-bis[4-(dibenzofuran-4-yl)phenyl]-4-amino-p-terphenyl (abbreviation: DBfBB1TP) represented by the structural formula (ii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by the structural formula (ix) and N,N-(pyrene-1,6-diyl)bis[(6,N-diphenylbenzo[b]naphtho[1,2-d]furan)-8-amine] (abbreviation:

1,6BnfAPrn-03) represented by the structural formula (iv) were deposited to a thickness of 25 nm by co-evaporation such that the weight ratio of αN-βNPAnth to 1,6BnfAPrn-03 was 1:0.03, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 4 of this example was fabricated.

(Method for Fabricating Light-Emitting Device 5)

The light-emitting device 5 was fabricated in the same manner as the light-emitting device 4 except that PCBBiF of the light-emitting device 4 was replaced with N,N-bis(4-biphenyl)-6-phenylbenzo[b]naphtho[1,2-d]furan-8-amine (abbreviation: BBABnf) represented by the structural formula (vii).

(Method for Fabricating Light-Emitting Device 6)

The light-emitting device 6 was fabricated in the same manner as the light-emitting device 5 except that DBfBB1TP of the light-emitting device 5 was replaced with 3,3'-(naphthalene-1,4-diyl)bis(9-phenyl-9H-carbazole) (abbreviation: PCzN2) represented by the structural formula (viii).

(Method for Fabricating Comparative Light-Emitting Device 3)

The comparative light-emitting device 3 was fabricated in the same manner as the light-emitting device 4 except that 2mDBTBPDBq-II of the light-emitting device 4 was replaced with αN-βNPAnth.

The structures of the light-emitting devices 4 to 6 and the comparative light-emitting device 3 are listed in the following table.

The HOMO levels, the LUMO levels, and the electron mobilities of the organic compounds used in this example are listed in the following table. The electron mobilities were measured when the square root of the electric field strength [V/cm] was 600.

TABLE 5

| | HOMO level (eV) | LUMO level (eV) | Electron mobility ($cm^2/Vs$) |
|---|---|---|---|
| PCBBiF | −5.36 | — | — |
| BBABnf | −5.56 | — | — |
| DBfBB1TP | −5.50 | — | — |
| PCzN2 | −5.71 | — | — |
| αN-βNPAnth | −5.85 | −2.74 | — |
| 2mDBTBPDBq-II | — | −2.94 | $2.2 \times 10^{-5}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 21:
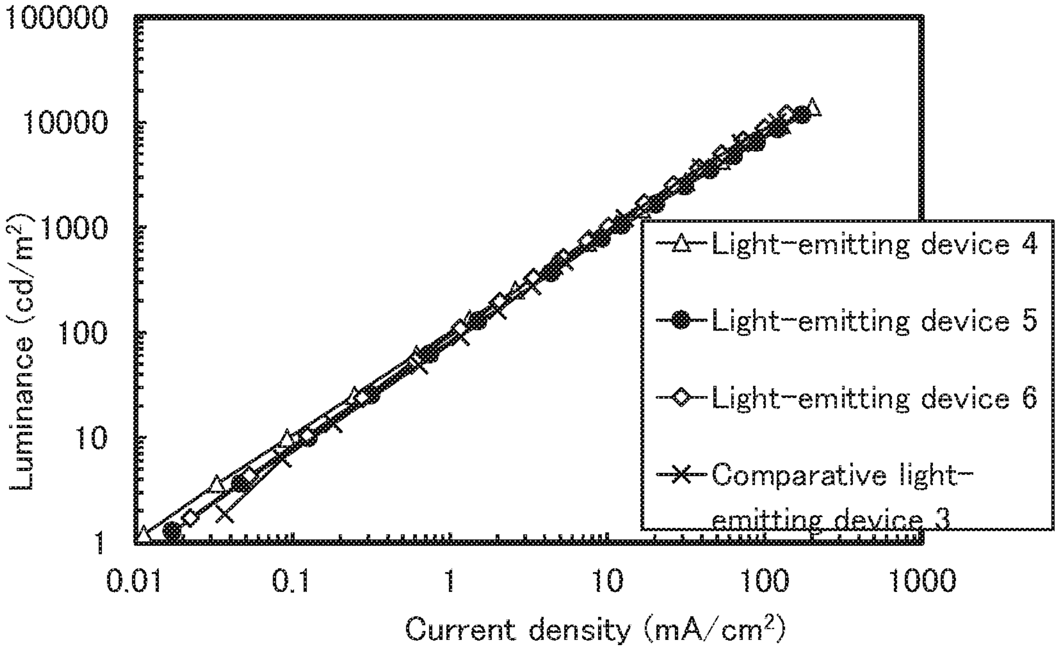
FIG. 21 shows the luminance-current density characteristics of light-emitting devices 4 to 6 and a comparative light-emitting device 3.
Figure 22:
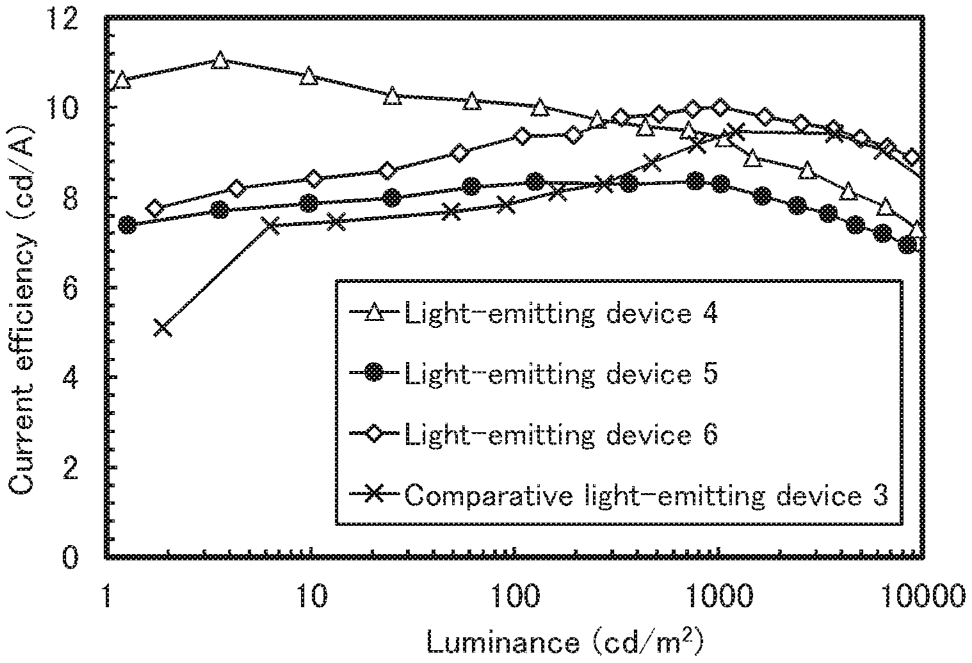
FIG. 22 shows the current efficiency-luminance characteristics of light-emitting devices 4 to 6 and a comparative light-emitting device 3.
Figure 23:
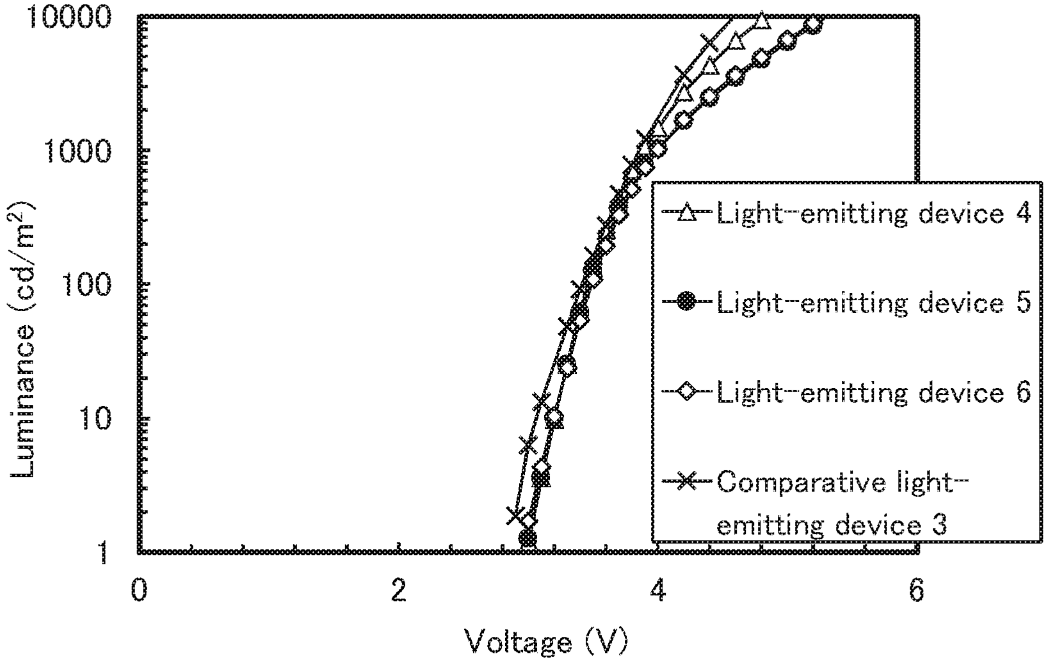
FIG. 23 shows the luminance-voltage characteristics of light-emitting devices 4 to 6 and a comparative light-emitting device 3.
Figure 24:
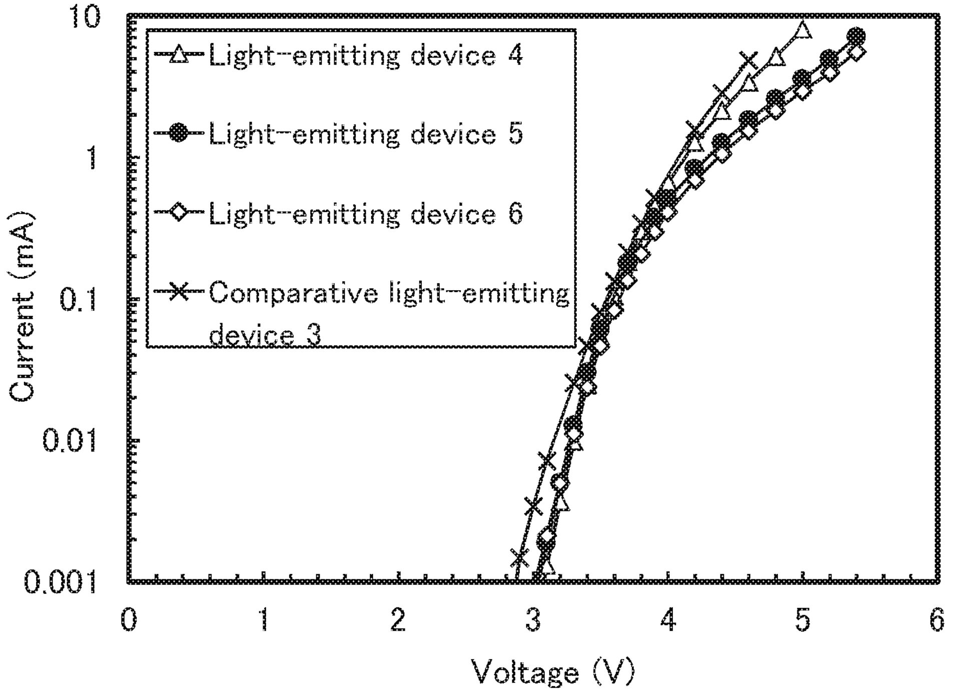
FIG. 24 shows the current-voltage characteristics of light-emitting devices 4 to 6 and a comparative light-emitting device 3.
Figure 25:
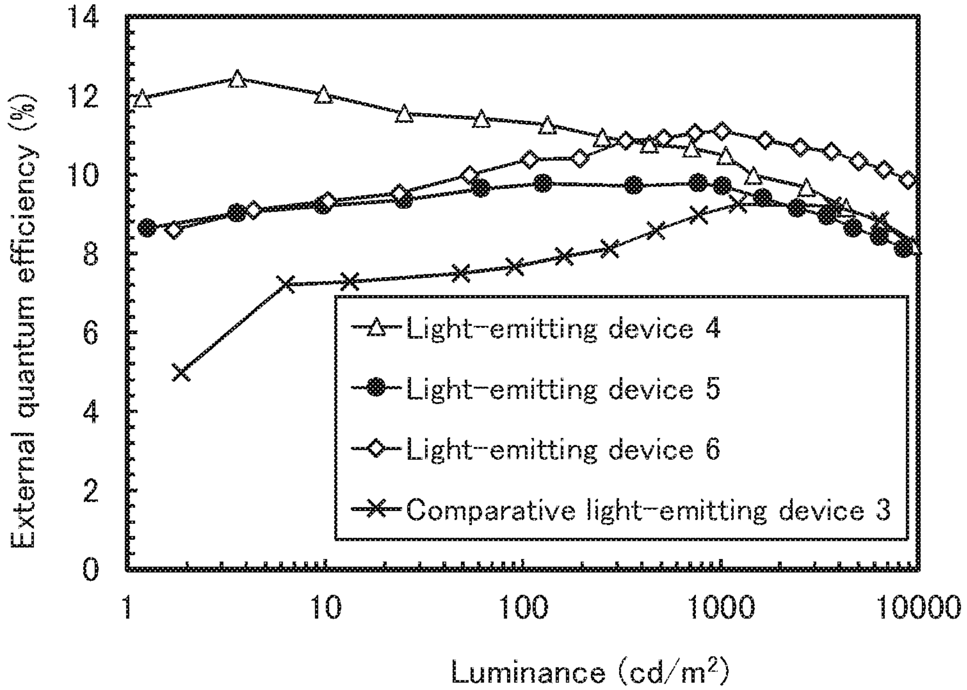
FIG. 25 shows the external quantum efficiency-luminance characteristics of light-emitting devices 4 to 6 and a comparative light-emitting device 3.
Figure 26:
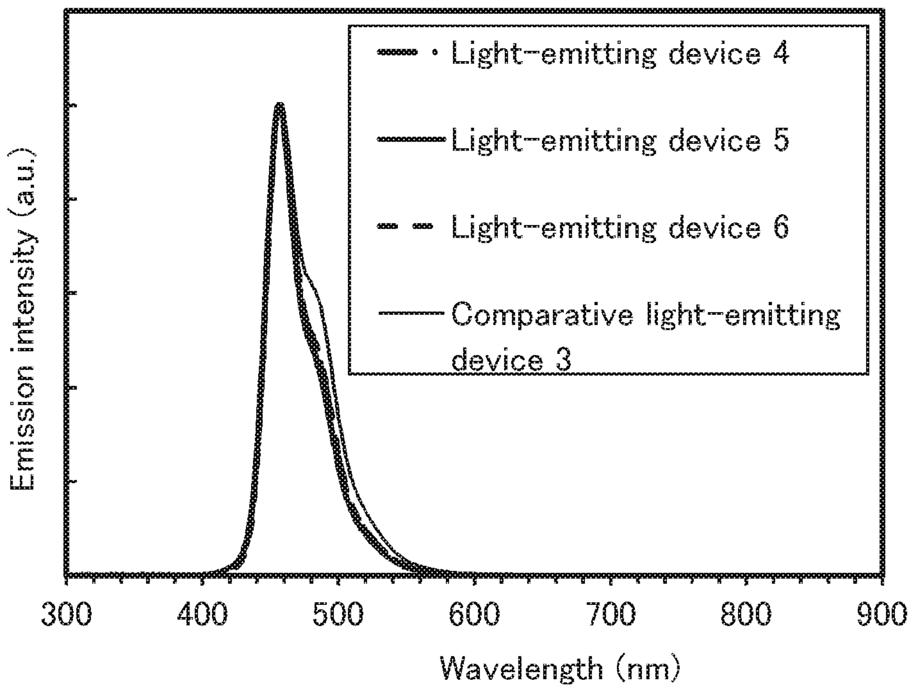
FIG. 26 shows the emission spectra of light-emitting devices 4 to 6 and a comparative light-emitting device 3.

FIG. 21 shows the luminance-current density characteristics of the light-emitting devices 4 to 6 and the comparative light-emitting device 3. FIG. 22 shows the current efficiency-luminance characteristics thereof. FIG. 23 shows the luminance-voltage characteristics thereof. FIG. 24 shows the current-voltage characteristics thereof. FIG. 25 shows the external quantum efficiency-luminance characteristics thereof. FIG. 26 shows the emission spectra thereof. Note that the numbers in legends of FIG. 16 to FIG. 27 correspond to the number of the light-emitting devices. With respect to the comparative light-emitting device, "comparative" is added before the number. Table 6 shows the main characteristics of the light-emitting devices at a luminance of about 1000 $cd/m^2$.

TABLE 4

| | Hole-injection layer | Hole-transport layer | | Light-emitting layer | Electron-transport layer | | Electron-injection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting device 4 | PCBBiF:NDP-9 (1 0.1) | PCBBiF | DBfBB1TP | αN-βNPAnth:1,6BnfAPrn-03 (1:0.03) | 2mDBIBP DBq-II | NBPhen | LiF |
| Light-emitting device 5 | BBABnf:NDP-9 (1:0.1) | BBABnf | DBfBB1TP | | | | |
| Light-emitting device 6 | | | PCzN2 | | | | |
| Comparative light-emitting device 3 | PCBBiF:NDP-9 (1:0.1) | PCBBiF | DBfBB1TP | | αN-βNPAnth | | |

TABLE 6

| | Voltage (V) | Current (mA) | Current density ($mA/cm^2$) | Chromaticity x | Chromaticity y | Current effeciency (cd/A) | External quantum efficiency (%) |
|---|---|---|---|---|---|---|---|
| Light-emitting device 4 | 3.9 | 0.46 | 11.4 | 0.14 | 0.10 | 9.3 | 10.5 |
| Light-emitting device 5 | 4.0 | 0.50 | 12.4 | 0.14 | 0.10 | 8.3 | 9.7 |
| Light-emitting device 6 | 4.0 | 0.41 | 10.2 | 0.14 | 0.11 | 10.0 | 11.1 |
| Comparative light-emitting device 3 | 3.9 | 0.52 | 12.9 | 0.14 | 0.13 | 9.5 | 9.2 |

FIGS. 21 to 26 and Table 6 show that the light-emitting devices 4 to 6 of one embodiment of the present invention are blue-light-emitting devices with favorable characteristics.

Figure 27:
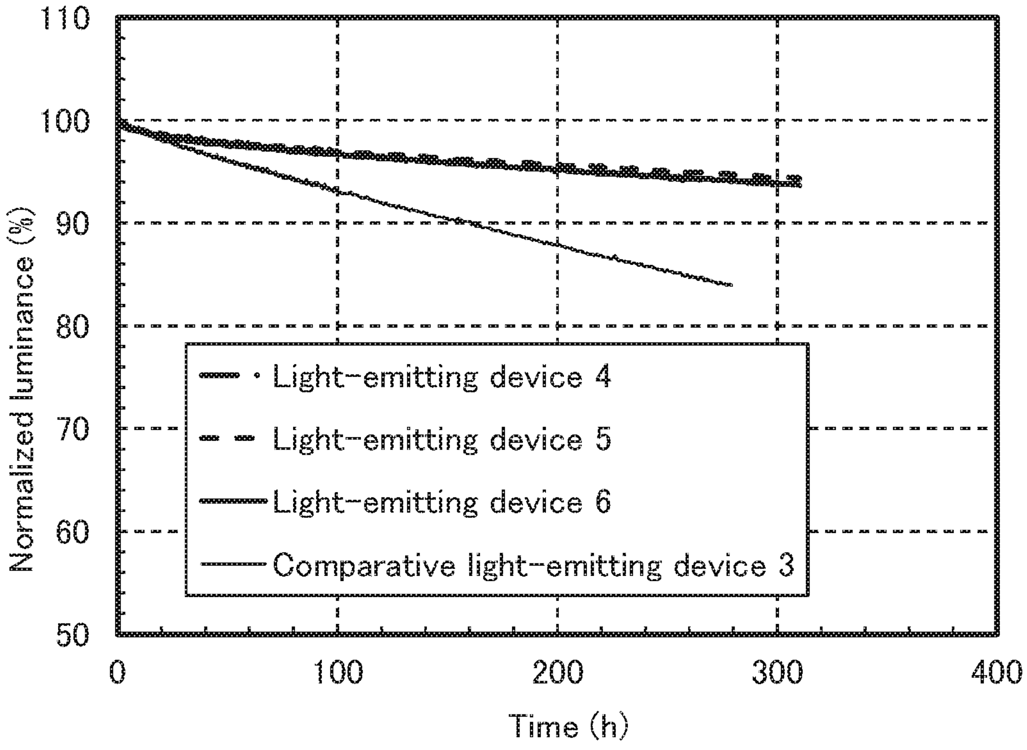
FIG. 27 shows the time dependence of normalized luminance of light-emitting devices 4 to 6 and a comparative light-emitting device 3.

FIG. 27 is a graph showing luminance changes with respect to driving time at the current density of 50 $mA/cm^2$. As shown in FIG. 27, the light-emitting devices 4 to 6 of one embodiment of the present invention kept approximately 94% of the initial luminance even when 300 hours have passed, and thus were found to be long-lifetime light-emitting devices with a small reduction in luminance over driving time.

In addition, each of the sixth organic compound and the seventh organic compound of the comparative light-emitting device 3 is αN-βNPAnth, so that there is no difference between the LUMO levels of the sixth organic compound and the seventh organic compound. Therefore, since electrons are easily injected into the light-emitting layer 113, the light-emitting layer 113 is likely to have excess electrons, which may promote degradation.

Example 3

In this example, light-emitting devices 7 and 8 of one embodiment of the present invention are described. Structural formulae of organic compounds used for the light-emitting devices 7 and 8 are shown below.

[Chemical Formula 5]

(vii)

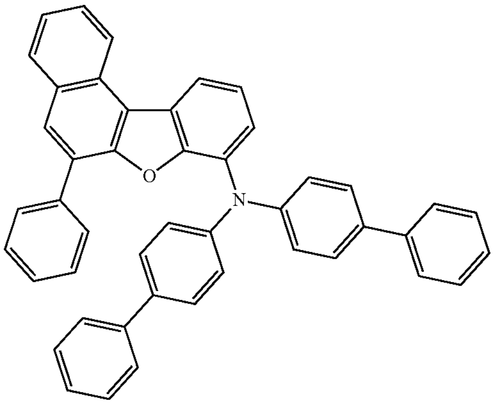

BBABnf (ii)

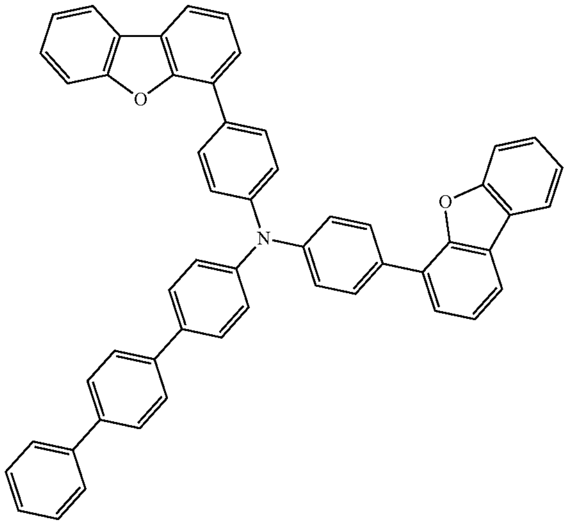

DBfBB1TP

-continued
(iii)
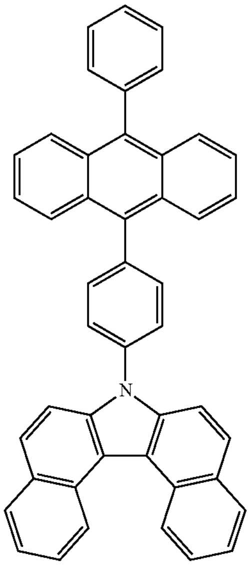
cgDBCzPA
(x)
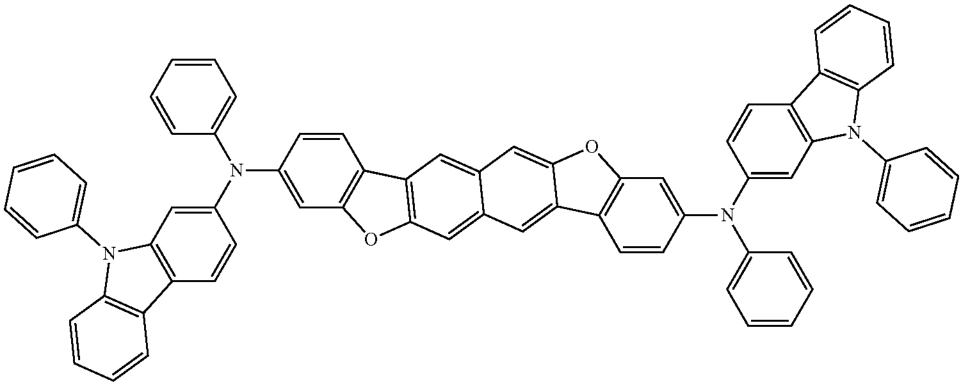
3, 10PCA2Nbf(IV)-02
(v)
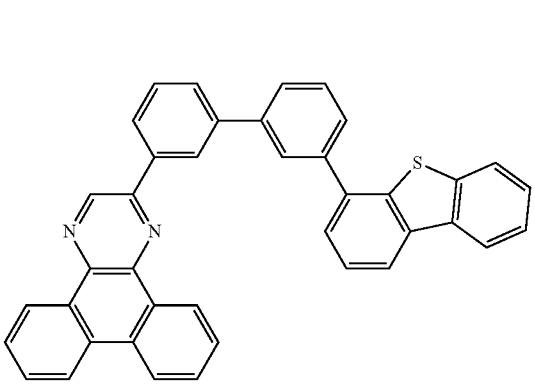
2mDBTBPDBq-II
(vi)
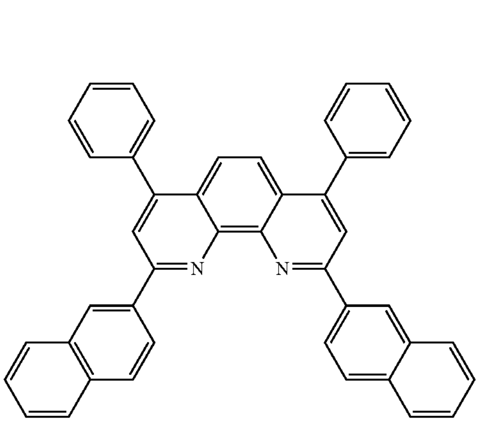
NBPhen -continued (ix)

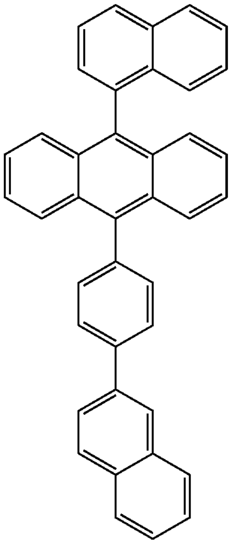

αN-βNPAnth (Method for Fabricating Light-Emitting Device 7)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by the structural formula (vii) and NDP-9 (produced by Analysis Atelier Corporation, material serial No. 1S20170124) were deposited on the anode 101 to a thickness of 10 nm by co-evaporation using a resistance-heating method such that the weight ratio of BBABnf to NDP-9 was 1:0.1, whereby the hole-injection layer 111 was formed.

Subsequently, over the hole-injection layer 111, BBABnf was deposited to a thickness of 20 nm by evaporation as the first hole-transport layer 112-1, and then N,N-bis[4-(dibenzofuran-4-yl)phenyl]-4-amino-p-terphenyl (abbreviation: DBfBB1TP) represented by the structural formula (ii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 7-[4-(10-phenyl-9-anthryl)phenyl]-7H-dibenzo[c,g]carbazole (abbreviation: cgDBCzPA) represented by the structural formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of cgDBCzPA to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 7 of this example was fabricated.

(Method for Fabricating Light-Emitting Device 8)

The light-emitting device 8 was fabricated in the same manner as the light-emitting device 7 except that cgDBCzPA of the light-emitting device 7 was replaced with 9-(1-naphthyl)-10-[4-(2-naphthyl)phenyl]anthracene (abbreviation: αN-βNPAnth) represented by the structural formula (ix).

The structures of the light-emitting devices 7 and 8 are listed in the following table.

TABLE 7

| | Hole-injection layer | Hole-transport layer | | Light-emitting layer | Electron-transport layer | | Electron-injection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting device 7 | BBABnf:NDP-9 (1:0.1) | BBABnf | DBfBB1TP | cgDBCzPA:3,10PCA2Nbf(IV)-02 (1:0.015) | 2mDBTBPDBq-II | NBPhen | LiF |
| Light-emitting device 8 | | | | αN-βNPAnth:3,10PCA2Nbf(IV)-02 (1:0.015) | | | |

The HOMO levels, the LUMO levels, and the electron mobilities of the organic compounds used in this example are listed in the following table. The electron mobilities were measured when the square root of the electric field strength [V/cm] was 600.

TABLE 8

| | HOMO level (eV) | LUMO level (eV) | Electron mobility ($cm^2$/Vs) |
|---|---|---|---|
| BBABnf | −5.56 | — | — |
| DBfBB1TP | −5.50 | — | — |
| αN-βNPAnth | −5.85 | −2.74 | — |
| cgDBCzPA | −5.69 | −2.74 | $7.7 \times 10^{-5}$ |
| 2mDBTBPDBq-II | — | −2.94 | $2.2 \times 10^{-5}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 28:
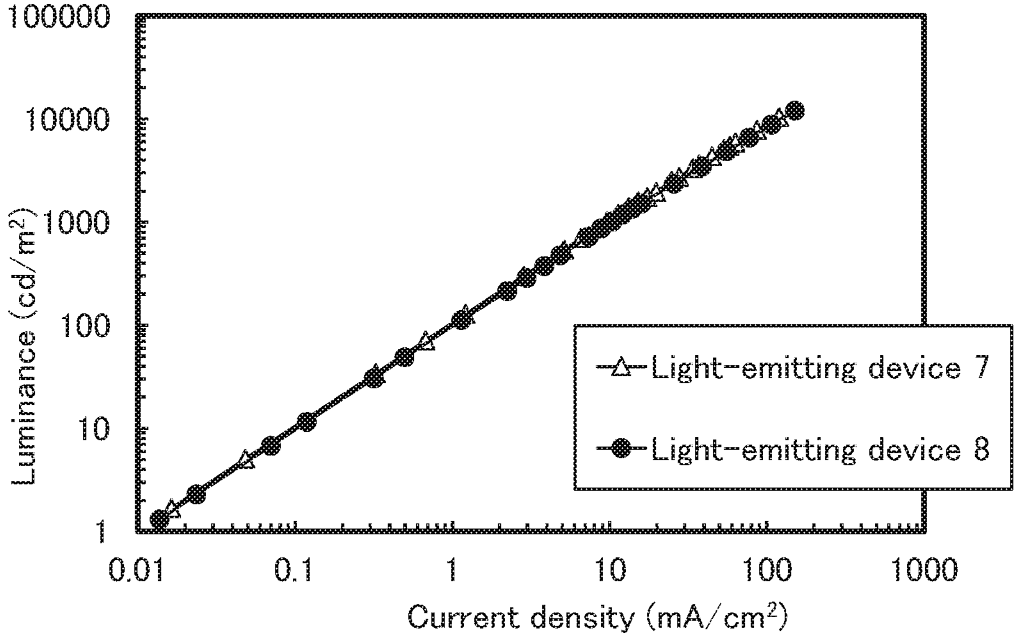
FIG. 28 shows the luminance-current density characteristics of light-emitting devices 7 and 8.
Figure 29:
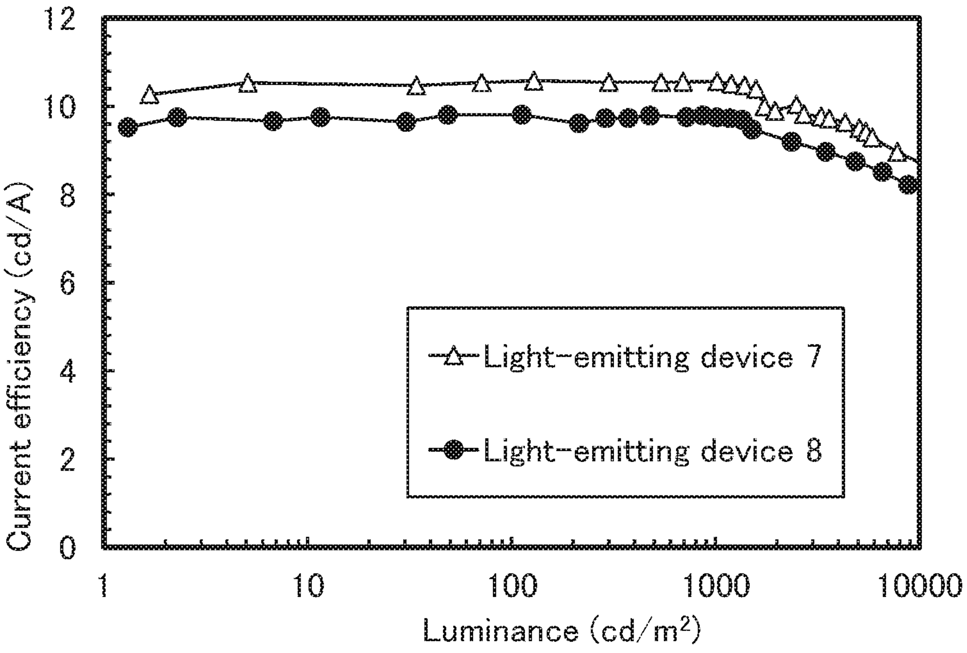
FIG. 29 shows the current efficiency-luminance characteristics of light-emitting devices 7 and 8.
Figure 30:
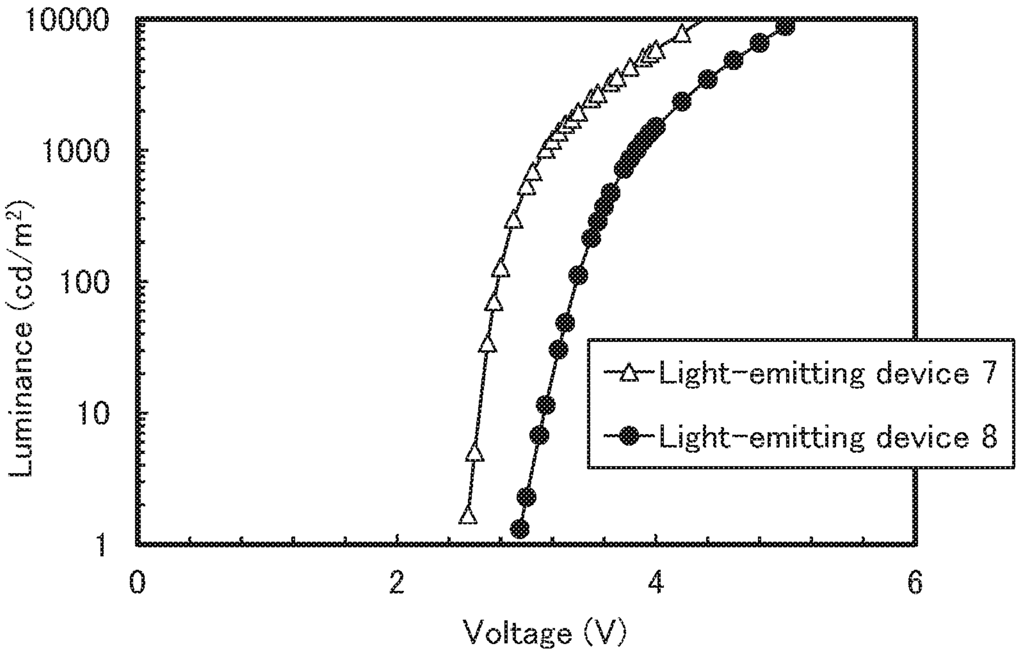
FIG. 30 shows the luminance-voltage characteristics of light-emitting devices 7 and 8.
Figure 31:
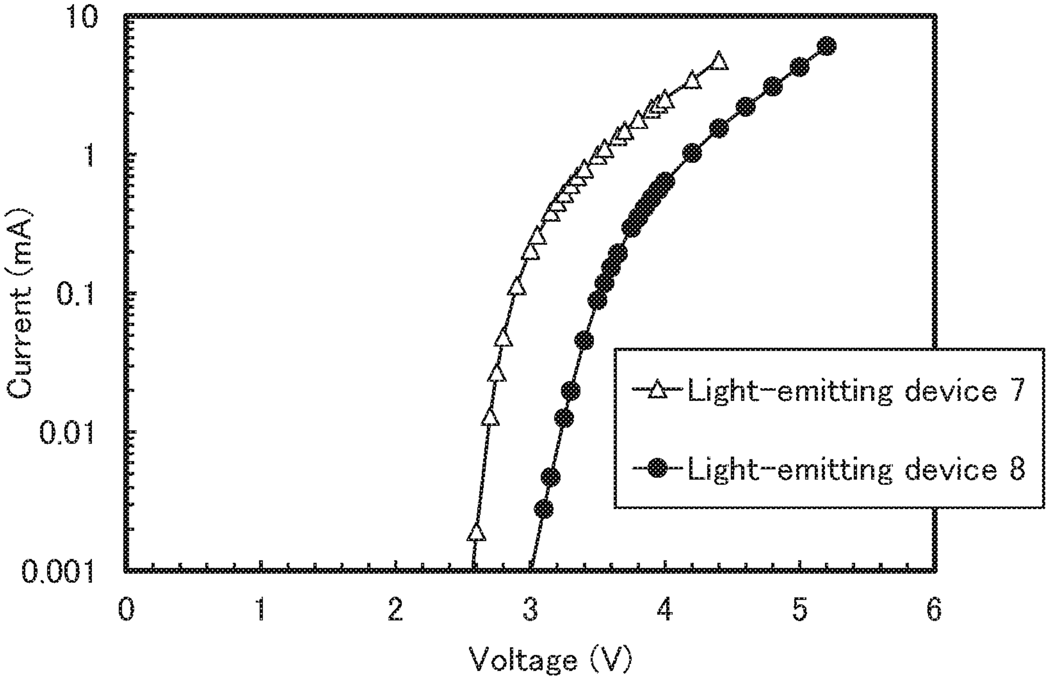
FIG. 31 shows the current-voltage characteristics of light-emitting devices 7 and 8.
Figure 32:
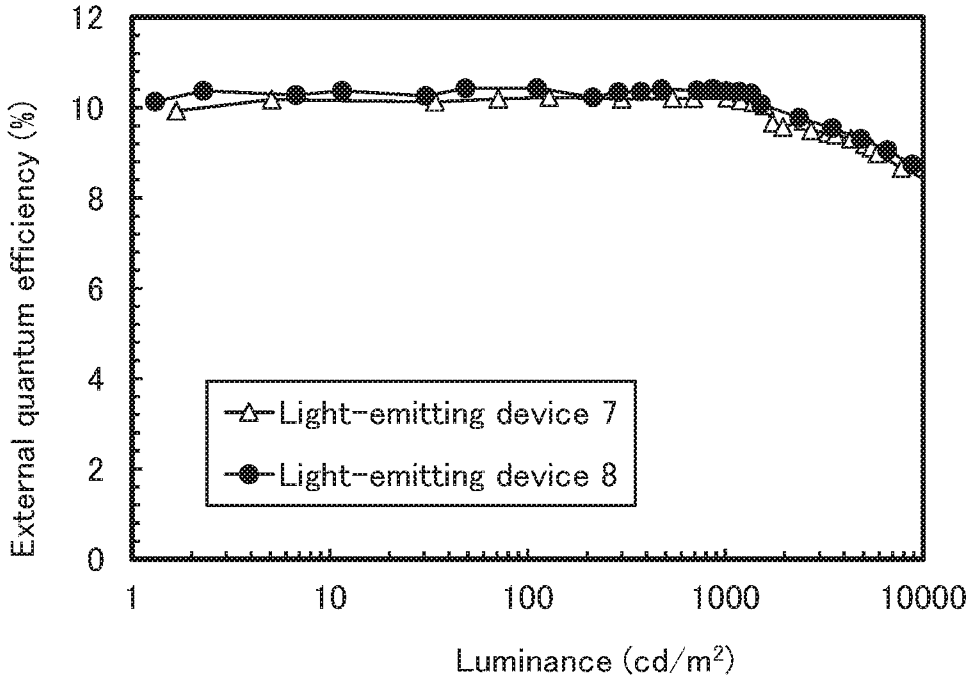
FIG. 32 shows the external quantum efficiency-luminance characteristics of light-emitting devices 7 and 8.
Figure 33:
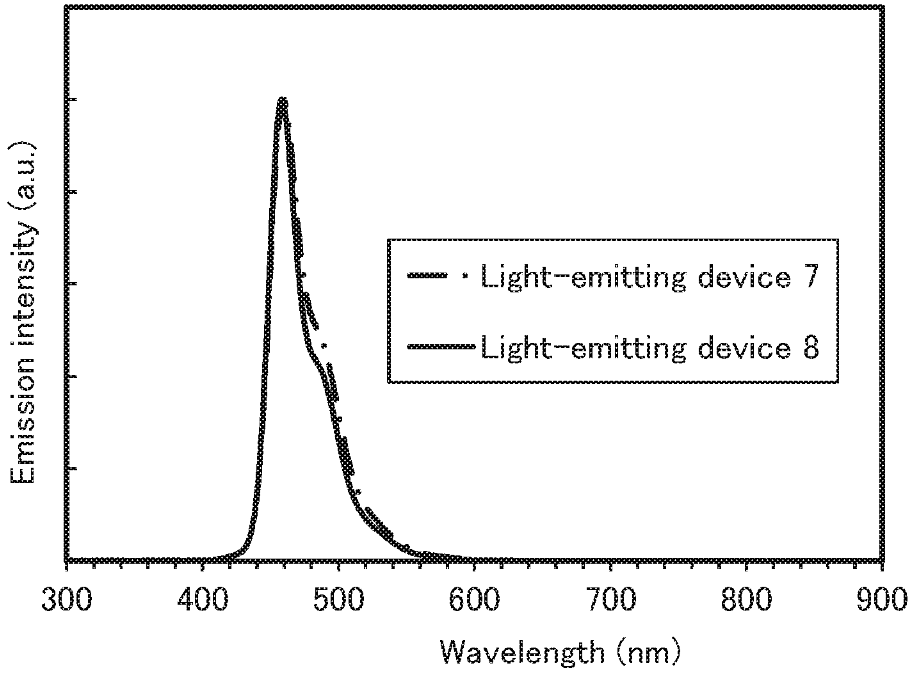
FIG. 33 shows the emission spectra of light-emitting devices 7 and 8.

FIG. 28 shows the luminance-current density characteristics of the light-emitting devices 7 and 8. FIG. 29 shows the current efficiency-luminance characteristics thereof. FIG. 30 shows the luminance-voltage characteristics thereof. FIG. 31 shows the current-voltage characteristics thereof. FIG. 32 shows the external quantum efficiency-luminance characteristics thereof. FIG. 33 shows the emission spectra thereof. Note that the numbers in legends of FIG. 28 to FIG. 34 correspond to the number of the light-emitting devices. Table 9 shows the main characteristics of the light-emitting devices at a luminance of about 1000 cd/$m^2$.

TABLE 9

| | Voltage (V) | Cunent (mA) | Cunent density (mA/$cm^2$) | Chromaticity x | Chromaticity y | Current effeciency (cd/A) | External quantum efficiency (%) |
|---|---|---|---|---|---|---|---|
| Light-emitting device 7 | 3.2 | 0.39 | 9.7 | 0.14 | 0.13 | 10.6 | 10.2 |
| Light-emitting device 8 | 3.9 | 0.42 | 10.4 | 0.14 | 0.11 | 9.7 | 10.4 |

FIGS. 28 to 33 and Table 9 show that the light-emitting devices 7 and 8 of one embodiment of the present invention are blue-light-emitting devices with favorable characteristics.

Figure 34:
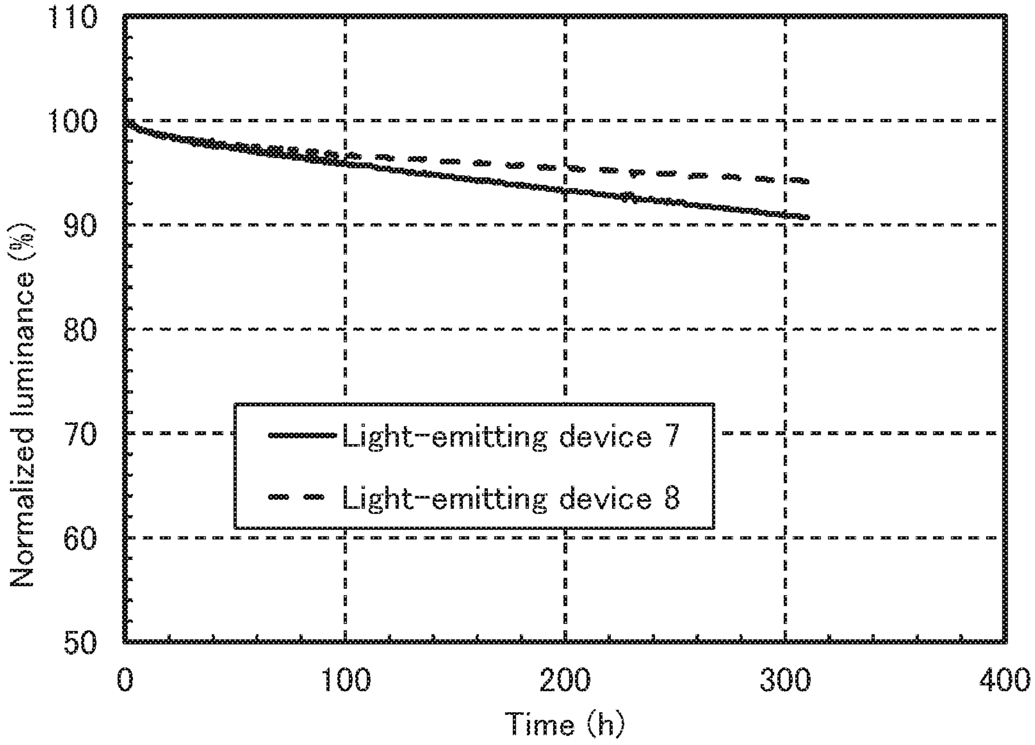
FIG. 34 shows the time dependence of normalized luminance of light-emitting devices 7 and 8.

FIG. 34 is a graph showing luminance changes with respect to driving time at the current density of 50 mA/$cm^2$. As shown in FIG. 34, the light-emitting devices 7 and 8 of one embodiment of the present invention kept 90% or more of the initial luminance even when 300 hours have passed, and thus were found to be long-lifetime light-emitting devices with a small reduction in luminance over driving time.

Example 4

In this example, a light-emitting device 9 of one embodiment of the present invention is described. Structural formulae of organic compounds used for the light-emitting device 9 are shown below.

[Chemical Formula 6]
(vii)
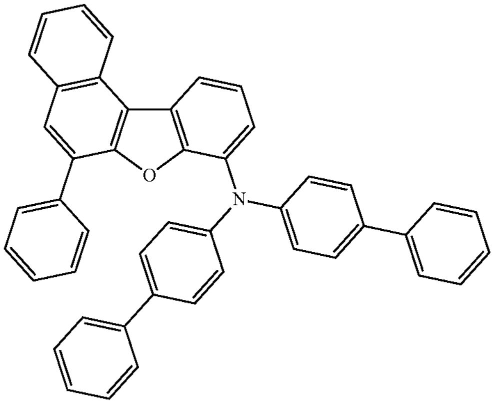
BBABnf
(viii)
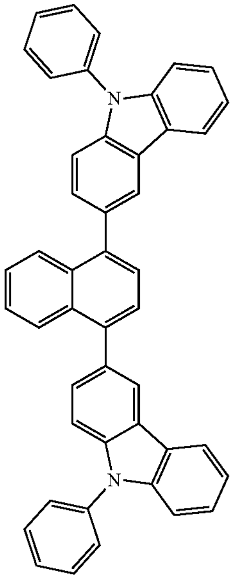
PCzN2
(ix)
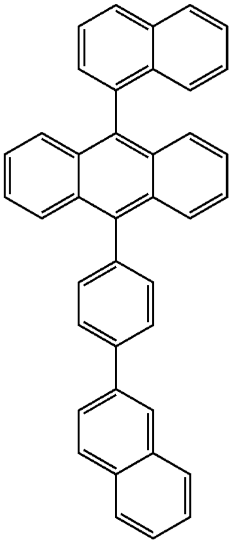
αN-βNPAnth
(x)
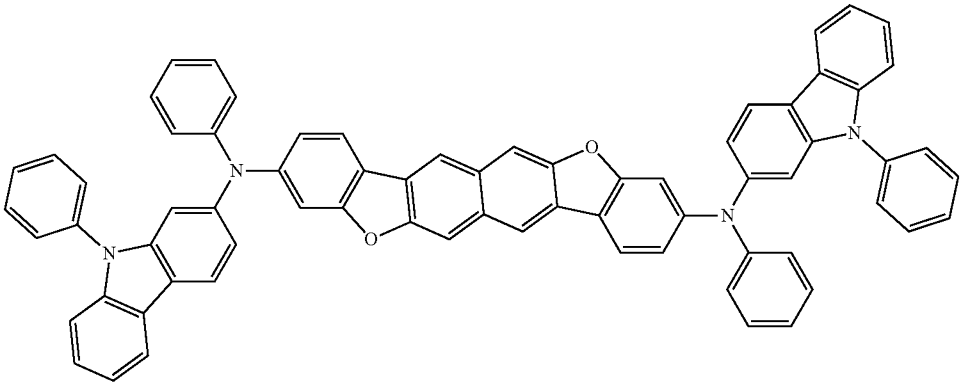
3,10PCA2Nbf(IV)-02

-continued (xi)

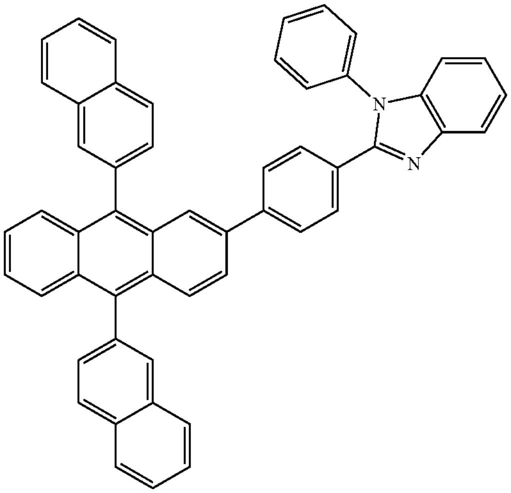

ZADN (xx)

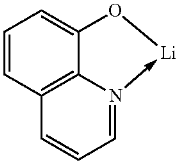

Liq (Method for Fabricating Light-Emitting Device 9)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by the structural formula (vii) and NDP-9 (produced by Analysis Atelier Corporation, material serial No. 1S20170124) were deposited on the anode 101 to a thickness of 10 nm by co-evaporation using a resistance-heating method such that the weight ratio of BBABnf to NDP-9 was 1:0.1, whereby the hole-injection layer 111 was formed.

Subsequently, over the hole-injection layer 111, BBABnf was deposited to a thickness of 20 nm by evaporation as the first hole-transport layer 112-1, and then 3,3'-(naphthalene-1,4-diyl)bis(9-phenyl-9H-carbazole) (abbreviation: PCzN2) represented by the structural formula (viii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by the structural formula (ix) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of αN-βNPAnth to 3,10PCA2Nbf(IV)-02 was 1:0.015, whereby the light-emitting layer 113 was formed.

Then, over the light-emitting layer 113, 2-{4-[9,10-di(naphthalen-2-yl)-2-anthryl]phenyl}-1-phenyl-1H-benzimidazole (abbreviation: ZADN) represented by the structural formula (xi) and 8-hydroxyquinolinatolithium (abbreviation: Liq) represented by the structural formula (xx) were deposited to a thickness of 25 nm by co-evaporation such that the weight ratio of ZADN to Liq was 1:0.9, whereby the electron-transport layer 114 was formed.

After the formation of the electron-transport layer 114, Liq was deposited to a thickness of 1 nm by evaporation to form the electron-injection layer 115. Then, aluminum was deposited to a thickness of 200 nm by evaporation to form the cathode 102. Thus, the light-emitting device 9 of this example was fabricated.

The structure of the light-emitting device 9 is listed in the following table.

TABLE 10

| | Hole-injection layer 10 nm | Hole-transport layer 1 20 nm | Hole-transport layer 2 10 nm | Light-emitting layer 25 nm | Electron-transport layer 25 nm | Electron-injection layer 1 nm |
|---|---|---|---|---|---|---|
| Light-emitting device 9 | BBABnf:NDP-9 (1:0.1) | BBABnf | PCzN2 | αN-βNPAnth:3,10PCANbf(IV)-02 (1:0.015) | ZADN:Liq (1:0.9) | Liq |

The HOMO levels, the LUMO levels, and the electron mobilities of the organic compounds used in this example are listed in the following table. The electron mobilities were measured when the square root of the electric field strength [V/cm] was 600.

TABLE 11

| | HOMO level (eV) | LUMO level (eV) | Electron mobility ($cm^2/Vs$) |
|---|---|---|---|
| BBABnf | −5.56 | — | — |
| PCzN2 | −5.71 | — | — |
| αN-βNPAnth | −5.85 | −2.74 | — |
| ZADN | — | −2.87 | — |
| ZADN:Liq (1:1) | — | — | $3.5 \times 10^{-6}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device 9 were measured. Note that the measurement was performed at room temperature.

Figure 35:
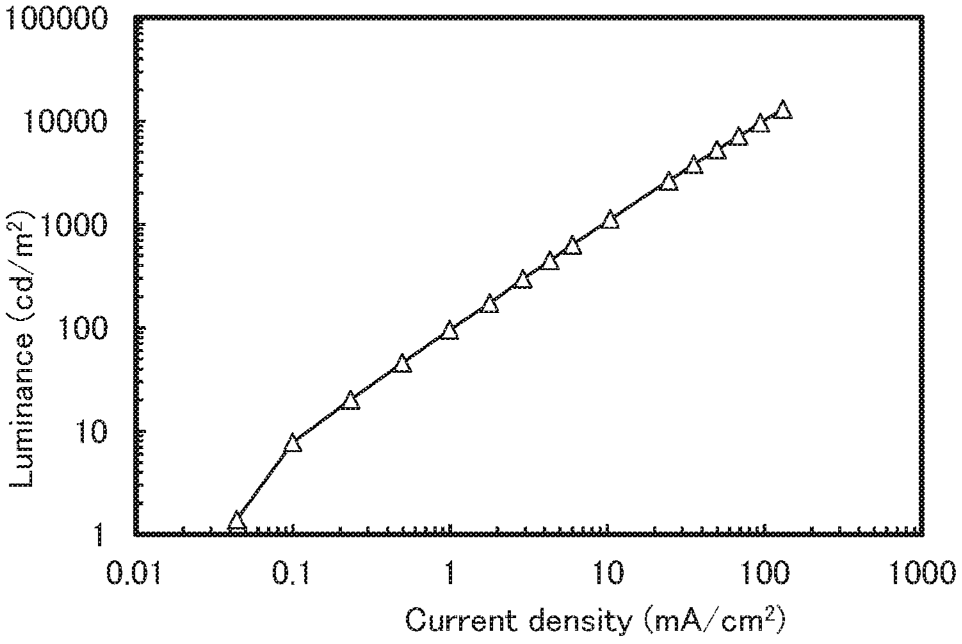
FIG. 35 shows the luminance-current density characteristics of a light-emitting device 9.
Figure 36:
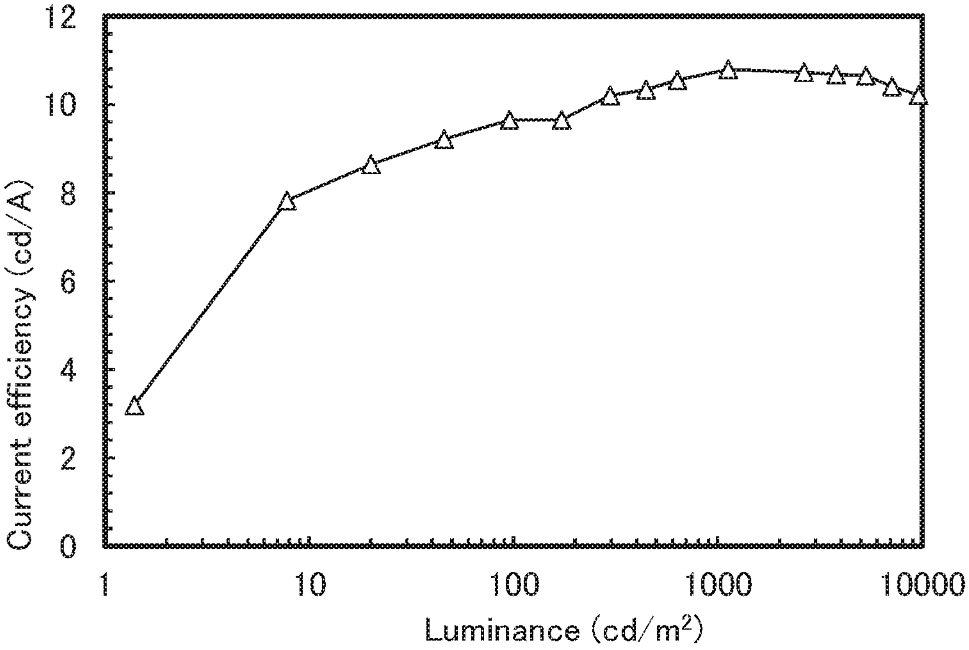
FIG. 36 shows the current efficiency-luminance characteristics of a light-emitting device 9.
Figure 37:
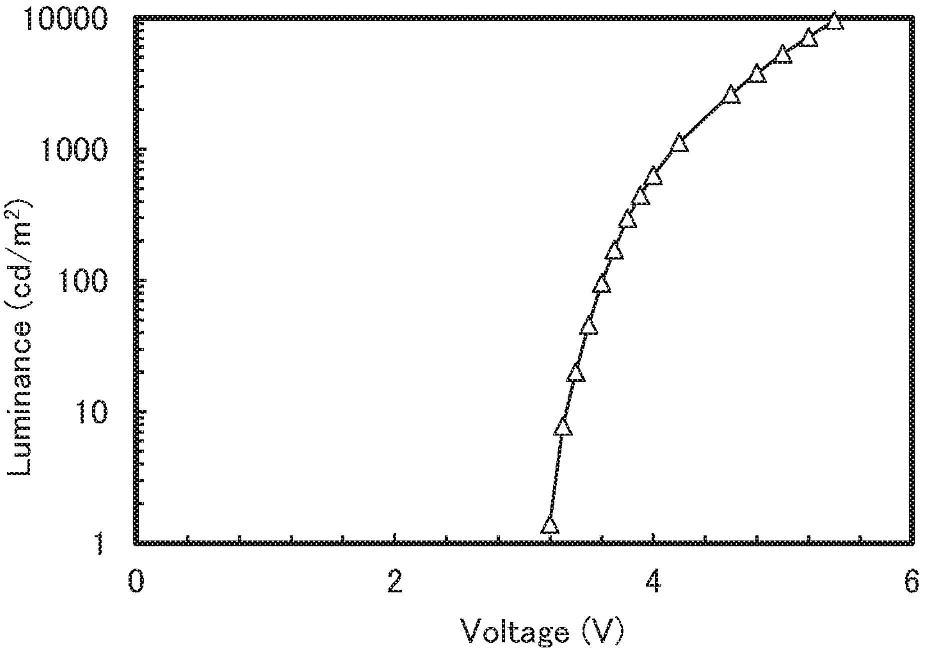
FIG. 37 shows the luminance-voltage characteristics of a light-emitting device 9.
Figure 38:
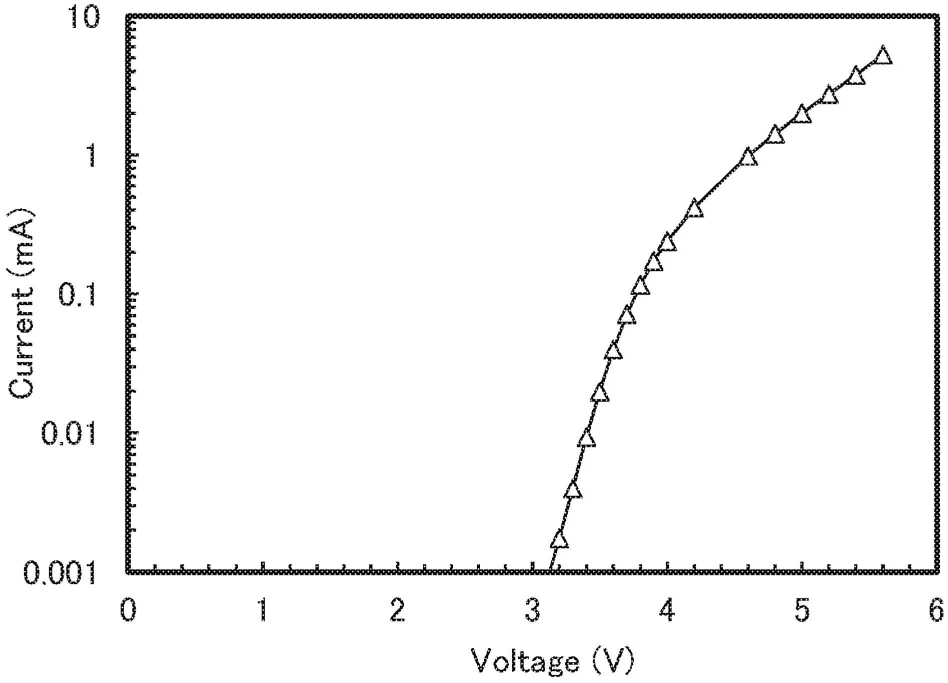
FIG. 38 shows the current-voltage characteristics of a light-emitting device 9.
Figure 39:
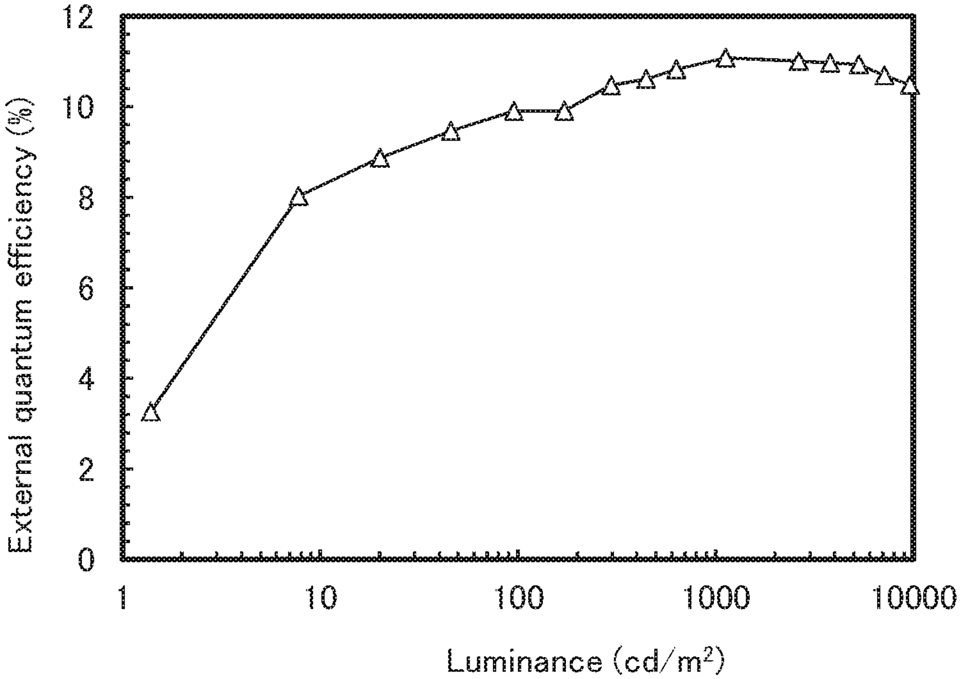
FIG. 39 shows the external quantum efficiency-luminance characteristics of a light-emitting device 9.
Figure 40:
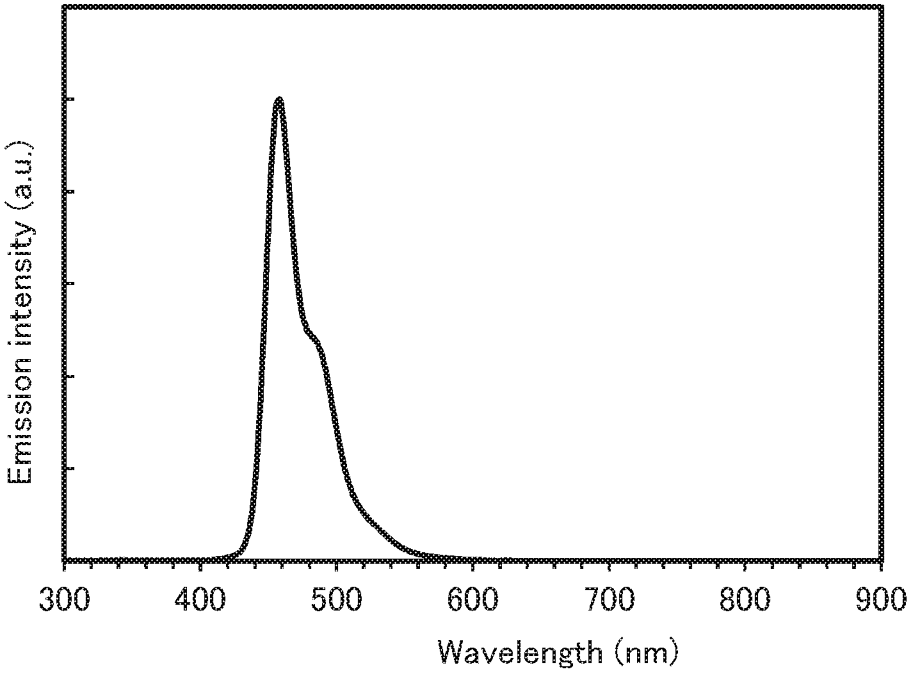
FIG. 40 shows the emission spectrum of a light-emitting device 9.

FIG. 35 shows the luminance-current density characteristics of the light-emitting device 9. FIG. 36 shows the current efficiency-luminance characteristics thereof. FIG. 37 shows the luminance-voltage characteristics thereof. FIG. 38 shows the current-voltage characteristics thereof. FIG. 39 shows the external quantum efficiency-luminance characteristics thereof. FIG. 40 shows the emission spectra thereof. Table 12 shows the main characteristics of the light-emitting device at a luminance of about 1000 $cd/m^2$.

TABLE 12

| | Voltage (V) | Current (mA) | Current density ($mA/cm^2$) | Chromaticity x | Chromaticity y | Current efficiency (cd/A) | External quantum efficiency (%) |
|---|---|---|---|---|---|---|---|
| Light-emitting device 9 | 4.2 | 0.42 | 10.4 | 0.14 | 0.12 | 10.8 | 11.1 |

FIGS. 35 to 40 and Table 12 show that the light-emitting device 9 of one embodiment of the present invention is a blue-light-emitting device with favorable characteristics.

Figure 41:
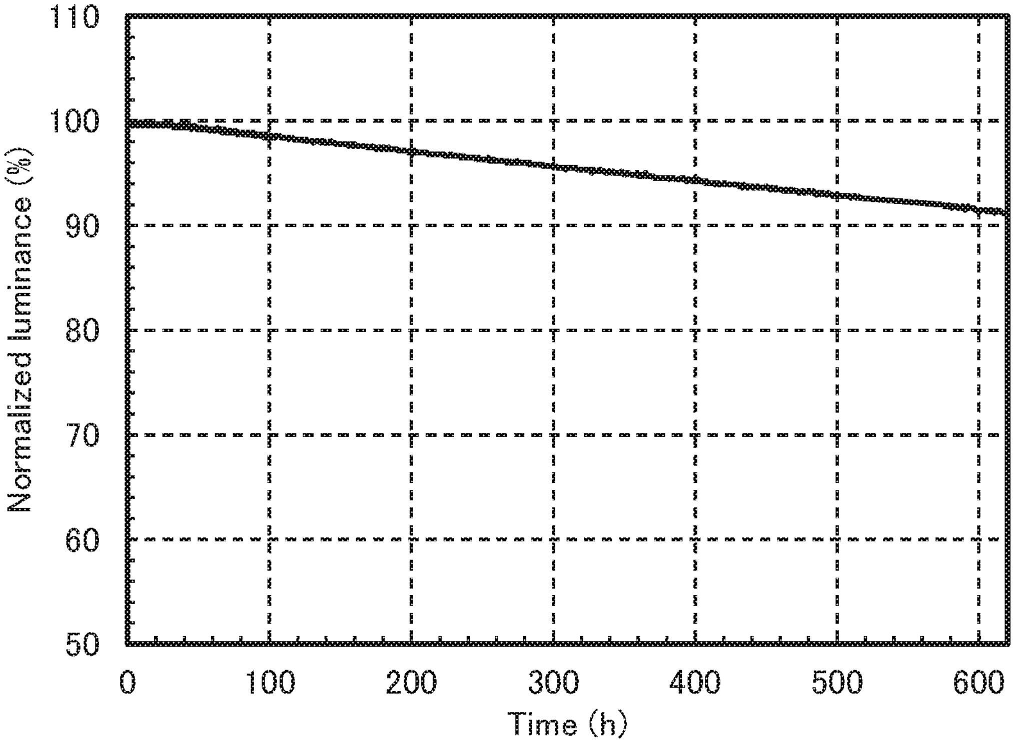
FIG. 41 shows the time dependence of normalized luminance of a light-emitting device 9.

FIG. 41 is a graph showing luminance changes with respect to driving time at the current density of 50 $mA/cm^2$. As shown in FIG. 41, the light-emitting device 9 of one embodiment of the present invention kept around 90% of the initial luminance even when 600 hours have passed, and thus was found to be a long-lifetime light-emitting device with a small reduction in luminance over driving time.

Note that the luminance decay curve of the light-emitting device 9 falls once, and then is raised. The light-emitting device 9 which shows such a degradation behavior has an extremely long lifetime.

Example 5

In this example, a light-emitting device 10 of one embodiment of the present invention is described. Structural formulae of organic compounds used for the light-emitting device 10 are shown below.

[Chemical Formula 7]
(i)
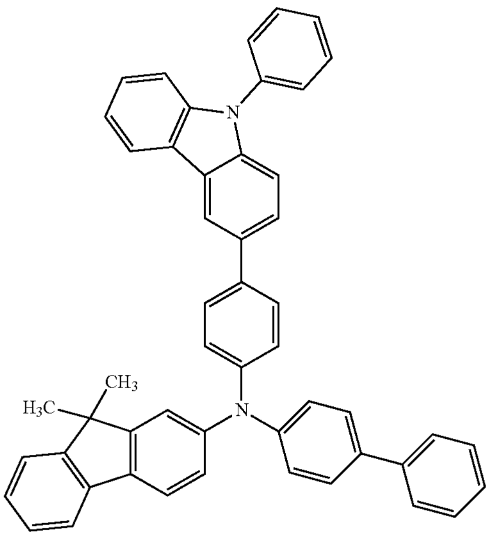
PCBBiF
(ii)
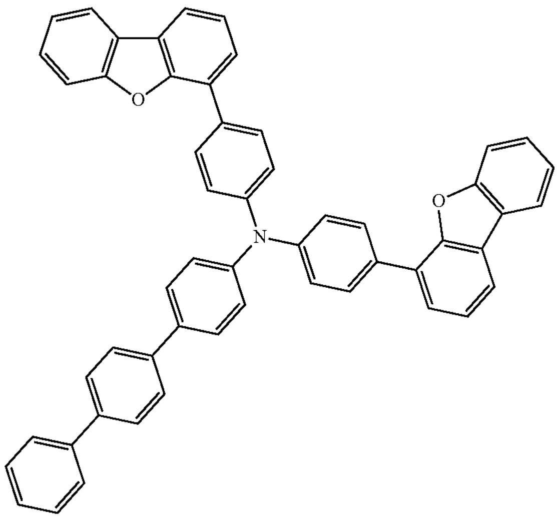
DBfBB1TP
(v)
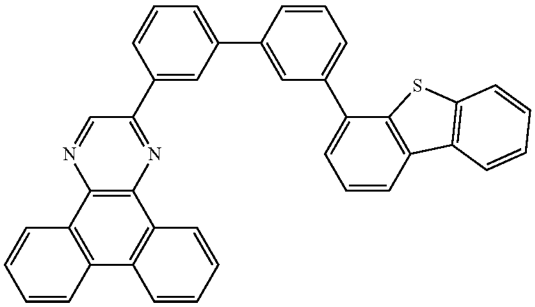
2mDBTBPDBq-II
(vi)
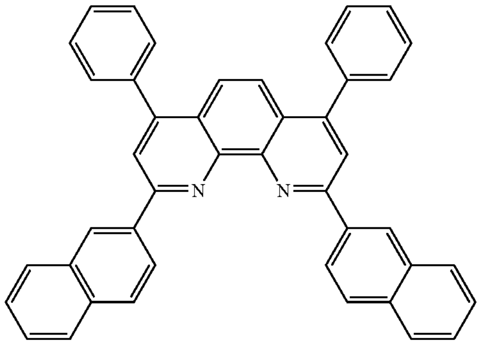
NBPhen
(ix)
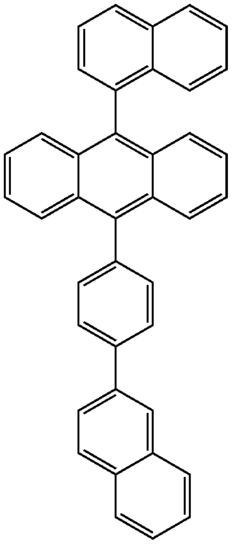
αN-βNPAnth -continued (x)

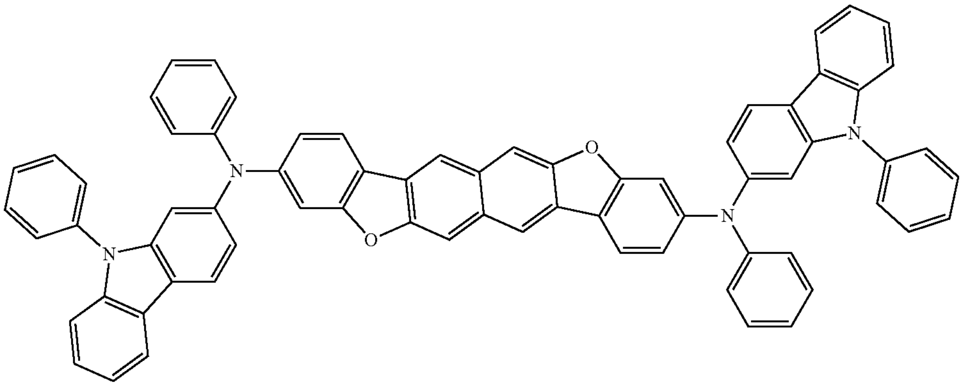

3,10PCA2Nbf(IV)-02

(Method for Fabricating Light-Emitting Device 10)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (i) and NDP-9 (produced by Analysis Atelier Corporation, material serial No. 1S20170124) were deposited on the anode 101 to a thickness of 10 nm by co-evaporation using a resistance-heating method such that the weight ratio of PCBBiF to NDP-9 was 1:0.1, whereby the hole-injection layer 111 was formed.

Subsequently, over the hole-injection layer 111, PCBBiF was deposited to a thickness of 20 nm by evaporation as the first hole-transport layer 112-1, and then N,N-bis[4-(dibenzofuran-4-yl)phenyl]-4-amino-p-terphenyl (abbreviation: DBfBB1TP) represented by the structural formula (ii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by the structural formula (ix) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of αN-βNPAnth to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 10 of this example was fabricated.

The structure of the light-emitting device 10 is listed in the following table.

TABLE 13

| | Hole-injection layer | Hole-transport layer 1 | Hole-transport layer 2 | Light-emitting layer | Electron-transport layer | Electron-transport layer | Electron-injection layer |
|---|---|---|---|---|---|---|---|
| | 10 nm | 20 nm | 10 nm | 25 nm | 15 nm | 10 nm | 1 nm |
| Light-emitting device 10 | PCBBiF:NDP-9 (1:0.1) | PCBBiF | DBfBB1TP | αN-βNPAnth:3,10PCA2Nbf(IV)-02 (1:0.015) | 2mDBTBPDBq-II | NBPhen | LiF |

The HOMO levels, the LUMO levels, and the electron mobilities of the organic compounds used in this example are listed in the following table. The electron mobilities were measured when the square root of the electric field strength [V/cm] was 600.

TABLE 14

| | HOMO level (eV) | LUMO level (eV) | Electron mobility ($cm^2/Vs$) |
|---|---|---|---|
| PCBBiF | −5.36 | — | — |
| DBfBB1TP | −5.50 | — | — |
| αN-βNPAnth | −5.85 | −2.74 | — |
| 2mDBTBPDBq-II | — | −2.94 | $2.2 \times 10^{-5}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device 10 were measured. Note that the measurement was performed at room temperature.

Figure 47:
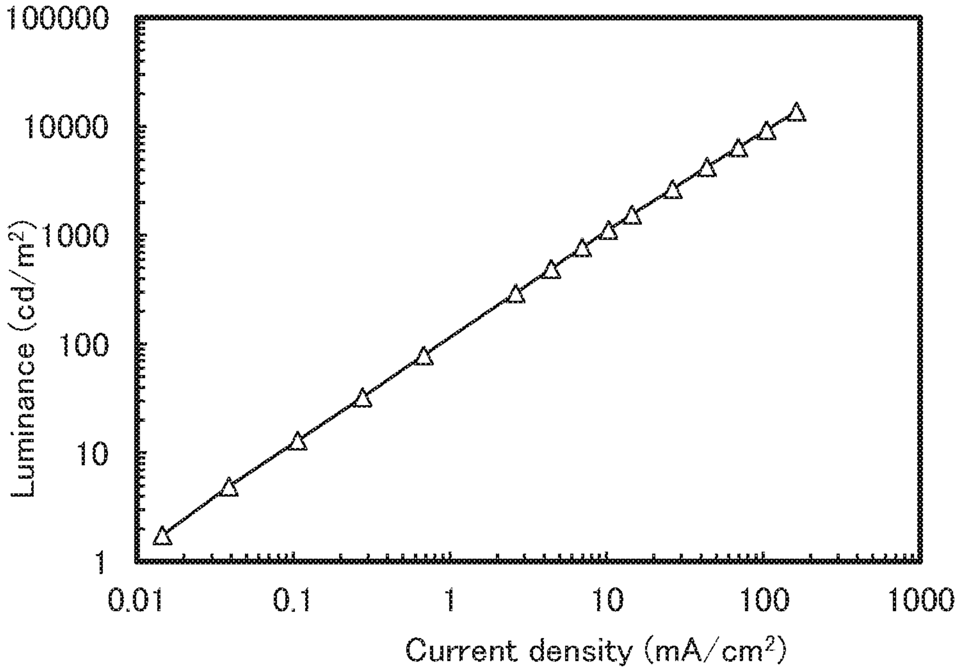
FIG. 47 shows the luminance-current density characteristics of a light-emitting device 10.
Figure 48:
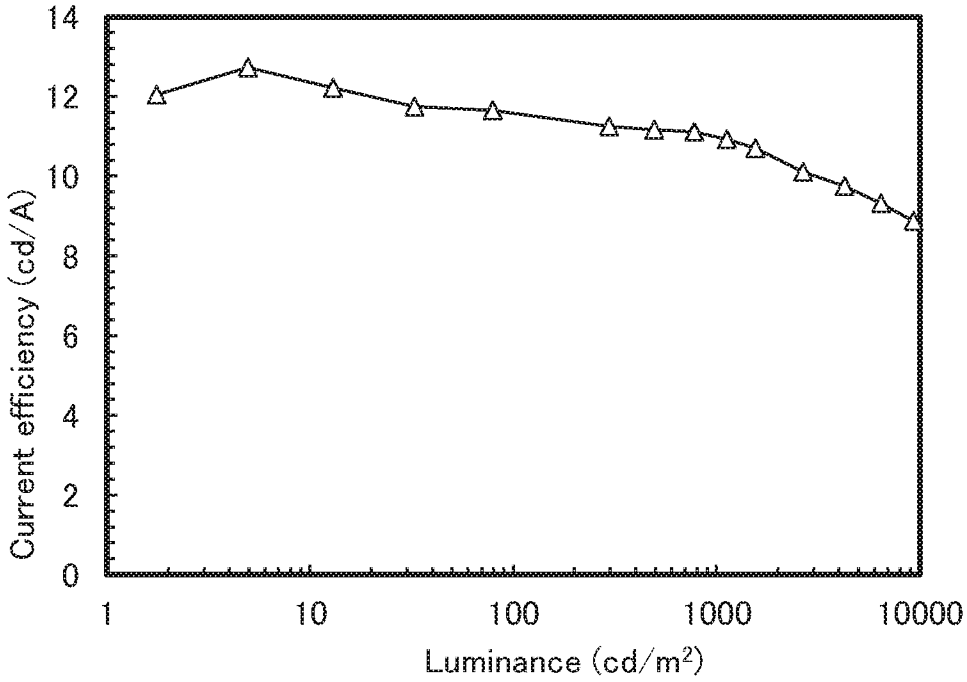
FIG. 48 shows the current efficiency-luminance characteristics of a light-emitting device 10.
Figure 49:
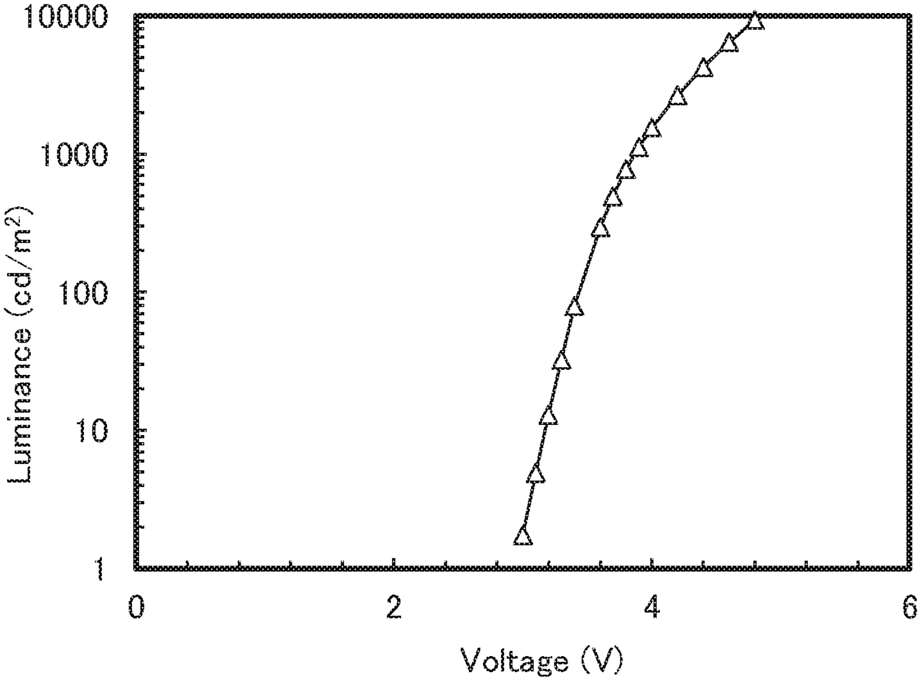
FIG. 49 shows the luminance-voltage characteristics of a light-emitting device 10.
Figure 50:
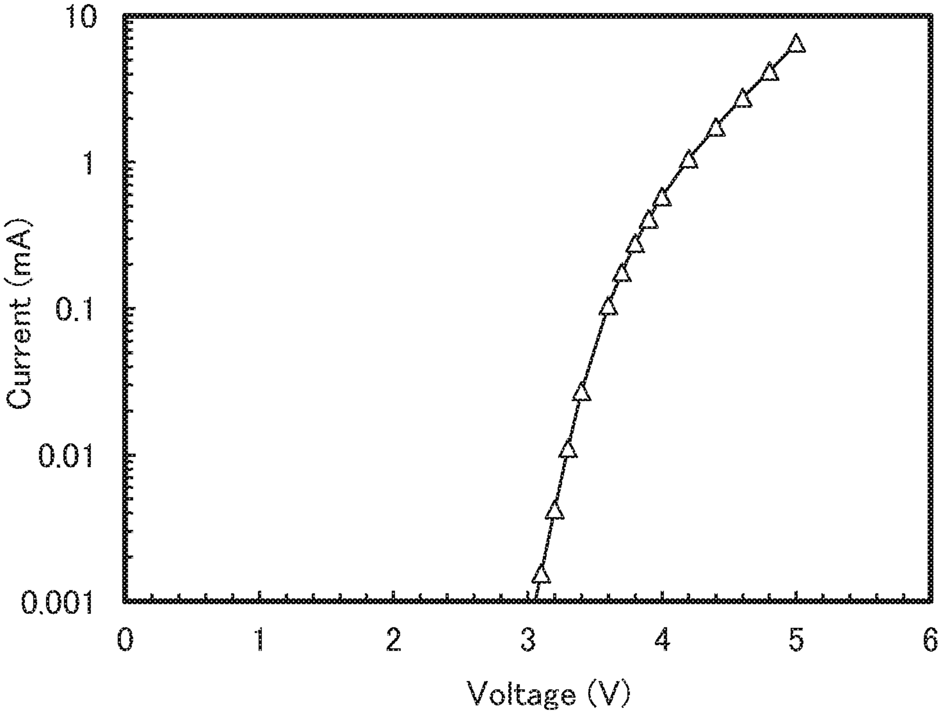
FIG. 50 shows the current-voltage characteristics of a light-emitting device 10.
Figure 51:
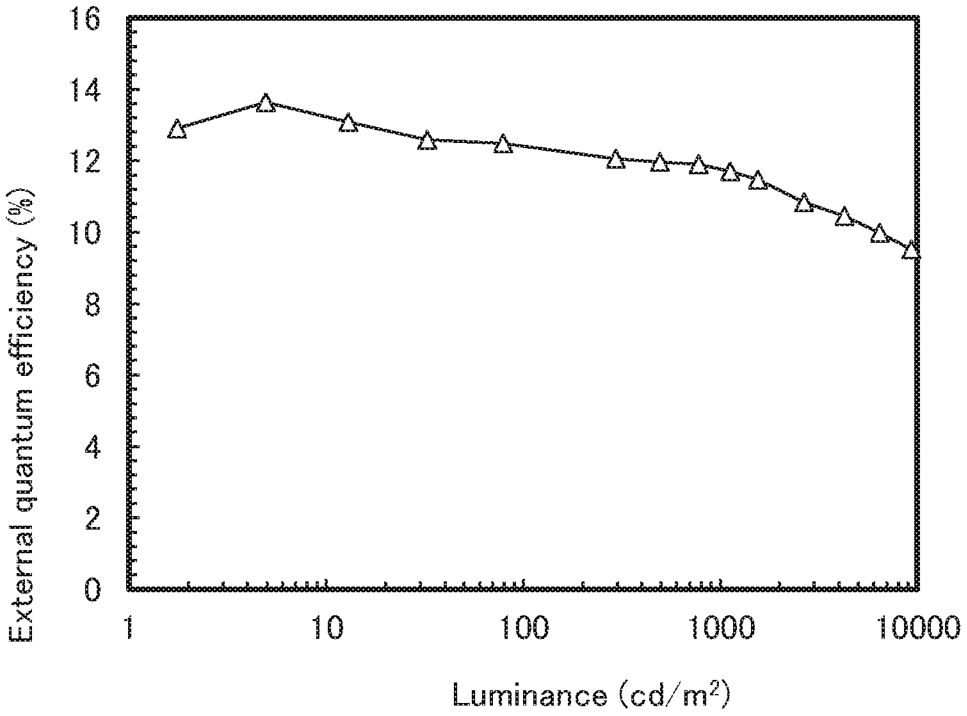
FIG. 51 shows the external quantum efficiency-luminance characteristics of a light-emitting device 10.
Figure 52:
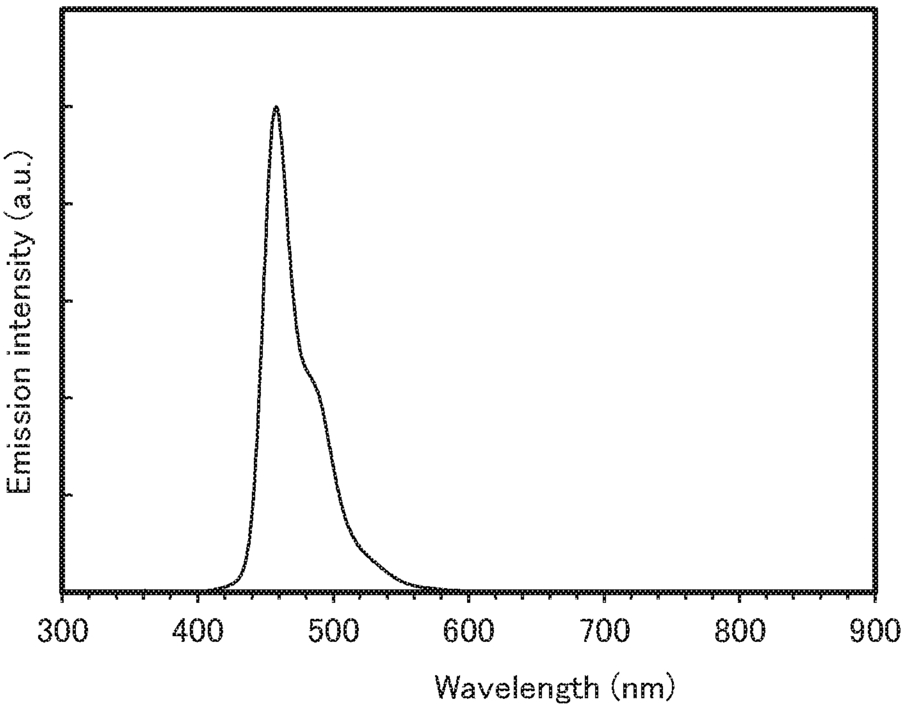
FIG. 52 shows the emission spectrum of a light-emitting device 10.

FIG. 47 shows the luminance-current density characteristics of the light-emitting device 10. FIG. 48 shows the current efficiency-luminance characteristics thereof. FIG. 49 shows the luminance-voltage characteristics thereof. FIG. 50 shows the current-voltage characteristics thereof. FIG. 51 shows the external quantum efficiency-luminance characteristics thereof. FIG. 52 shows the emission spectra thereof. Table 15 shows the main characteristics of the light-emitting device at a luminance of about 1000 cd/m$^2$.

TABLE 15

| | Voltage (V) | Current (mA) | Current density ($mA/cm^2$) | Chromaticity x | Chromaticity y | Current efficiency (cd/A) | External quantum efficiency (%) |
|---|---|---|---|---|---|---|---|
| Light-emitting device 10 | 3.9 | 0.41 | 10.3 | 0.14 | 0.11 | 10.9 | 11.7 |

FIGS. 47 to 52 and Table 15 show that the light-emitting device 10 of one embodiment of the present invention is a blue-light-emitting device with favorable characteristics.

Figure 53:
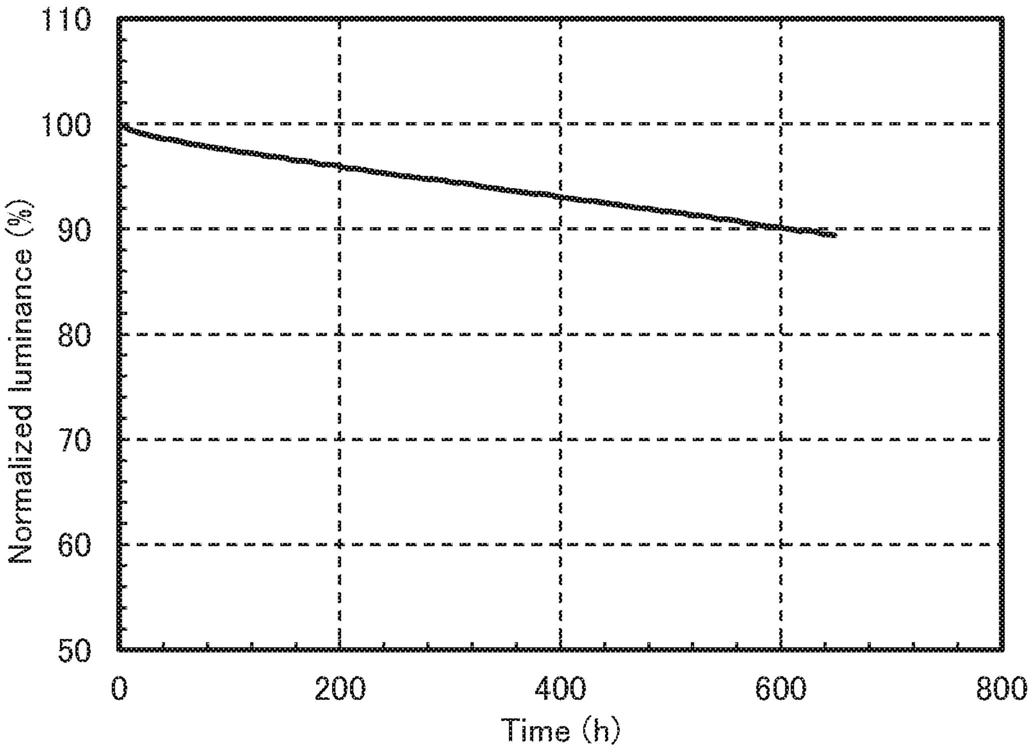
FIG. 53 shows the time dependence of normalized luminance of a light-emitting device 10.

FIG. 53 is a graph showing luminance changes with respect to driving time at the current density of 50 mA/cm$^2$. As shown in FIG. 53, the light-emitting device 10 of one embodiment of the present invention kept approximately 90% of the initial luminance when 600 hours have passed, and thus was found to be a long-lifetime light-emitting device with a small reduction in luminance over driving time.

Example 6

In this example, a light-emitting device 11 of one embodiment of the present invention is described. Structural formulae of organic compounds used for the light-emitting device 11 are shown below.

[Chemical Formula 8]
(i)
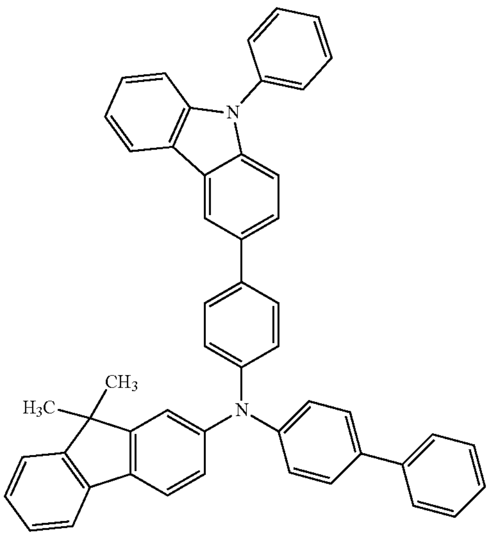
PCBBiF
(ii)
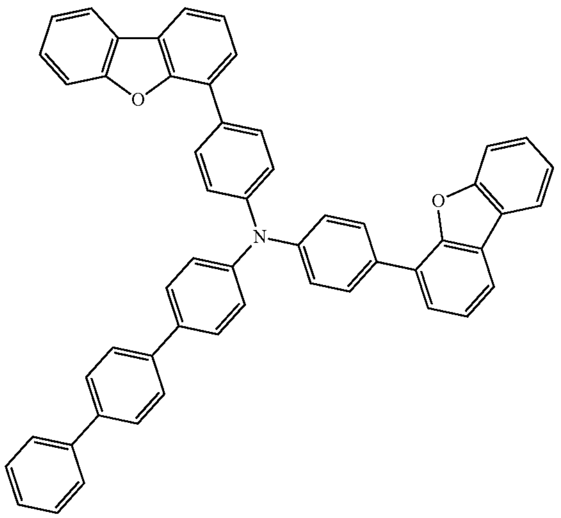
DBfBB1TP
(iii)
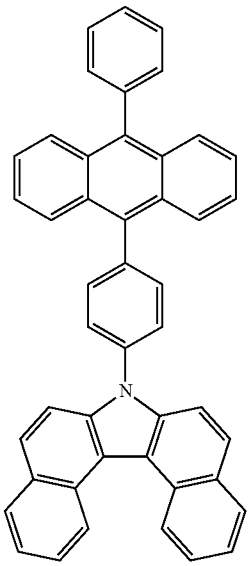
cgDBCzPA
(v)
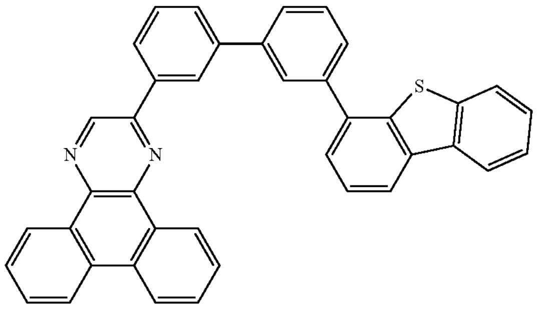
2mDBTBPDBq-II
(vi)
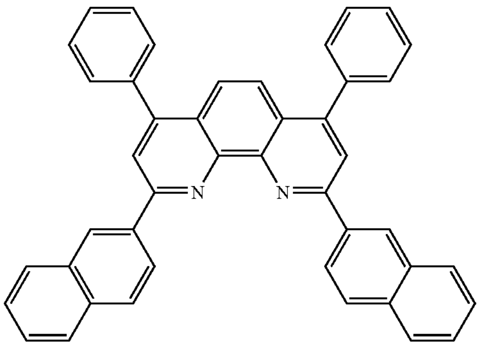
NBPhen -continued (x)

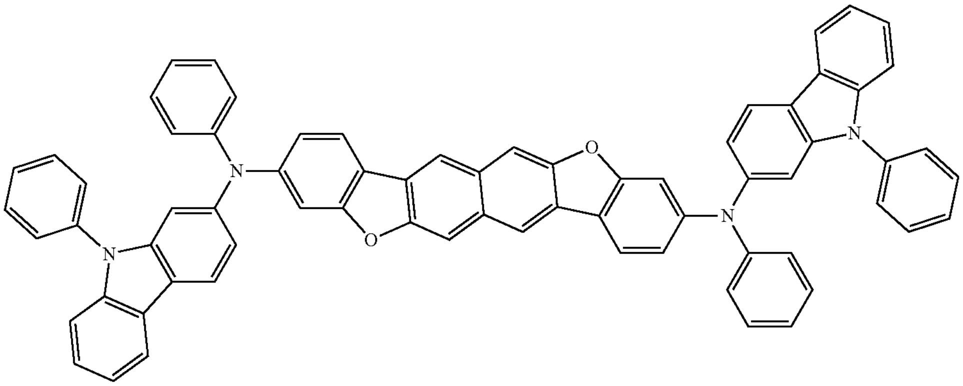

3,10PCA2Nbf(IV)-02

(Method for Fabricating Light-Emitting Device 11)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (i) and NDP-9 (produced by Analysis Atelier Corporation, material serial No. 1S20170124) were deposited on the anode 101 to a thickness of 10 nm by co-evaporation using a resistance-heating method such that the weight ratio of PCBBiF to NDP-9 was 1:0.1, whereby the hole-injection layer 111 was formed.

Subsequently, over the hole-injection layer 111, PCBBiF was deposited to a thickness of 20 nm by evaporation as the first hole-transport layer 112-1, and then N,N-bis[4-(dibenzofuran-4-yl)phenyl]-4-amino-p-terphenyl (abbreviation: DBfBB1TP) represented by the structural formula (ii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 7-[4-(10-phenyl-9-anthryl)phenyl]-7H-dibenzo[c,g]carbazole (abbreviation: cgDBCzPA) represented by the structural formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of cgDBCzPA to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 11 of this example was fabricated.

The structure of the light-emitting device 11 is listed in the following table.

TABLE 16

| | Hole-injection layer | Hole-transport layer 1 | Hole-transport layer 2 | Light-emitting layer | Electron-transport layer | Electron-transport layer | Electron-injection layer |
|---|---|---|---|---|---|---|---|
| | 10 nm | 20 nm | 10 nm | 25 nm | 15 nm | 10 nm | 1 nm |
| Light-emitting device 11 | PCBBiF:NDP-9 (1:0.1) | PCBBiF | DBfBB1TP | cgDBCzPA:3,10PCA2Nbf(IV)-02 (1:0.015) | 2mDBTBPDBq-II | NBPhen | LiF |

The HOMO levels, the LUMO levels, and the electron mobilities of the organic compounds used in this example are listed in the following table. The electron mobilities were measured when the square root of the electric field strength [V/cm] was 600.

TABLE 17

| | HOMO level (eV) | LUMO level (eV) | Electron mobility ($cm^2$/Vs) |
|---|---|---|---|
| PCBBiF | −5.36 | — | — |
| DBfBB1TP | −5.50 | — | — |
| cgDBCzPA | −5.69 | −2.74 | $7.7 \times 10^{-5}$ |
| 2mDBTBPDBq-II | — | −2.94 | $2.2 \times 10^{-5}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device 11 were measured. Note that the measurement was performed at room temperature.

Figure 54:
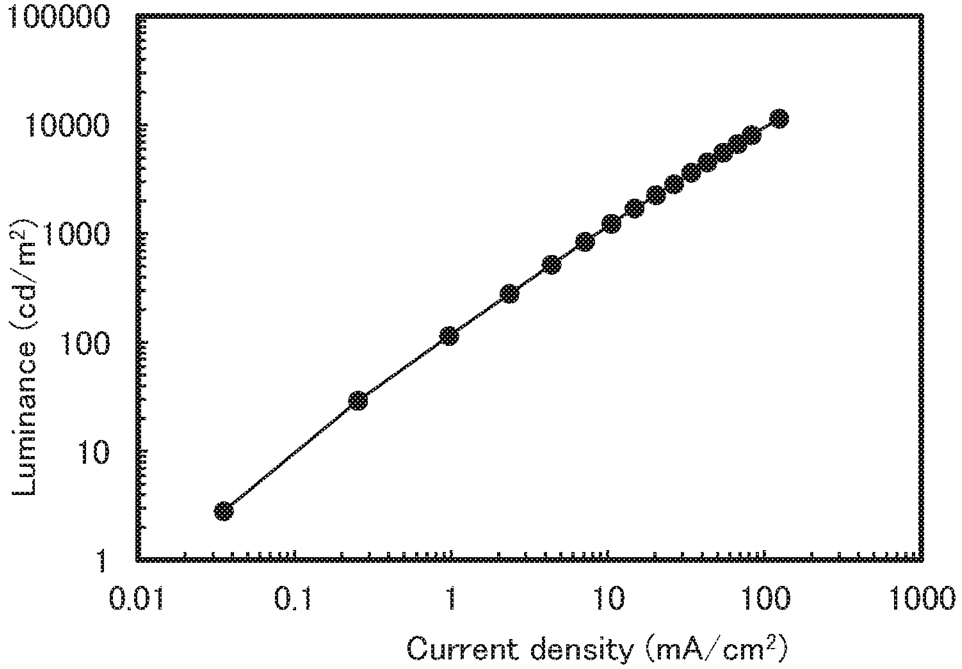
FIG. 54 shows the luminance-current density characteristics of a light-emitting device 11.
Figure 55:
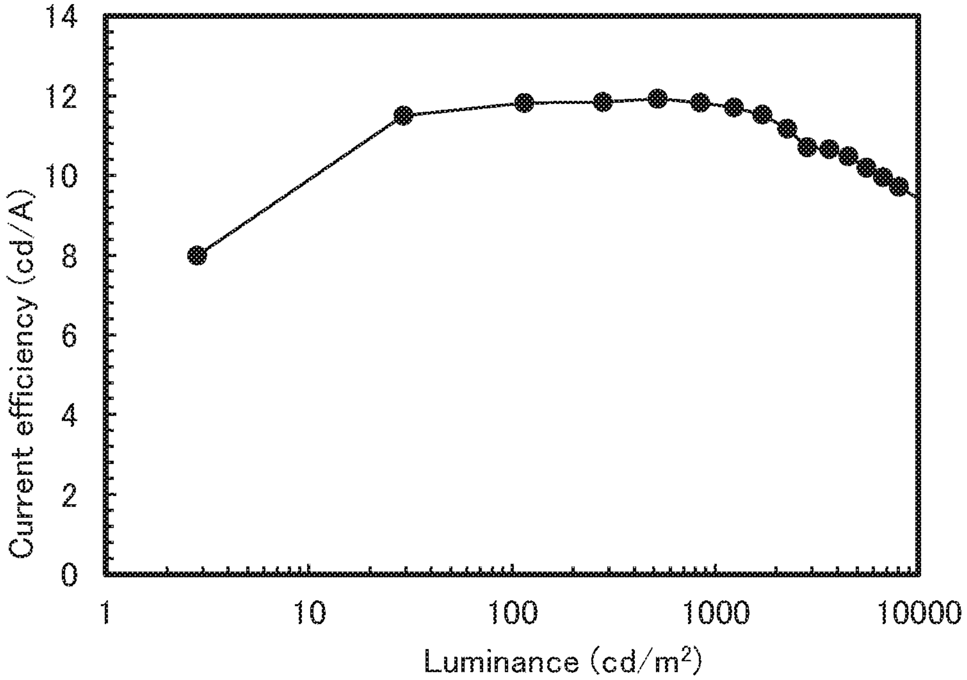
FIG. 55 shows the current efficiency-luminance characteristics of a light-emitting device 11.
Figure 56:
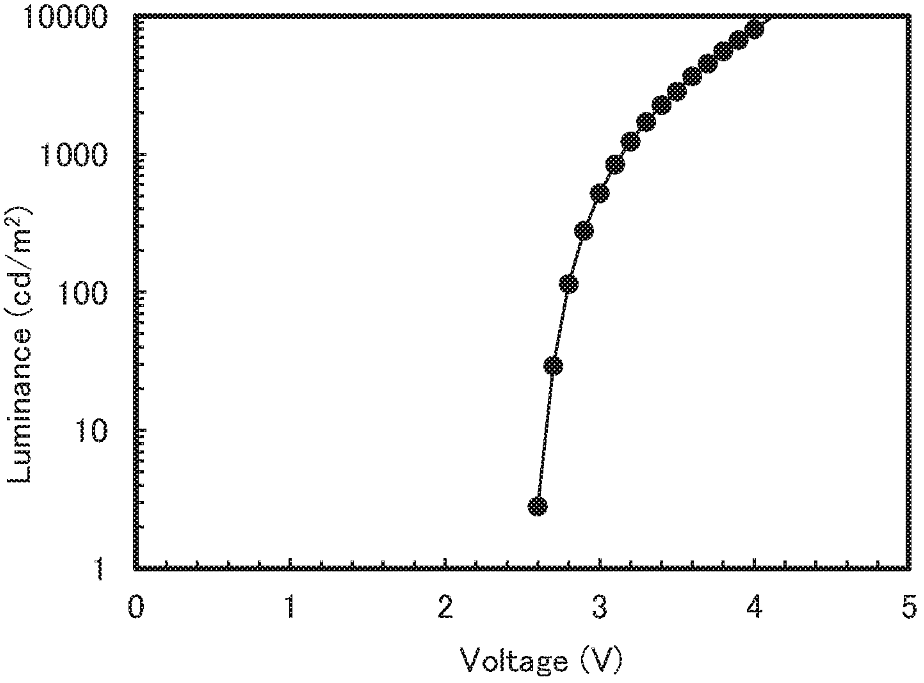
FIG. 56 shows the luminance-voltage characteristics of a light-emitting device 11.
Figure 57:
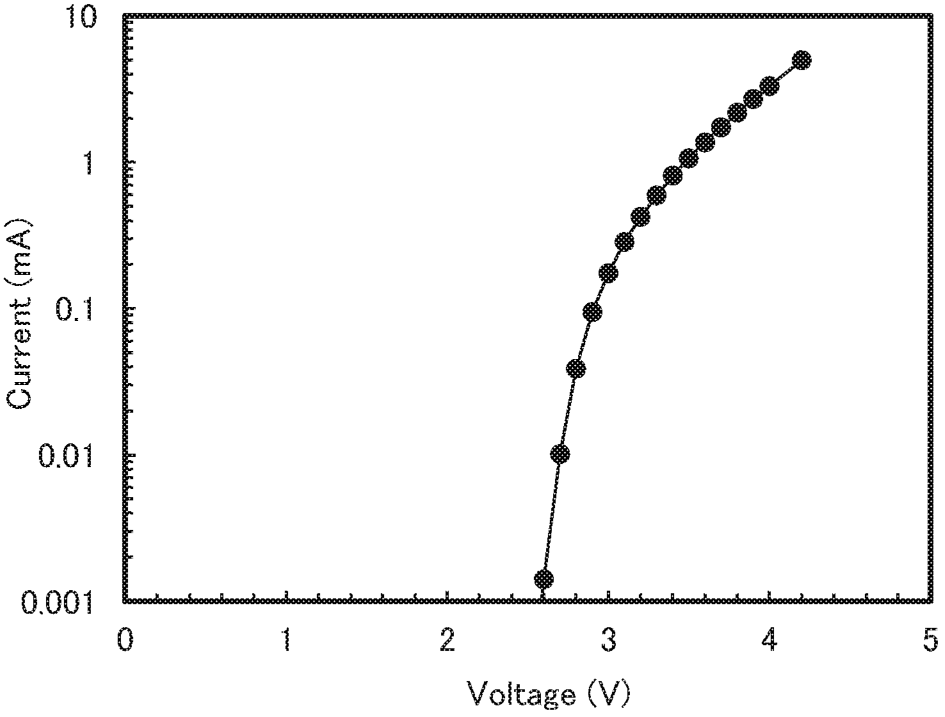
FIG. 57 shows the current-voltage characteristics of a light-emitting device 11.
Figure 58:
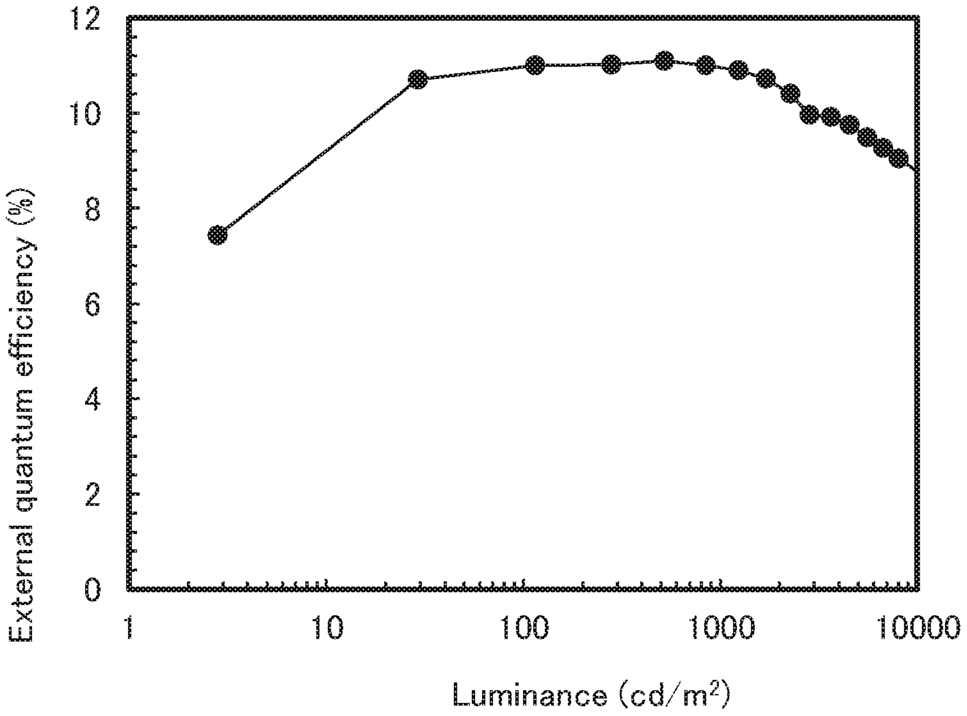
FIG. 58 shows the external quantum efficiency-luminance characteristics of a light-emitting device 11.
Figure 59:
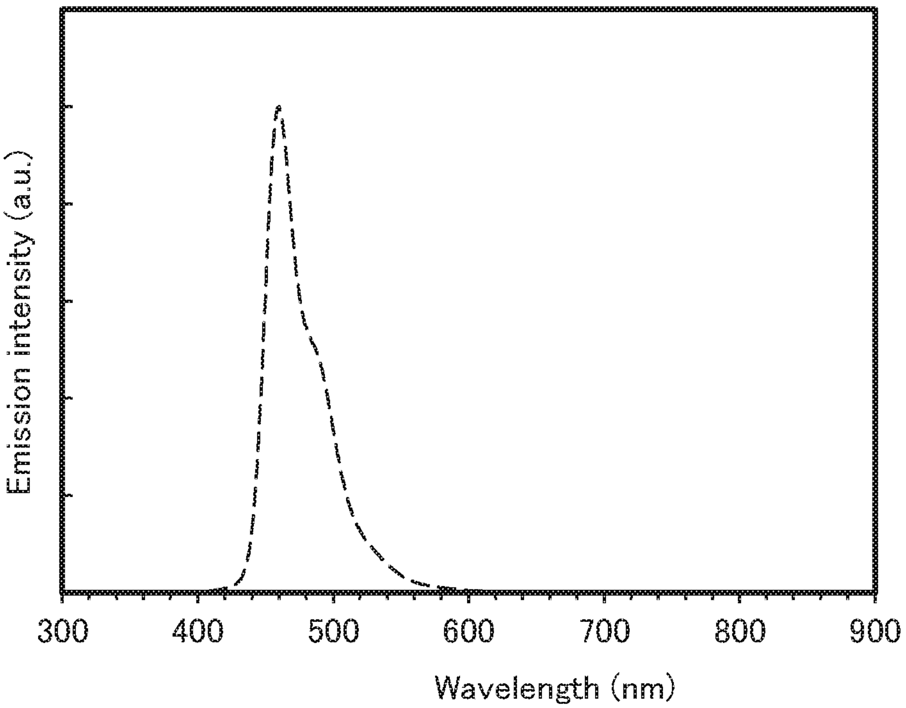
FIG. 59 shows the emission spectrum of a light-emitting device 11.

FIG. 54 shows the luminance-current density characteristics of the light-emitting device 11. FIG. 55 shows the current efficiency-luminance characteristics thereof. FIG. 56 shows the luminance-voltage characteristics thereof. FIG. 57 shows the current-voltage characteristics thereof. FIG. 58 shows the external quantum efficiency-luminance characteristics thereof. FIG. 59 shows the emission spectra thereof. Table 18 shows the main characteristics of the light-emitting device at a luminance of about 1000 cd/$m^2$.

TABLE 18

| | Voltage (V) | Current (mA) | Current density (mA/$cm^2$) | Chromaticity x | Chromaticity y | Current efficiency (cd/A) | External quantum efficiency (%) |
|---|---|---|---|---|---|---|---|
| Light-emitting device 11 | 3.1 | 0.29 | 7.1 | 0.14 | 0.14 | 11.8 | 11.0 |

FIGS. 54 to 59 and Table 18 show that the light-emitting device 11 of one embodiment of the present invention is a blue-light-emitting device with favorable characteristics.

Figure 60:
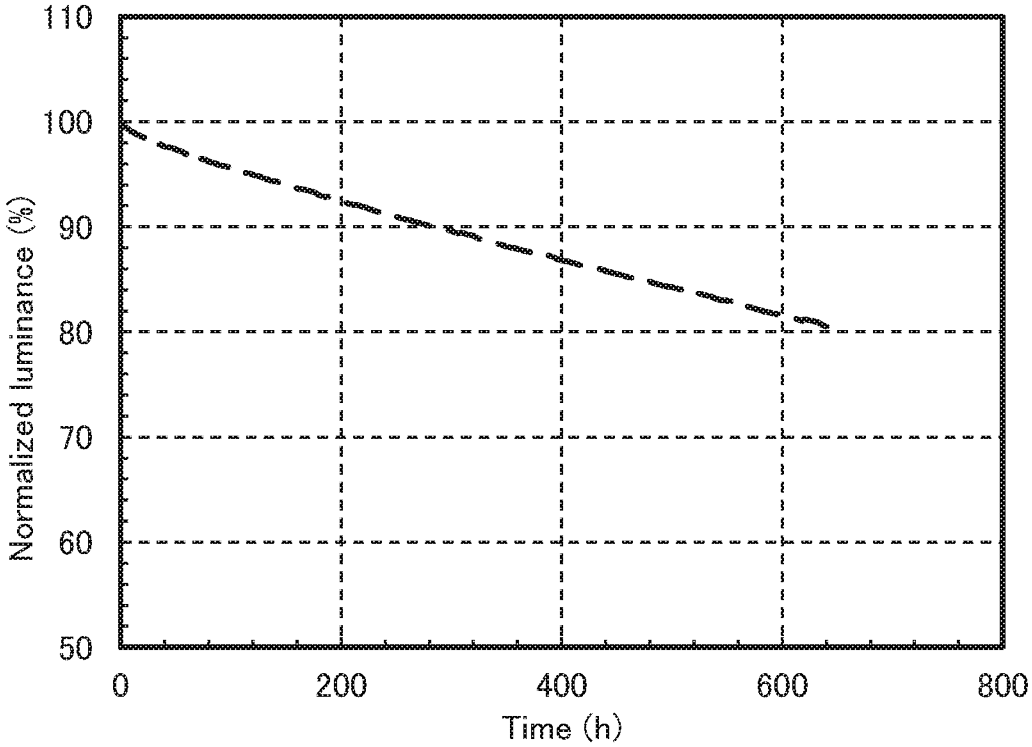
FIG. 60 shows the time dependence of normalized luminance of a light-emitting device 11.

FIG. 60 is a graph showing luminance changes with respect to driving time at the current density of 50 mA/$cm^2$. As shown in FIG. 60, the light-emitting device 11 of one embodiment of the present invention kept 80% or more of the initial luminance when 600 hours have passed, and thus was found to be a long-lifetime light-emitting device with a small reduction in luminance over driving time.

Example 7

In this example, a light-emitting device 12 of one embodiment of the present invention is described. Structural formulae of organic compounds used for the light-emitting device 12 are shown below.

[Chemical Formula 9]

(v)

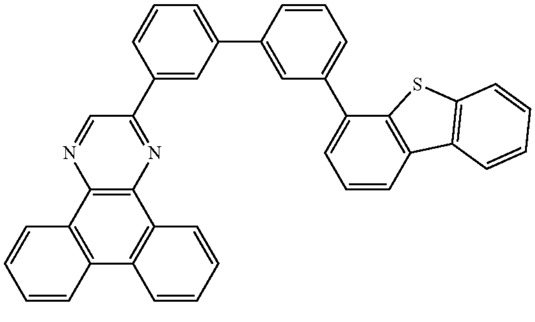

2mDBTBPDBq-II (vi)

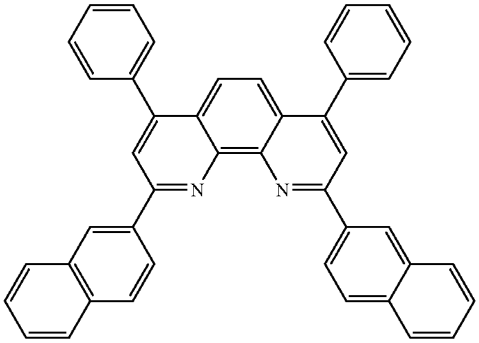

NBPhen

-continued
(vii)
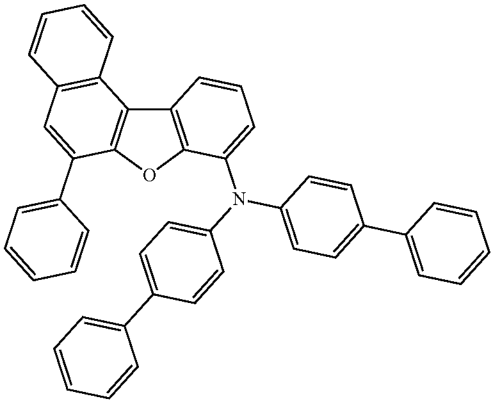
BBABnf
(viii)
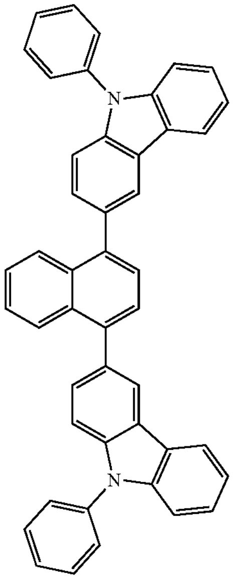
PCzN2
(ix)
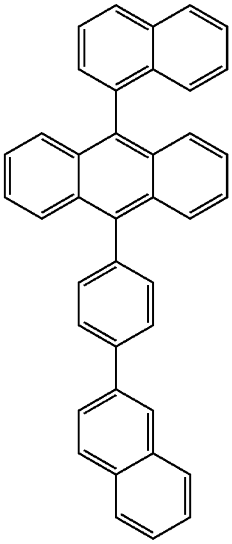
αN-βNPAnth
(x)
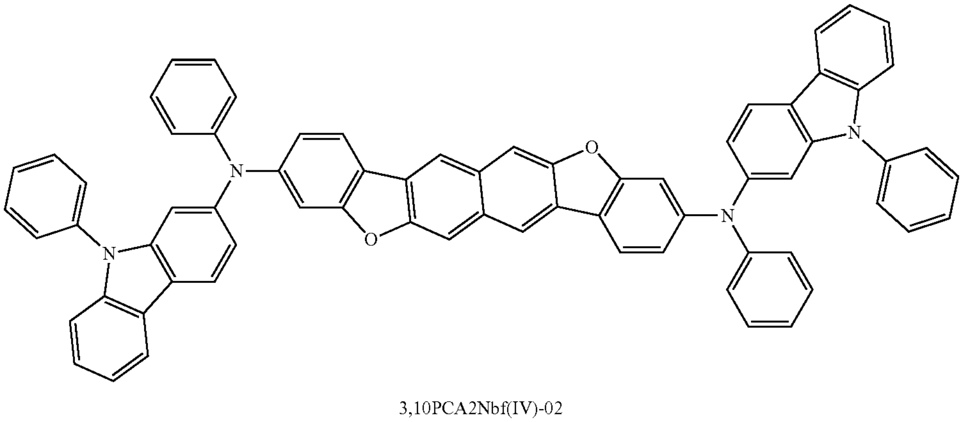
3,10PCA2Nbf(IV)-02

(Method for Fabricating Light-Emitting Device 12)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by the structural formula (vii) and NDP-9 (produced by Analysis Atelier Corporation, material serial No. 1S20170124) were deposited on the anode 101 to a thickness of 10 nm by co-evaporation using a resistance-heating method such that the weight ratio of BBABnf to NDP-9 was 1:0.1, whereby the hole-injection layer 111 was formed.

Subsequently, over the hole-injection layer 111, BBABnf was deposited to a thickness of 20 nm by evaporation as the first hole-transport layer 112-1, and then 3,3'-(naphthalene-1,4-diyl)bis(9-phenyl-9H-carbazole) (abbreviation: PCzN2) represented by the structural formula (viii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by the structural formula (ix) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of αN-βNPAnth to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, LiF was deposited to a thickness of 1 nm by evaporation to form the electron-injection layer 115. Then, aluminum was deposited to a thickness of 200 nm by evaporation to form the cathode 102. Thus, the light-emitting device 12 of this example was fabricated.

The structure of the light-emitting device 12 is listed in the following table.

TABLE 19

| | Hole-injection layer | Hole-transport layer | | Light-emitting layer | Electron-transport layer | | Electron-injection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting device 12 | BBABnf:NDP-9 (1:0.1) | BBABnf | PCzN2 | αN-βNPAnth:3,10PCA2Nbf(IV)-02 (1:0.015) | 2mDBTBPDBq-II | NBPhen | LiF |

The HOMO levels, the LUMO levels, and the electron mobilities of the organic compounds used in this example are listed in the following table. The electron mobilities were measured when the square root of the electric field strength [V/cm] was 600.

TABLE 20

| | HOMO level (eV) | LUMO level (eV) | Electron mobility ($cm^2/Vs$) |
|---|---|---|---|
| BBABnf | −5.56 | — | — |
| PCzN2 | −5.71 | — | — |
| αN-βNPAnth | −5.85 | −2.74 | — |
| 2mDBTBPDBq-II | — | −2.94 | $2.2 \times 10^{-5}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device 12 were measured. Note that the measurement was performed at room temperature.

Figure 61:
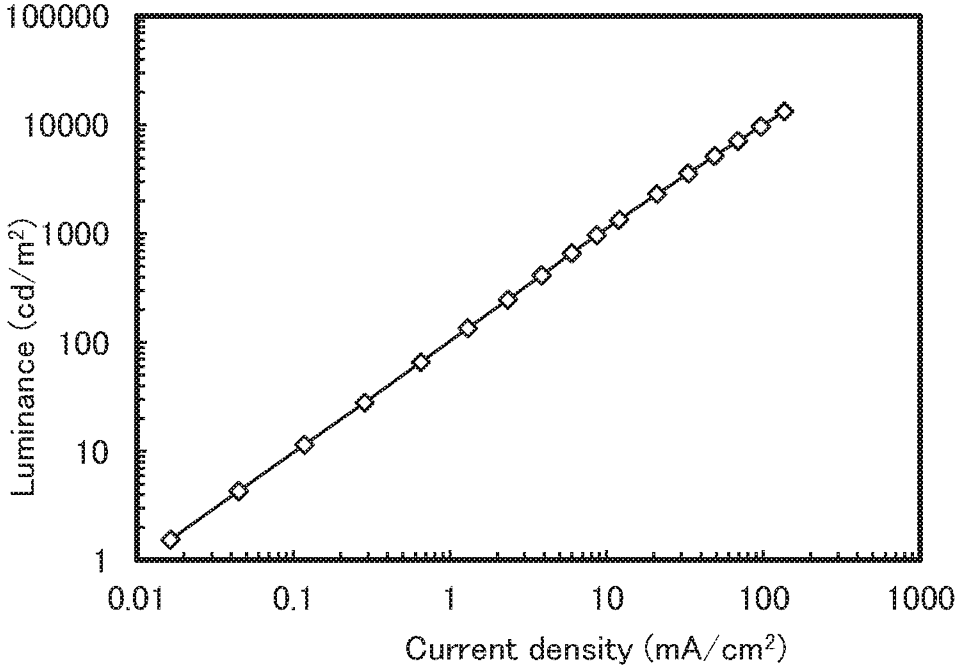
FIG. 61 shows the luminance-current density characteristics of a light-emitting device 12.
Figure 62:
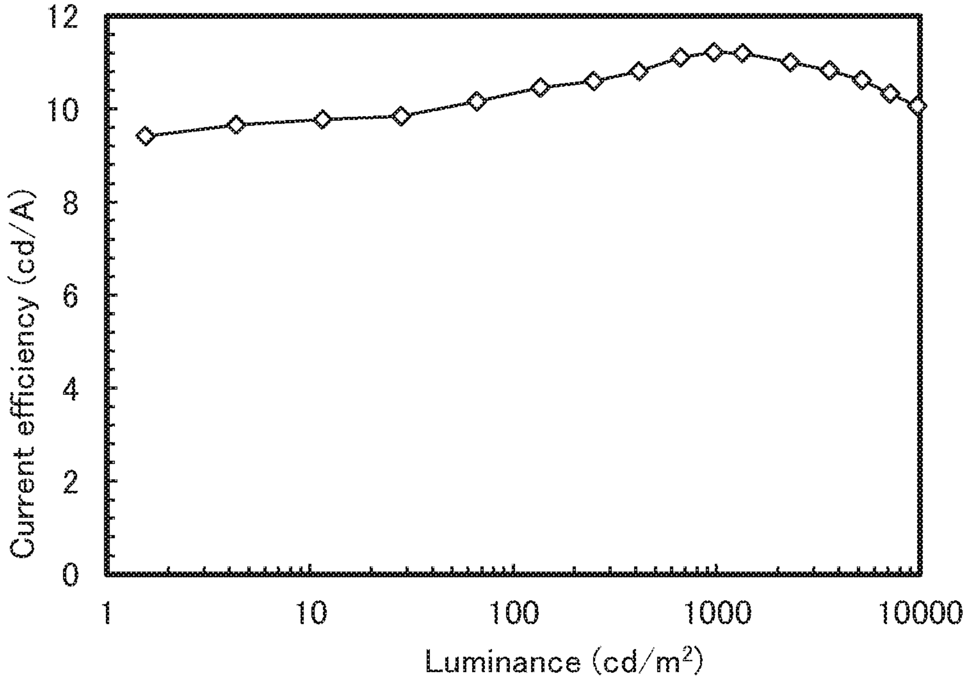
FIG. 62 shows the current efficiency-luminance characteristics of a light-emitting device 12.
Figure 63:
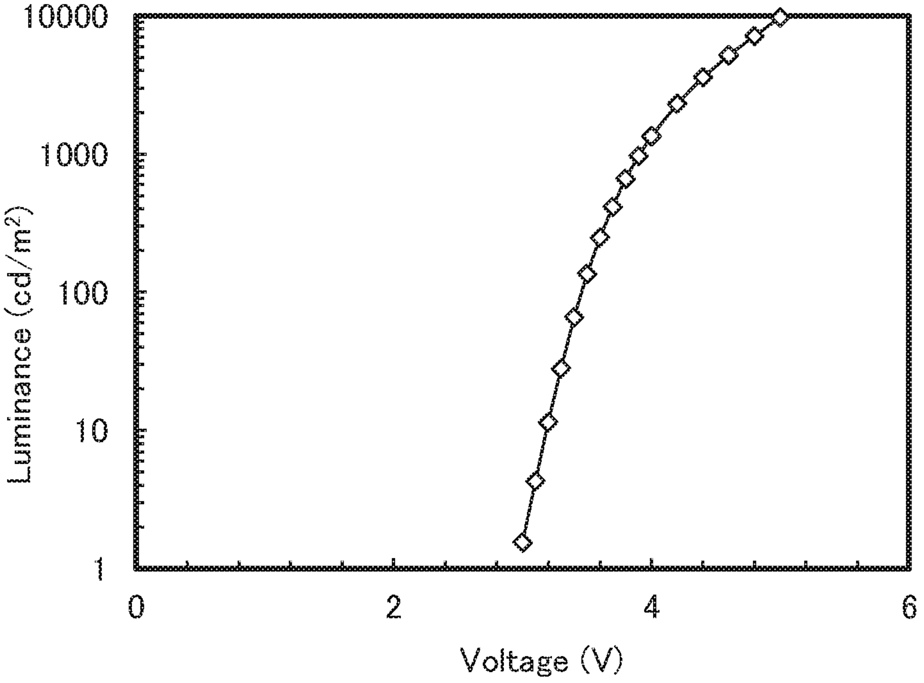
FIG. 63 shows the luminance-voltage characteristics of a light-emitting device 12.
Figure 64:
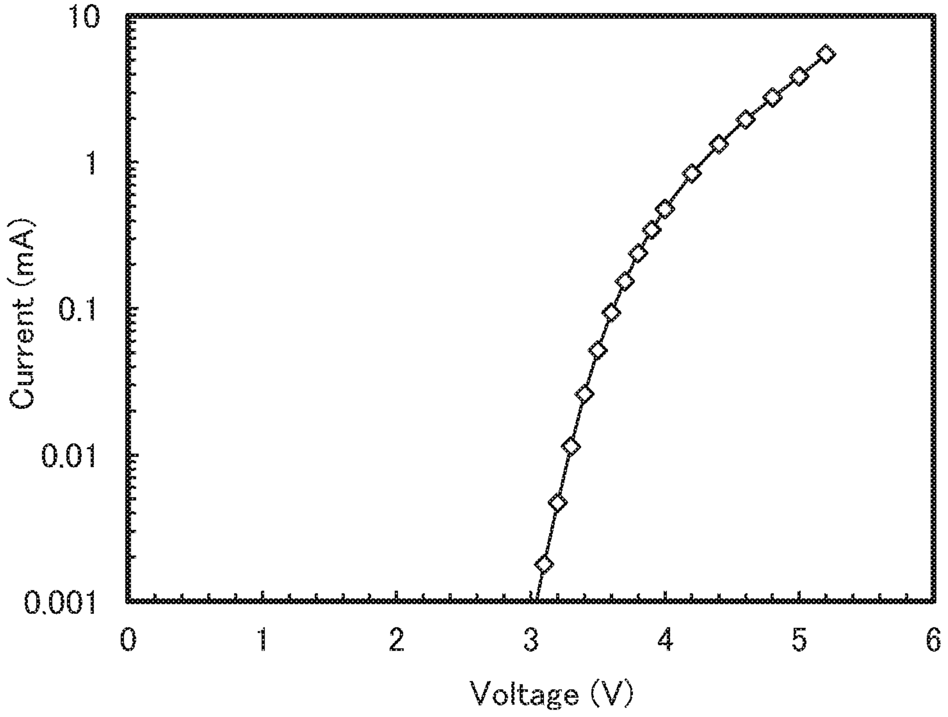
FIG. 64 shows the current-voltage characteristics of a light-emitting device 12.
Figure 65:
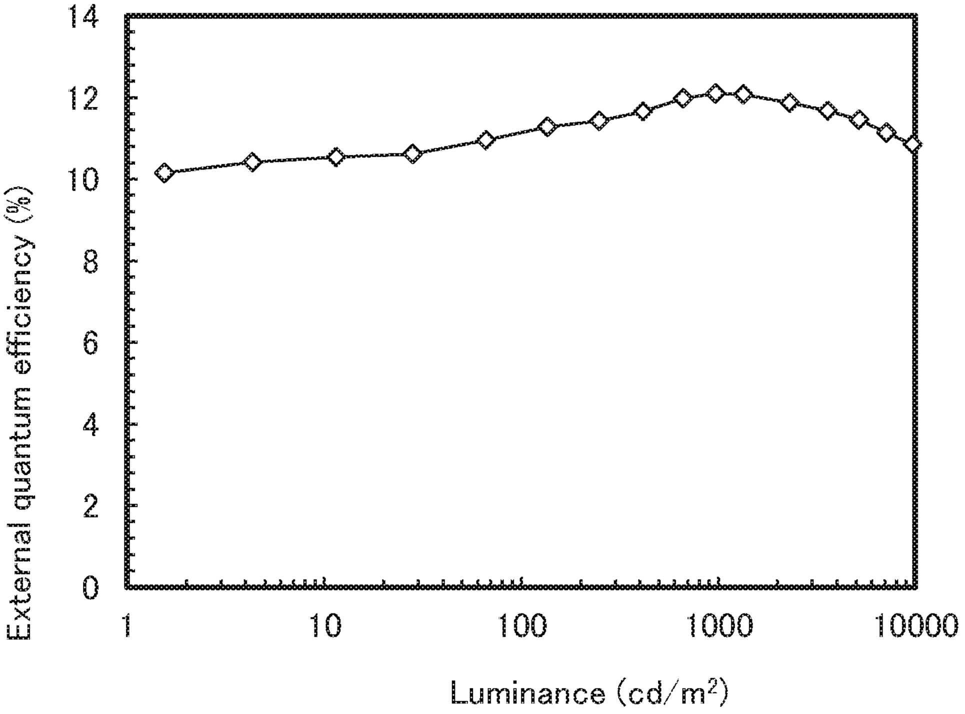
FIG. 65 shows the external quantum efficiency-luminance characteristics of a light-emitting device 12.
Figure 66:
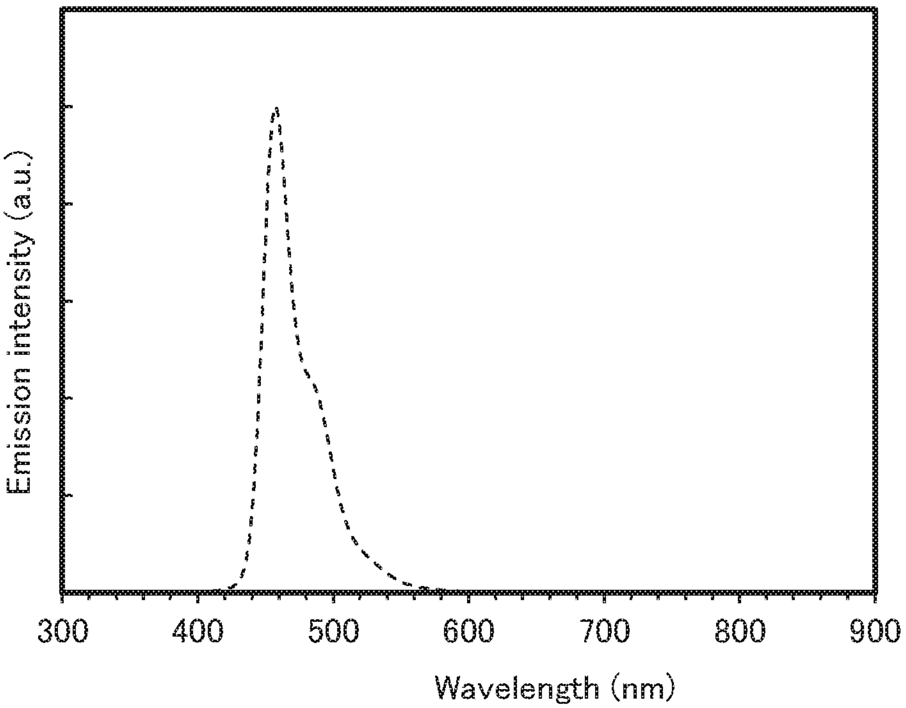
FIG. 66 shows the emission spectrum of a light-emitting device 12.

FIG. 61 shows the luminance-current density characteristics of the light-emitting device 12. FIG. 62 shows the current efficiency-luminance characteristics thereof. FIG. 63 shows the luminance-voltage characteristics thereof. FIG. 64 shows the current-voltage characteristics thereof. FIG. 65 shows the external quantum efficiency-luminance characteristics thereof. FIG. 66 shows the emission spectra thereof. Table 21 shows the main characteristics of the light-emitting device at a luminance of about 1000 $cd/m^2$.

TABLE 21

| | Voltage (V) | Current (mA) | Current density ($mA/cm^2$) | Chromaticity x | Chromaticity y | Current efficiency (cd/A) | External quantum efficiency (%) |
|---|---|---|---|---|---|---|---|
| Light-emitting device 12 | 3.9 | 0.35 | 8.6 | 0.14 | 0.11 | 11.2 | 12.1 |

FIGS. 61 to 66 and Table 21 show that the light-emitting device 12 of one embodiment of the present invention is a blue-light-emitting device with favorable characteristics.

Figure 67:
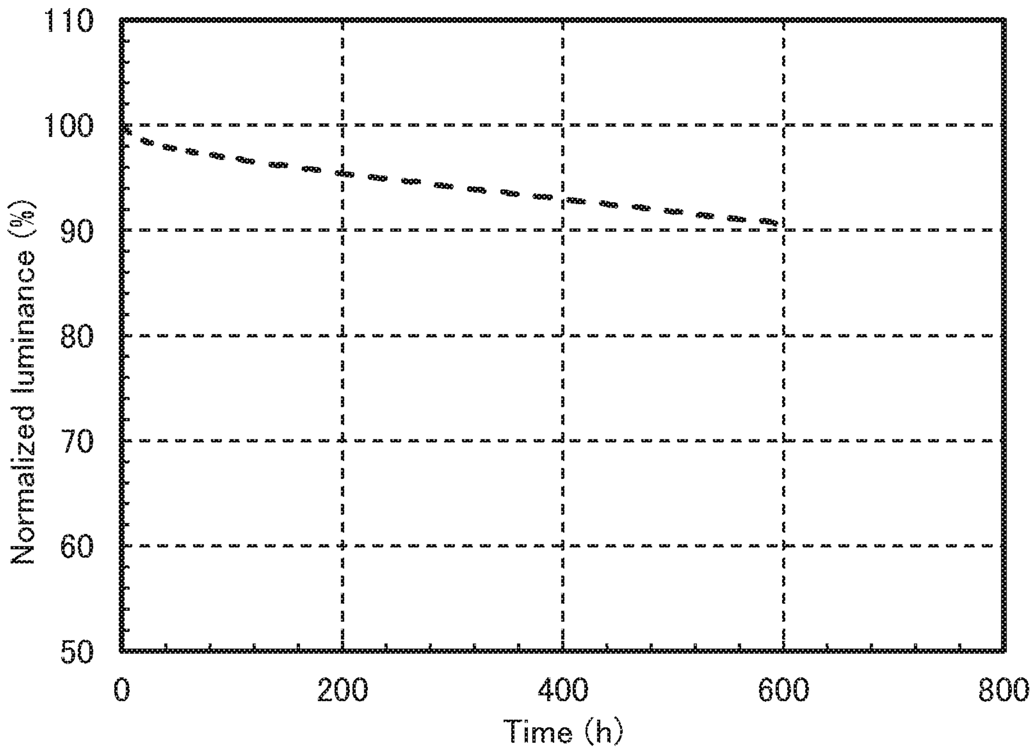
FIG. 67 shows the time dependence of normalized luminance of a light-emitting device 12.

FIG. 67 is a graph showing luminance changes with respect to driving time at the current density of 50 $mA/cm^2$. As shown in FIG. 67, the light-emitting device 12 of one embodiment of the present invention kept 90% or more of the initial luminance even when 600 hours have passed, and thus was found to be an extremely long-lifetime light-emitting device with a particularly small reduction in luminance over driving time.

Example 8

In this example, light-emitting devices 13 to 20 of one embodiment of the present invention are described. Structural formulae of organic compounds used for the light-emitting devices 13 to 20 are shown below.

[Chemical Formula 10]

(xii)

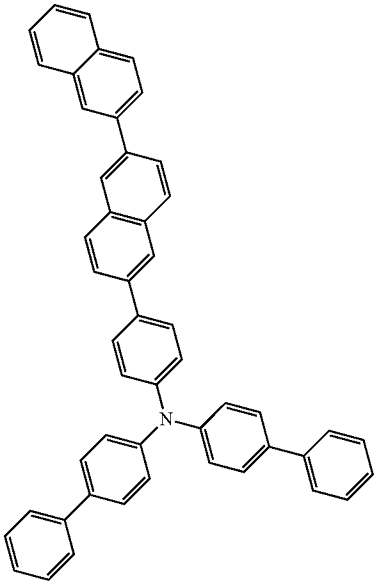

BBB(βN2)B (xiii)

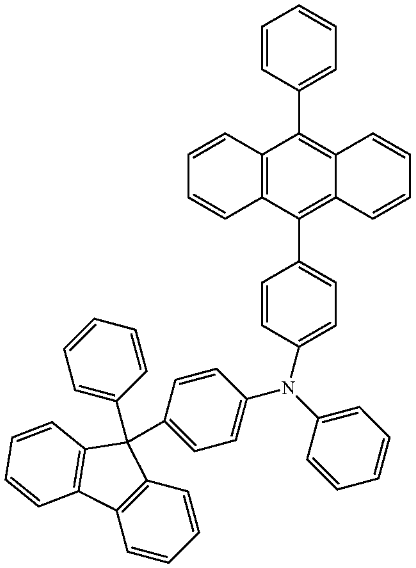

FLPAPA

-continued
(xiv)
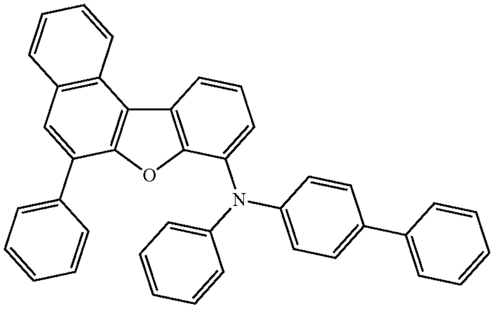
BnfABP
(xv)
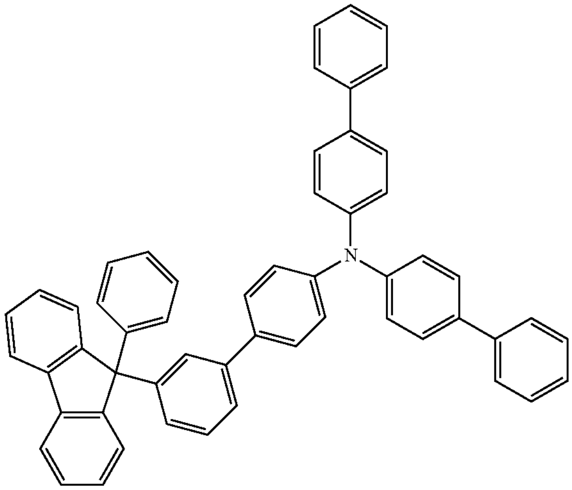
mpBBAFLBi
(xvi)
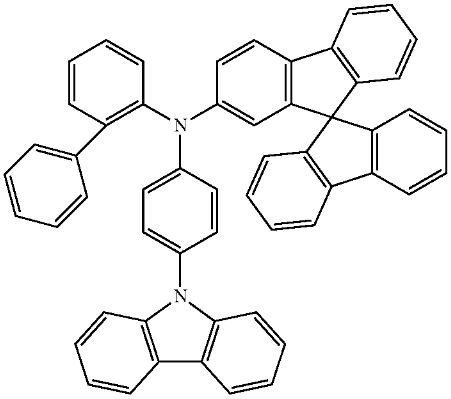
oYGBiSF
(xvii)
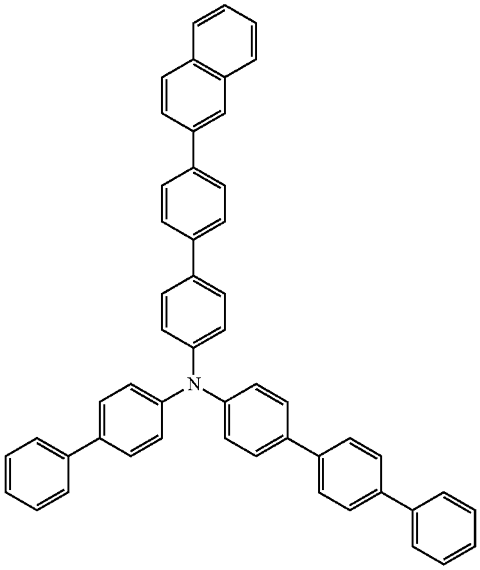
TPBiAβNBi -continued
(xviii)
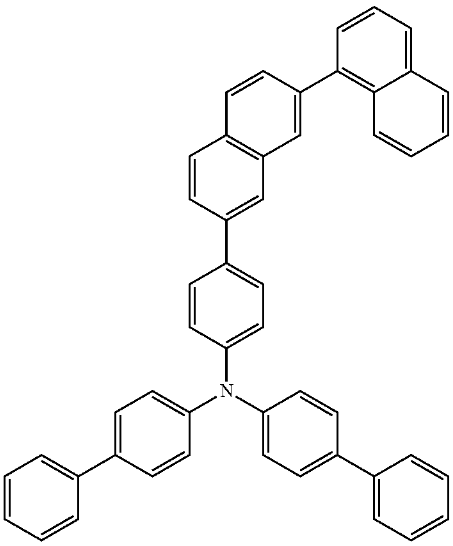
BBAαNβNB-03
(xix)
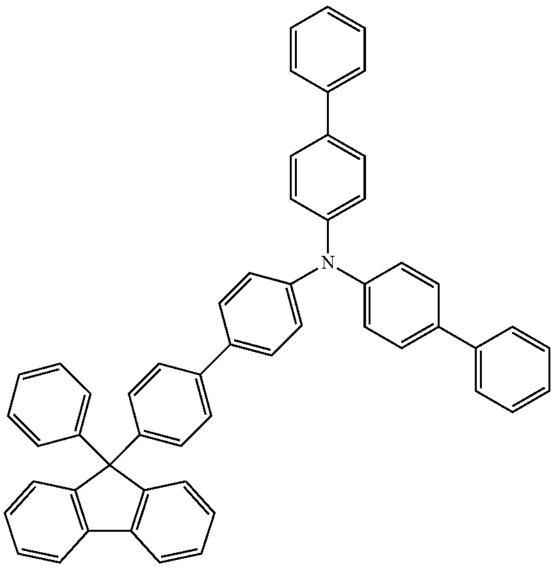
BBAFLBi
[Chemical Formula 11]
(v)
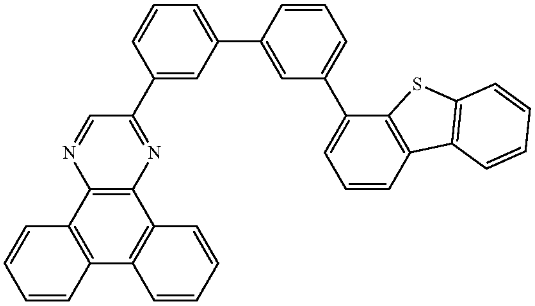
2mDBTBPDBq-II
(vi)
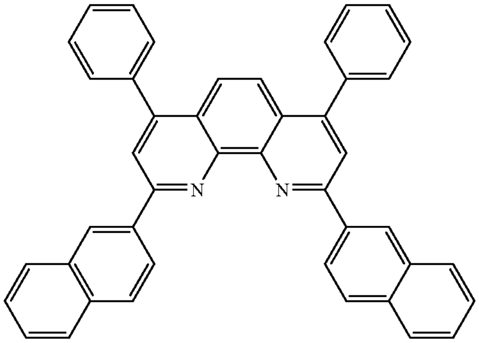
NBPhen -continued (viii)

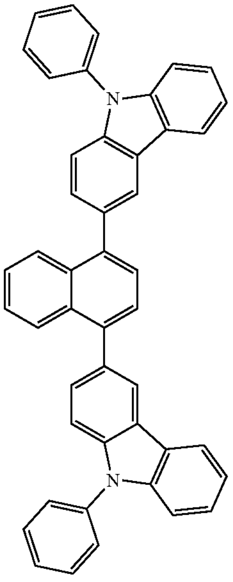

PCzN2

(ix)

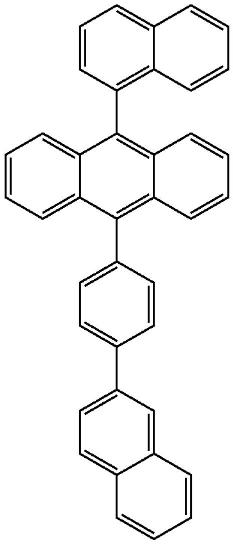

αN-βNPAnth (x)

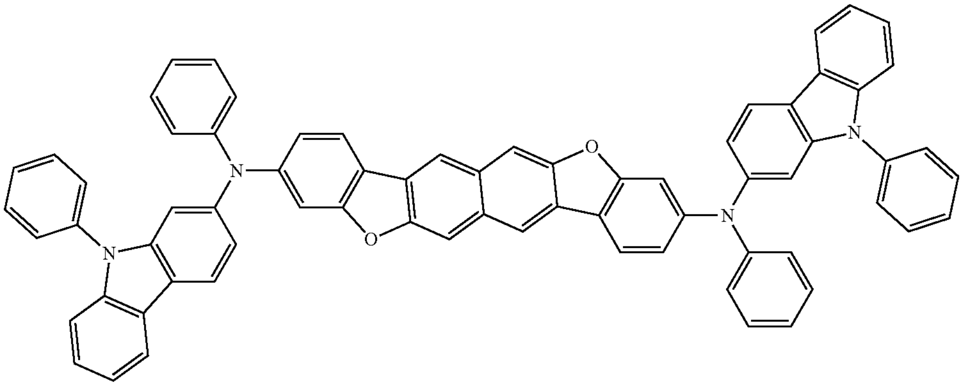

3,10PCA2Nbf(IV)-02

(Method for Fabricating Light-Emitting Device 13)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, 4-(6;2'-binaphthyl-2-yl)-4',4''-diphenyltriphenylamine (abbreviation: BBA(βN2)B) represented by the structural formula (xii) and NDP-9 (produced by Analysis Atelier Corporation, material serial No. 1S20170124) were deposited on the anode 101 to a thickness of 10 nm by co-evaporation using a resistance-heating method such that the weight ratio of BBA(βN2)B to NDP-9 was 1:0.1, whereby the hole-injection layer 111 was formed.

Subsequently, over the hole-injection layer 111, BBA(βN2)B was deposited to a thickness of 20 nm by evaporation as the first hole-transport layer 112-1, and then 3,3'-(naphthalene-1,4-diyl)bis(9-phenyl-9H-carbazole) (abbreviation: PCzN2) represented by the structural formula (viii) was deposited to a thickness of 10 nm by evaporation as the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by the structural formula (ix) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by the structural formula (x) were deposited to a thickness of 25 nm by co-evaporation such that the weight ratio of αN-βNPAnth to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by the structural formula (v) was deposited to a thickness of 15 nm by evaporation, and 2,9-bis(naphthalen-2-yl)-4,7-diphenyl-1,10-phenanthroline (abbreviation: NBPhen) represented by the structural formula (vi) was then deposited to a thickness of 10 nm by evaporation, whereby the electron-transport layer 114 was formed.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the cathode 102. Thus, the light-emitting device 13 of this example was fabricated.

(Method for Fabricating Light-Emitting Device 14)

The light-emitting device 14 was fabricated in the same manner as the light-emitting device 13 except that BBA(βN2)B of the light-emitting device 13 was replaced with 4-(10-phenyl-9-anthryl)-4'-(9-phenyl-9H-fluoren-9-yl)triphenylamine (abbreviation: FLPAPA) represented by the structural formula (xiii).

(Method for Fabricating Light-Emitting Device 15)

The light-emitting device 15 was fabricated in the same manner as the light-emitting device 13 except that BBA(βN2)B of the light-emitting device 13 was replaced with N-(4-biphenyl)-6,N-diphenylbenzo[b]naphtho[1,2-d]furan-8-amine (abbreviation: BnfABP) represented by the structural formula (xiv).

(Method for Fabricating Light-Emitting Device 16)

The light-emitting device 16 was fabricated in the same manner as the light-emitting device 13 except that BBA(βN2)B of the light-emitting device 13 was replaced with 4-[3-(9-phenyl-9H-fluoren-9-yl)phenyl]-4',4"-diphenyltriphenylamine (abbreviation: mpBBAFLBi) represented by the structural formula (xv).

(Method for Fabricating Light-Emitting Device 17)

The light-emitting device 17 was fabricated in the same manner as the light-emitting device 13 except that BBA(βN2)B of the light-emitting device 13 was replaced with N-[4-(9H-carbazol-9-yl)phenyl]-N-(1,1'-biphenyl-2-yl)-9,9'-spirobi[9H-fluoren]-2-amine (abbreviation: oYGBiSF) represented by the structural formula (xvi).

(Method for Fabricating Light-Emitting Device 18)

The light-emitting device 18 was fabricated in the same manner as the light-emitting device 13 except that BBA(βN2)B of the light-emitting device 13 was replaced with 4-(4-biphenylyl)-4'-[4-(2-naphthyl)phenyl]-4"-phenyltriphenylamine (abbreviation: TPBiAβNBi) represented by the structural formula (xvii).

(Method for Fabricating Light-Emitting Device 19)

The light-emitting device 19 was fabricated in the same manner as the light-emitting device 13 except that BBA(βN2)B of the light-emitting device 13 was replaced with 4,4'-diphenyl-4"-(7;1'-binaphthyl-2-yl)triphenylamine (abbreviation: BBAαNβNB-03) represented by the structural formula (xviii).

(Method for Fabricating Light-Emitting Device 20)

The light-emitting device 20 was fabricated in the same manner as the light-emitting device 13 except that BBA(βN2)B of the light-emitting device 13 was replaced with 4-[4-(9-phenyl-9H-fluoren-9-yl)phenyl]-4',4"-diphenyltriphenylamine (abbreviation: BBAFLBi) represented by the structural formula (xix).

The structures of the light-emitting devices 13 to 20 are listed in the following table.

TABLE 22

| | Hole-injection layer | Hole-transport layer | | Light-emitting layer | Electron-transport layer | | Electron-iniection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting devices 13 to 20 | *1:NDP-9 (1:0.1) | *1 | PCzN2 | αN-βNPAnth:3,10PCA2Nbf(IV)-02 (1:0.015) | 2mDBTBPDBq-II | NBPhen | LiF |

*1 Light-emitting device 13: BBA(βN2)B
Light-emitting device 14: FLPAPA
Light-emitting device 15: BnfABP
Light-emitting device 16: mpBBAFLBi
Light-emitting device 17: oYGBiSF
Light-emitting device 18: TPBiAβNBi
Light-emitting device 19: BBAαNβNB-03
Light-emitting device 20: BBAFLBi The HOMO levels, the LUMO levels, and the electron mobilities of the organic compounds used in this example are listed in the following table. The electron mobilities were measured when the square root of the electric field strength [V/cm] was 600.

TABLE 23

| | HOMO level (eV) | LUMO level (eV) | Electron mobility ($cm^2/Vs$) |
|---|---|---|---|
| BBA(βN2)B | −5.47 | — | — |
| FLPAPA | −5.54 | — | — |
| BnfABP | −5.59 | — | — |
| mpBBAFLBi | −5.49 | — | — |
| oYGBiSF | −5.48 | — | — |
| TPBiAβNBi | −5.47 | — | — |
| BBAαNβNB-03 | −5.47 | — | — |
| BBAFLBi | −5.50 | — | — |
| PCzN2 | −5.71 | — | — |
| αN-βNPAnth | −5.85 | −2.74 | — |
| 2mDBTBPDBq-II | — | −2.94 | $2.2 \times 10^{-5}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 68:
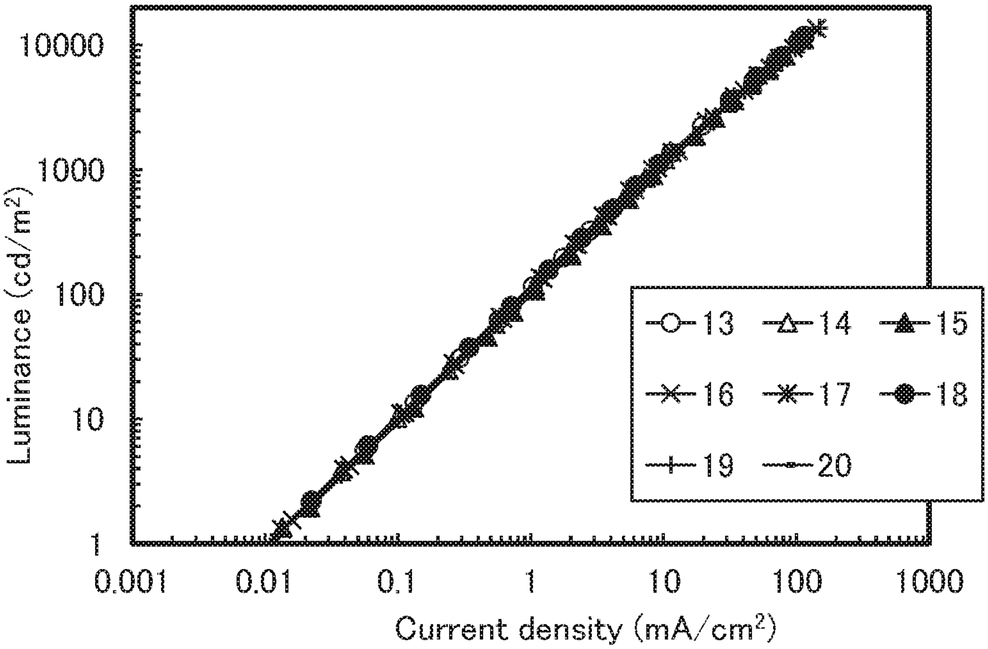
FIG. 68 shows the luminance-current density characteristics of light-emitting devices 13 to 20.
Figure 69:
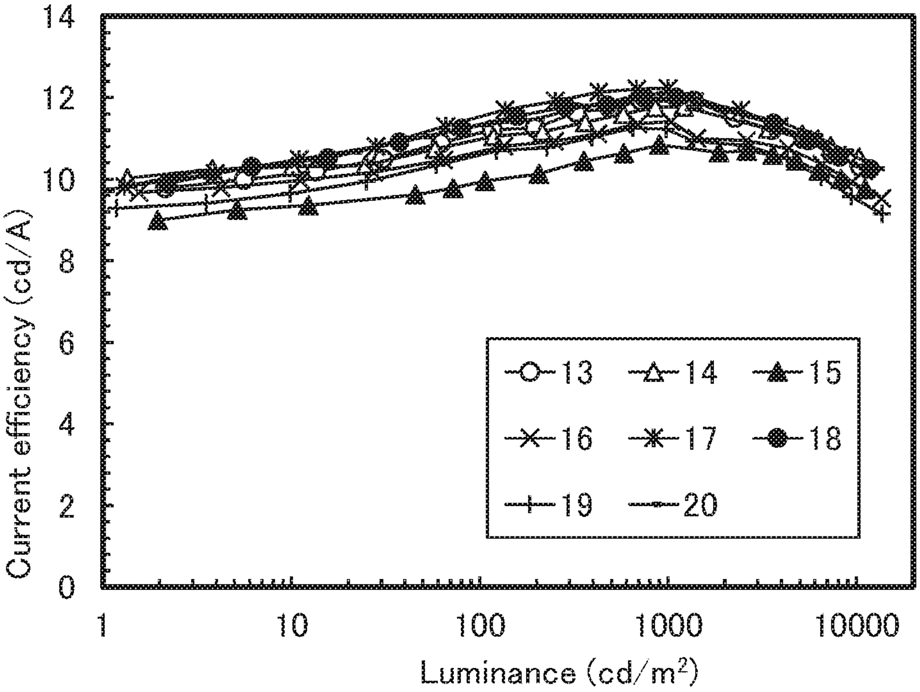
FIG. 69 shows the current efficiency-luminance characteristics of light-emitting devices 13 to 20.
Figure 70:
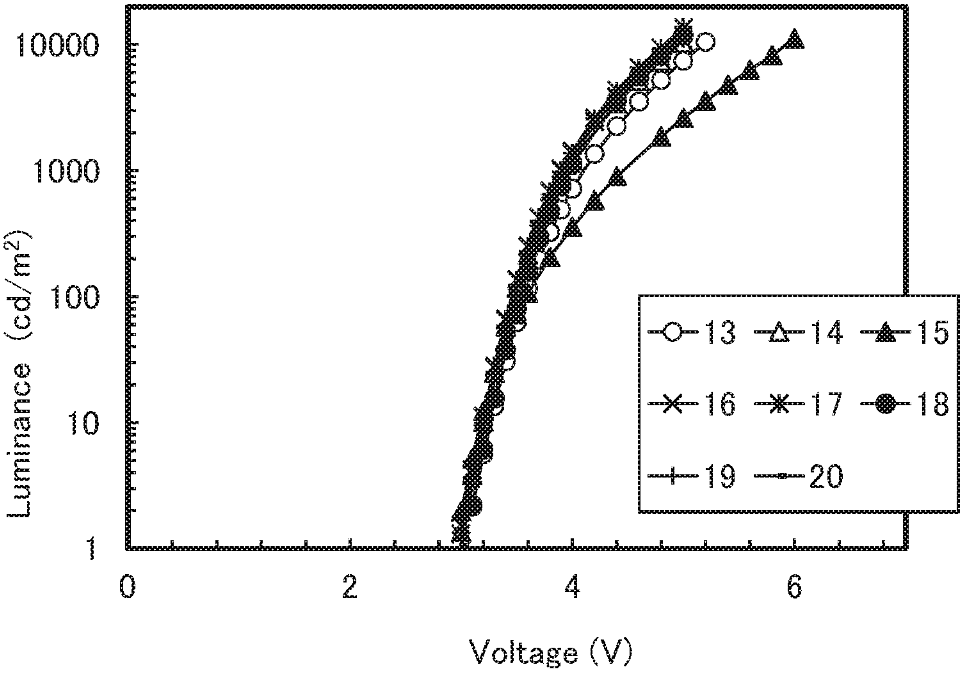
FIG. 70 shows the luminance-voltage characteristics of light-emitting devices 13 to 20.
Figure 71:
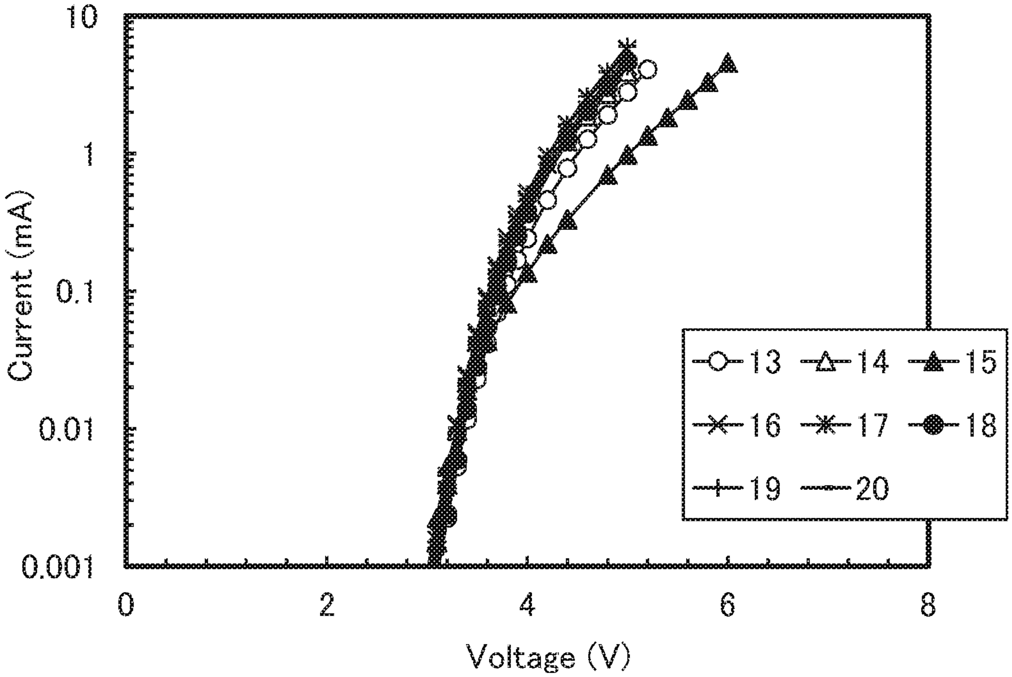
FIG. 71 shows the current-voltage characteristics of light-emitting devices 13 to 20.
Figure 72:
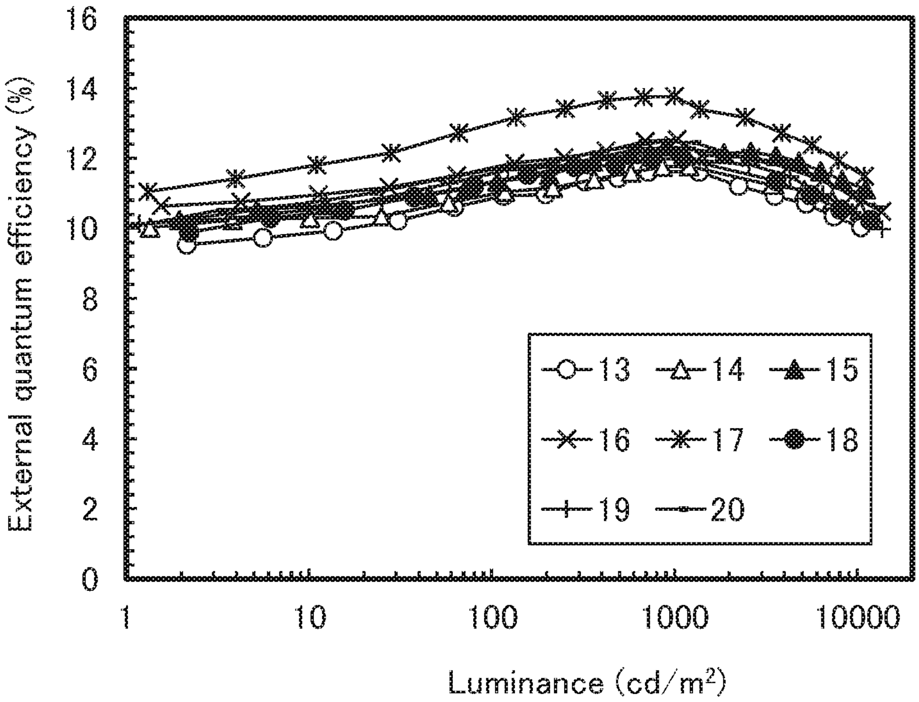
FIG. 72 shows the external quantum efficiency-luminance characteristics of light-emitting devices 13 to 20.
Figure 73:
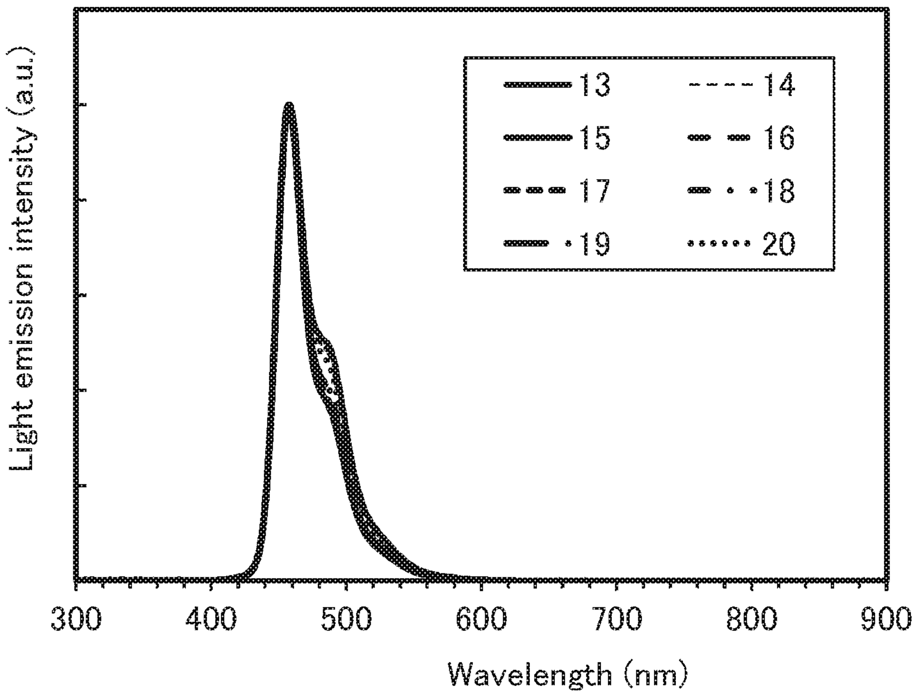
FIG. 73 shows the emission spectrum of light-emitting devices 13 to 20.

FIG. 68 shows the luminance-current density characteristics of the light-emitting devices 13 to 20. FIG. 69 shows the current efficiency-luminance characteristics thereof. FIG. 70 shows the luminance-voltage characteristics thereof. FIG. 71 shows the current-voltage characteristics thereof. FIG. 72 shows the external quantum efficiency-luminance characteristics thereof. FIG. 73 shows the emission spectra thereof. Table 24 shows the main characteristics of the light-emitting devices at a luminance of about 1000 cd/m$^2$. Note that the numbers of legends in graphs correspond to the number of the light-emitting devices.

TABLE 24

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 13 | 4.0 | 0.24 | 6.0 | 0.14 | 0.13 | 11.9 | 11.6 |
| Light-emitting device 14 | 3.9 | 0.29 | 7.3 | 0.14 | 0.13 | 11.8 | 11.8 |
| Light-emitting device 15 | 4.4 | 0.33 | 8.3 | 0.14 | 0.10 | 10.8 | 12.3 |
| Light-emitting device 16 | 3.9 | 0.36 | 9.0 | 0.14 | 0.11 | 11.4 | 12.5 |
| Light-emitting device 17 | 3.9 | 0.33 | 8.2 | 0.14 | 0.10 | 12.2 | 13.8 |
| Light-emitting device 18 | 4.0 | 0.37 | 9.2 | 0.14 | 0.13 | 12.0 | 12.0 |
| Light-emitting device 19 | 3.9 | 0.35 | 8.7 | 0.14 | 0.11 | 11.2 | 12.3 |
| Light-emitting device 20 | 3.9 | 0.29 | 7.3 | 0.14 | 0.12 | 12.1 | 12.5 |

FIGS. 68 to 73 and Table 24 show that the light-emitting devices 13 to 20 of one embodiment of the present invention are blue-light-emitting devices with favorable characteristics.

Figure 74:
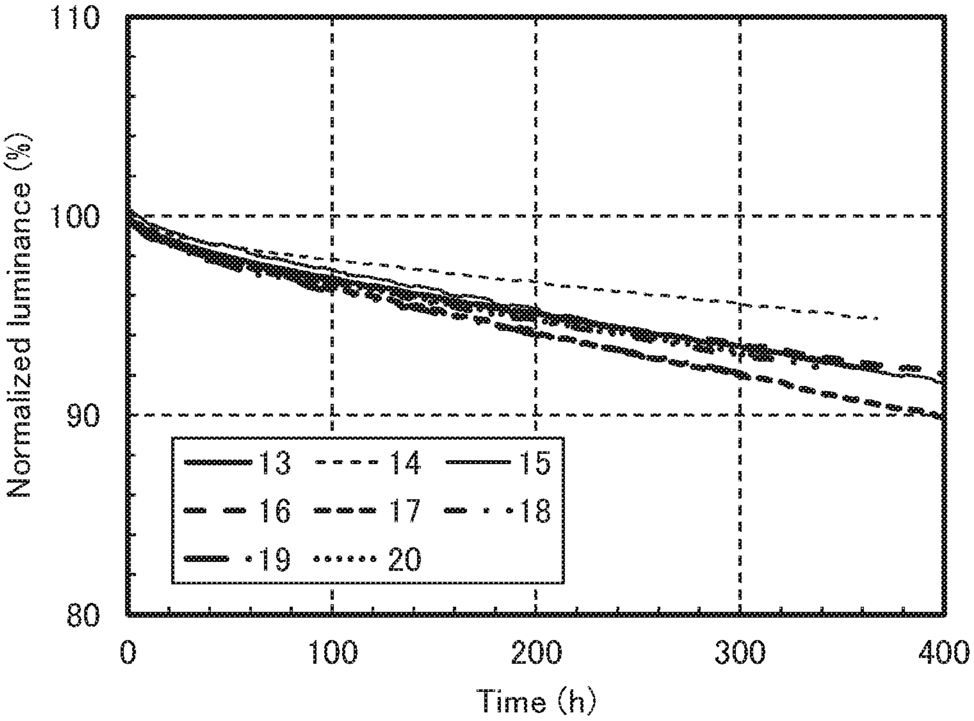
FIG. 74 shows the time dependence of normalized luminance of light-emitting devices 13 to 20.

FIG. 74 is a graph showing luminance changes with respect to driving time at the current density of 50 mA/cm$^2$. As shown in FIG. 74, the light-emitting devices 13 to 20 of one embodiment of the present invention kept 90% or more of the initial luminance after 300 hours. In particular, the light-emitting device 14 of one embodiment of the present invention kept 95% or more of the initial luminance when 300 hours have passed. The light-emitting devices 13 to 20 were found to be long-lifetime light-emitting devices with a small reduction in luminance over driving time.

Reference Example 1

In this reference example, methods for calculating the HOMO levels, the LUMO levels, and the electron mobilities of the organic compounds used in the examples are described.

The HOMO level and the LUMO level can be calculated through a cyclic voltammetry (CV) measurement.

An electrochemical analyzer (ALS model 600A or 600C, manufactured by BAS Inc.) was used as the measurement apparatus. A solution for the CV measurement was prepared in the following manner: tetra-n-butylammonium perchlorate (n-$Bu_4NClO_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an $Ag/Ag^+$ electrode (RE7 reference electrode for nonaqueous solvent, manufactured by BAS Inc.) was used as a reference electrode. Note that the measurement was conducted at room temperature (20° C. to 25° C.). In addition, the scan speed in the CV measurement was fixed to 0.1 V/sec, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy (IS) method.

As a method for measuring the carrier mobility of an EL material, a time-of-flight (TOF) method, a method using I-V characteristics of a space-charge-limited current (SCLC), or the like has been known for a long time. The TOF method needs a sample with a much larger thickness than that of an actual organic EL element. The SCLC method has a disadvantage in that electric field strength dependence of carrier mobility cannot be obtained, for example. Since an organic film required for the measurement employing the IS method is thin (approximately several tens of nanometers), the organic film can be formed of a relatively small amount of EL materials, whereby the mobility can be measured with a thickness close to the thickness of a film in an actual EL element. In this method, the electric field strength dependence of the carrier mobility can also be measured.

In the IS method, a micro sinusoidal voltage signal ($V=V_0[\exp(j\omega t)]$) is applied to an EL element, and the impedance of the EL element is obtained from a phase difference between the current amplitude of a response current signal ($I=I_0 \exp[j(\omega t+\phi)]$) and the input signal. By applying the voltage to the EL element while whose frequency is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (1).

[Formula 1]

$$Y = \frac{1}{Z} = G + jB \qquad (1)$$

In addition, by a single injection model, calculation of the following formulae (2) and (3) can be performed. Here, g in the formula (4) is differential conductance. In the formula, C represents capacitance, θ represents a transit angle (ωt), ω represents angular frequency, and t represents transit time. For the analysis, the current equation, the Poisson equation, and the current continuity equation are used and a diffusion current and a trap state are ignored.

[Formula 2]

$$G = \frac{g\theta^3}{b}\frac{\theta - \sin\theta}{(\theta - \sin\theta)^2 + \left(\frac{\theta^2}{2} + \cos\theta - 1\right)^2} \quad (2)$$

$$B = \omega C = \frac{g\theta^3}{b}\frac{\frac{\theta^2}{2} + \cos\theta - 1}{(\theta - \sin\theta)^2 + \left(\frac{\theta^2}{2} + \cos\theta - 1\right)} \quad (3)$$

$$g = \frac{9}{4}\varepsilon\mu\frac{V_0}{d^3} \quad (4)$$

A method for calculating carrier mobility from the frequency characteristics of capacitance is a −ΔB method. A method for calculating carrier mobility from the frequency characteristics of conductance is a ωΔG method.

Figure 42:
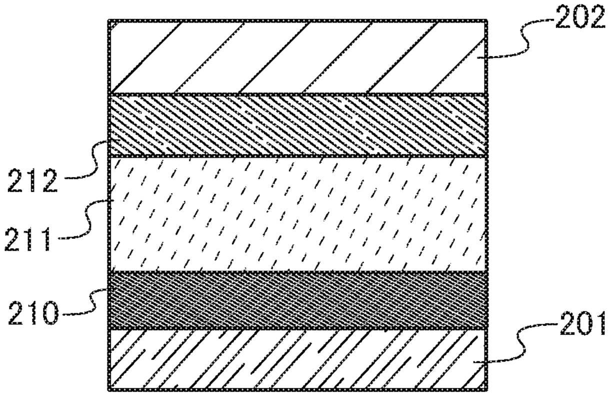
FIG. 42 illustrates a structure of an electron-only element.

In practice, first, an electron-only element is fabricated using a material whose electron mobility is intended to be calculated. The electron-only element is an element designed such that only electrons flow therein as carriers. In this specification, a method for calculating electron mobility from the frequency characteristics of capacitance (the −ΔB method) is described. FIG. 42 is a schematic diagram of an electron-only element used for the measurement.

As illustrated in FIG. 42, the electron-only element in this example fabricated for the measurement includes a first layer 210, a second layer 211, and a third layer 212 between an anode 201 and a cathode 202. The material whose electron mobility is intended to be obtained is used as a material for the second layer 211. For explanation, an example in which the electron mobility of a film formed by co-evaporation of ZADN and Liq in a weight ratio of 1:1 is measured is given. A specific structure example is listed in the following table.

TABLE 25

| Anode | | | First layer | Second layer | Third layer | Cathode |
|---|---|---|---|---|---|---|
| 100 nm | 50 nm | 100 nm | 1 nm | 200 nm | 1 nm | 100 nm |
| APC | NITO | Al | Liq | ZADN:Liq (1:1) | Liq | Al |

Figure 43:
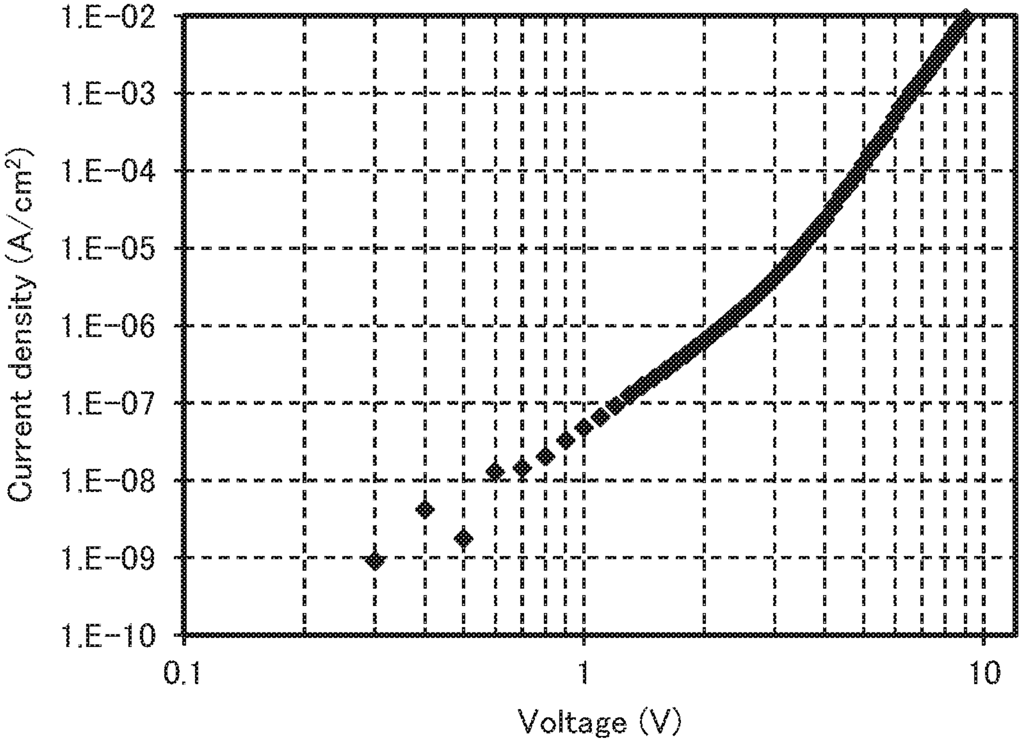
FIG. 43 shows the current density-voltage characteristics of an electron-only element.

FIG. 43 shows the current density-voltage characteristics of the electron-only element using the film formed by co-evaporation of ZADN and Liq as the second layer 211.

Figure 44:
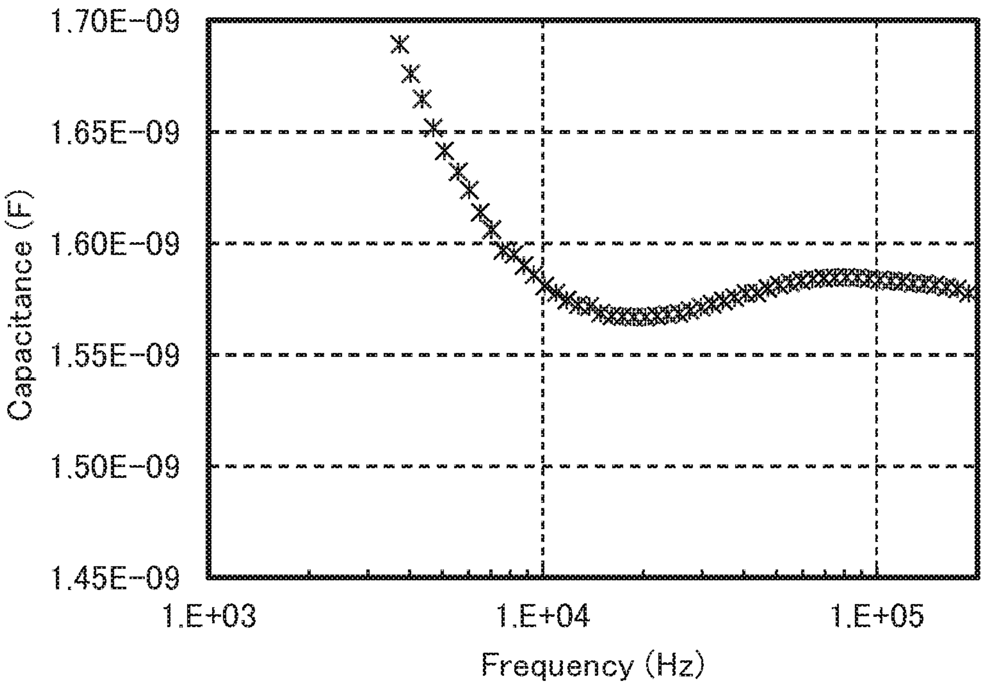
FIG. 44 shows the calculated frequency characteristics of capacitance C when a DC voltage is 7.0 V and ZADN to Liq is 1:1.

The impedance was measured under the conditions where the frequency was 1 Hz to 3 MHz, the AC voltage was 70 mV, and the applied DC voltage was 5.0 V to 9.0 V. Here, capacitance is calculated from admittance, which is the reciprocal number of the obtained impedance (the above formula (1)). FIG. 44 shows the frequency characteristics of the calculated capacitance C when the application voltage was 7.0 V.

The frequency characteristics of the capacitance C are obtained from a phase difference in current, which is because a space charge generated by carriers injected by the micro voltage signal cannot completely follow the micro AC voltage. The transit time of the injected carriers in the film is defined by time T until the carriers reach a counter electrode, and is represented by the following formula (5).

[Formula 3]

$$T = \frac{4}{3}\frac{L^2}{\mu V_0} \quad (5)$$

A change in negative susceptance (−ΔB) corresponds to a value (−ωΔC) that is obtained by multiplying a change in capacitance −ΔC by angular frequency ω. The formula (3) shows that there is a relation between peak frequency on the lowest frequency side $f'_{max}$ ($=\omega_{max}/2\pi$) and the transit time T as shown in the following formula (6).

[Formula 4]

$$T = \frac{4.5}{2\pi f'_{max}} \quad (6)$$

Figure 45:
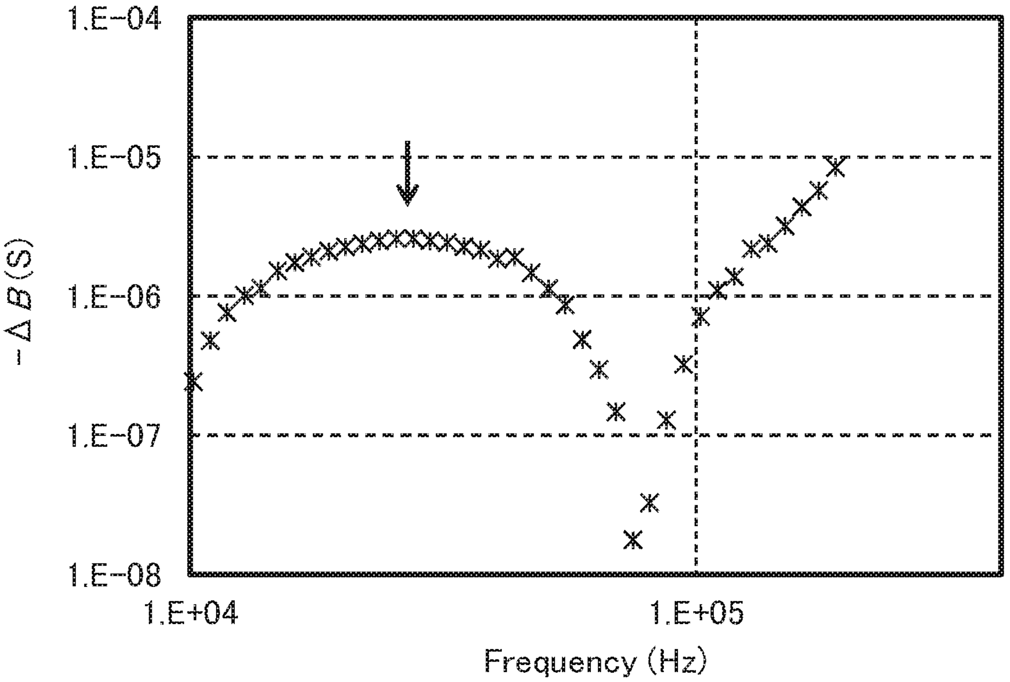
FIG. 45 shows the frequency characteristics of $-\Delta B$ when a DC voltage is 7.0 V and ZADN to Liq is 1:1.

FIG. 45 shows the frequency characteristics of −ΔB calculated from the above measurement (i.e., −ΔB when the DC voltage was 7.0 V). The peak frequency on the lowest frequency side $f'_{max}$ is indicated by an arrow in FIG. 45.

The transit time T is obtained from $f'_{max}$ obtained from the above measurement and analysis (see the above formula (6)); thus, in this example, the electron mobility when the DC voltage was 7.0 V can be obtained from the above formula (5). By performing the above measurement while the DC voltage is changed from 5.0 V to 9.0 V, the electron mobility at each voltage (electric field strength) can be calculated, so that the electric field strength dependence of the mobility can also be measured.

Figure 46:
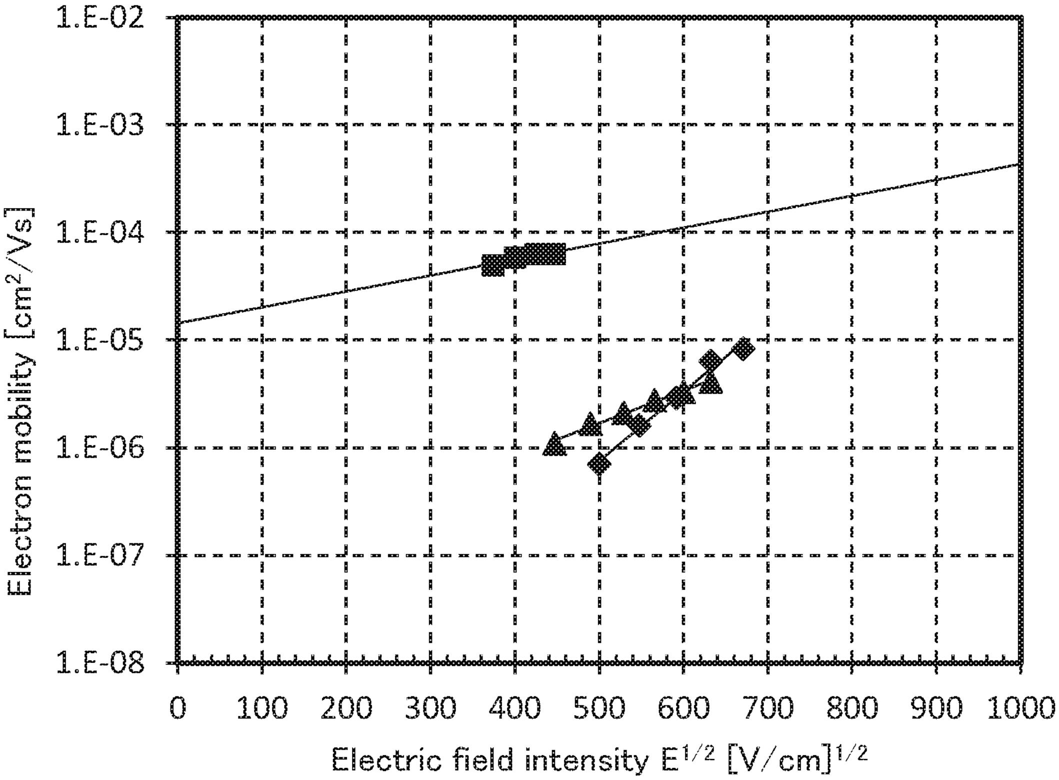
FIG. 46 shows the electric field strength dependence of electron mobility of organic compounds.

FIG. 46 shows the final electric field strength dependence of the electron mobility of the organic compounds obtained by the above calculation method, and Table 26 shows the values of the electron mobility in the case where the square root of the electric field strength [V/cm] read from FIG. 46 was 600 $[V/cm]^{1/2}$.

TABLE 26

| | Electron mobility ($cm^2/Vs$) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated as described above. For the details about the measurement method, refer to the following reference: T. Okachi et al., *Japanese Journal of Applied Physics*, vol. 47, No. 12, pp. 8965-8972, 2008.

Reference Example 2

In this reference example, synthesis methods of the organic compounds used in the examples are described.

Synthesis Example 1: Synthesis Method of 4-[3-(9-Phenyl-9H-fluoren-9-yl)phenyl]-4',4"-diphenyltriphenylamine (Abbreviation: mpBBAFLBi)

The structural formula of mpBBAFLBi is shown below.

[Chemical Formula 12]

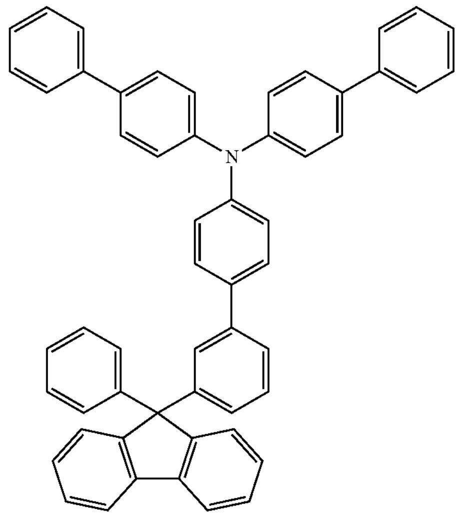

Into a 200 mL three-neck flask were added 2.0 g (5.0 mmol) of 9-(3-bromophenyl)-9-phenyl-9H-fluorene, 2.6 g (5.0 mmol) of 2-{4-[di(4-biphenylyl)amino]phenyl}-4,4,5,5-tetramethyl-1,3,2-dioxaborolan, 30 mg (0.10 mmol) of tri(ortho-tolyl)phosphine, and 2.8 g (20 mmol) of potassium carbonate, and the atmosphere in the flask was replaced with nitrogen. To the mixture were added 15 mL of toluene, 10 mL of ethanol, and 10 mL of water, and the mixture was degassed by being stirred while the pressure was reduced. To this mixture was added 11 mg (0.050 mmol) of palladium(II) acetate, and stirring was performed under a nitrogen stream at 80° C. for 2 hours.

After that, the mixture was suction-filtered, whereby a solid was collected. The solid was dissolved in heated toluene, and this mixture was subjected to suction filtration through Celite, alumina, and Florisil. A solid obtained by concentration of the filtrate was recrystallized with toluene, so that 2.7 g of a target white solid was obtained in a yield of 74%. The synthesis scheme of the above synthesis method is shown below.

[Chemical Formula 13]

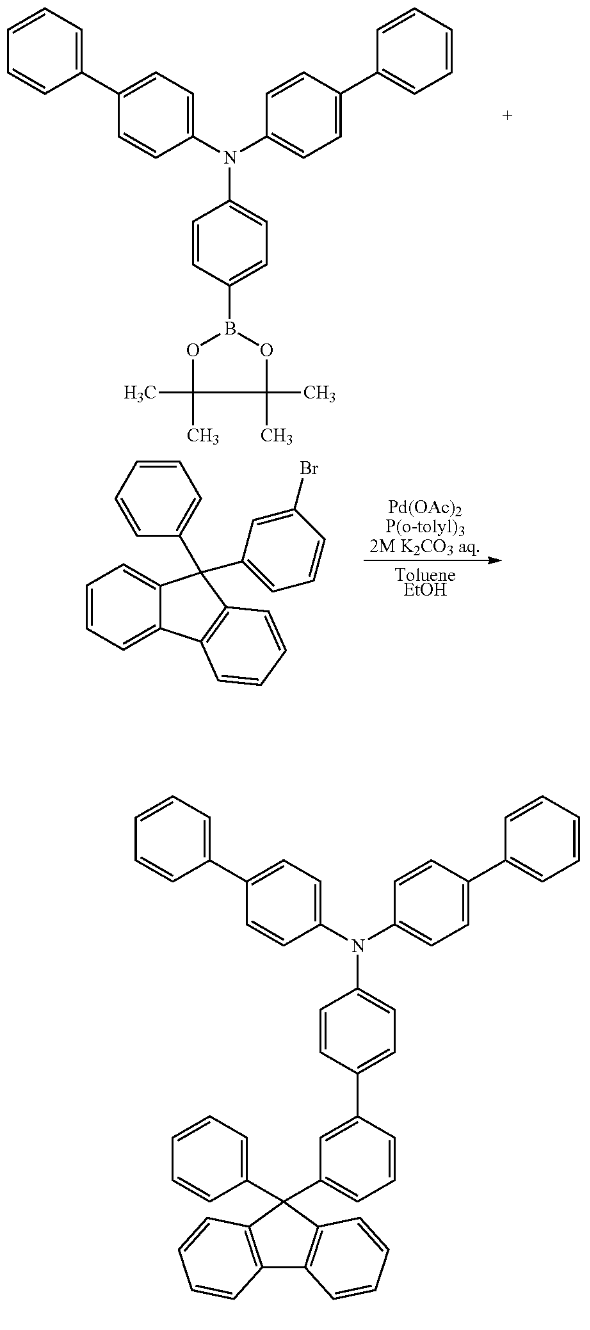

By a train sublimation method, 2.6 g of the obtained white solid was purified. In the purification by sublimation, the white solid was heated at 280° C. under a pressure of 3.5 Pa with an argon flow rate of 5.0 mL/min. After the purification by sublimation, 2.3 g of a pale yellow solid was obtained at a collection rate of 88%.

Analysis results by nuclear magnetic resonance ($^1$H NMR) spectroscopy of the obtained pale yellow solid are shown below. The results show that mpBBAFLBi was obtained.

$^1$H NMR (DMSO, 300 MHz): δ=7.06-7.49 (m, 29H), 7.59-7.64 (m, 8H), 7.90 (d, J=7.8 Hz, 2H)

Synthesis Example 2: Synthesis Method of 4-(4-Biphenylyl)-4'-[4-(2-naphthyl)phenyl]-4"-phenyltri-phenylamine (Abbreviation: TPBiAβNBi)

The structural formula of TPBiAβNBi is shown below.

[Chemical Formula 14]

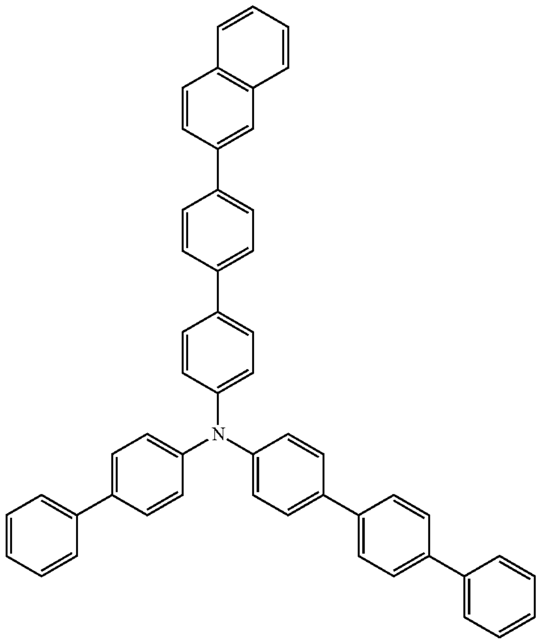

Step 1: Synthesis of N-(1,1'Biphenyl)-4-yl-(1,1':4', 1"-terphenyl)-4-4-amine Into a 200 mL three-neck flask equipped with a reflux pipe were added 2.4 g (7.4 mmol) of N-(4-bromophenyl)-4-biphenylamine, 1.5 g (7.4 mmol) of 4-biphenylboronic acid, 47 mg (0.15 mmol) of tri(ortho-tolyl)phosphine, 7 mL (2.0 mol/L) of an aqueous potassium carbonate solution, 60 mL of toluene, and 20 mL of ethanol, the mixture was degassed under reduced pressure, and then the atmosphere in the flask was replaced with nitrogen. Then, 16 mg (74 μmol) of palladium(II) acetate was added to the obtained mixture, and the mixture was refluxed for 3 hours. After the stirring, the precipitated solid was collected by suction filtration and washed with toluene, ethanol, and water, so that 2.94 g of a target gray solid was obtained in a yield of 99% or higher. The synthesis scheme of Step 1 is shown below.

[Chemical Formula 15]

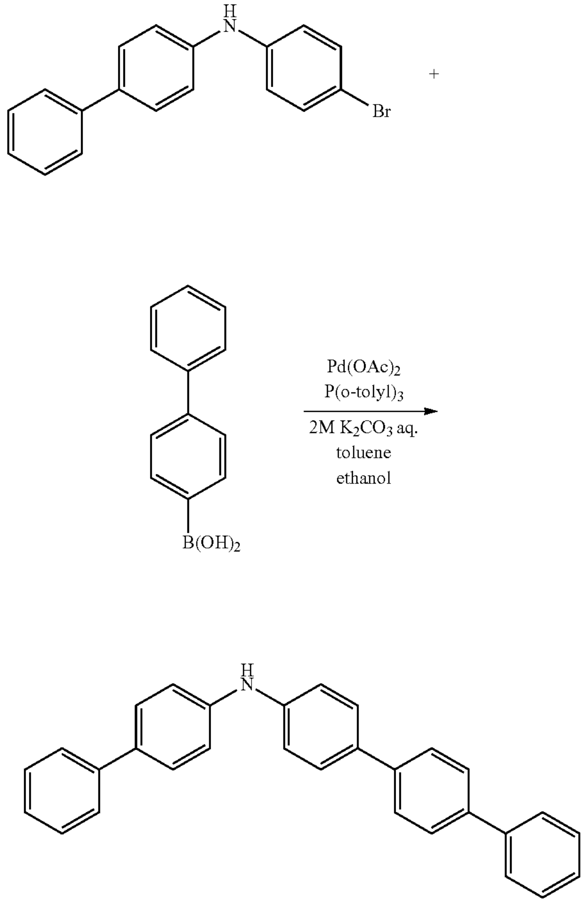

Step 2: Synthesis of 2-(4-Chloro-biphenyl-4-yl)naphthalene

Into a 200 mL three-neck flask equipped with a reflux pipe were added 2.4 g (10 mmol) of 1-chloro-4-iodobenzene, 2.5 g (10 mmol) of 4-(2-naphthyl)phenylboronic acid, 61 mg (0.20 mmol) of tri(ortho-tolyl)phosphine, 20 mL (2.0 mol/L) of an aqueous potassium carbonate solution, 70 mL of toluene, and 30 mL of ethanol, the mixture was degassed under reduced pressure, and the atmosphere in the flask was replaced with nitrogen. The mixture was heated at 60° C., and then 22 mg (0.10 mmol) of palladium(II) acetate was added thereto. The mixture was reacted by being stirred at 50° C. for 3 hours. After the stirring, the precipitated solid was collected by suction filtration and washed with toluene, water, and ethanol, so that 2.7 g of a brown solid was obtained in a yield of 86%. The synthesis scheme of Step 2 is shown below.

[Chemical Formula 16]

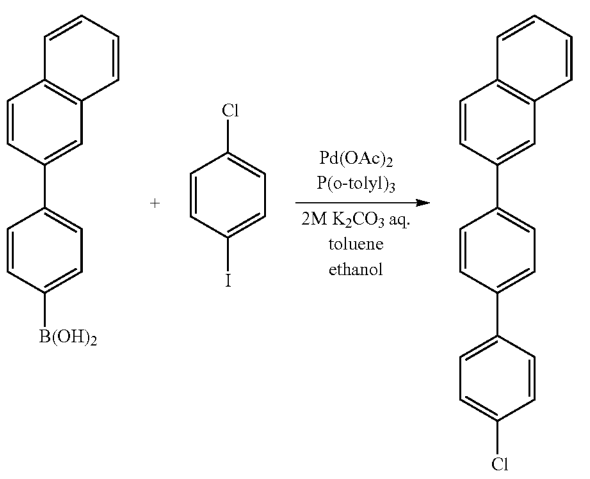

Analysis results by $^1$H NMR spectroscopy of the obtained brown solid are shown below. The results show that 2-(4-chloro-biphenyl-4-yl)naphthalene was obtained. $^1$H NMR (dichloromethane-$d_2$, 500 MHz): δ=8.13 (s, 1H), 7.96 (d, J=9.5 Hz, 1H), 7.94 (d, J=9.5 Hz, 1H), 7.89 (d, J=7.0 Hz, 1H), 7.85-7.81 (m, 3H), 7.72 (d, J=8.0 Hz, 2H), 7.64 (d, J=8.5 Hz, 2H), 7.55-7.49 (m, 2H), 7.46 (d, J=8.0 Hz, 2H)

Step 3: Synthesis of 4-(4-Biphenylyl)-4'-[4-(2-naphthyl)phenyl]-4"-phenyltriphenylamine (Abbreviation: TPBiAβNbi)

Into a 200 mL three-neck flask equipped with a reflux pipe were added 2.94 g (7.4 mmol) of N-(1,1'-biphenyl)-4-yl-(1,1':4',1"-terphenyl)-4-4-amine, which was obtained in Step 1, 2.32 g (7.4 mmol) of 2-(4-chloro-biphenyl-4-yl)naphthalene, which was obtained in Step 2, 52 mg (0.15 mmol) of di-tert-butyl(1-methyl-2,2-diphenylcyclopropyl)phosphine (product name: cBRIDP (registered trademark)), 1.4 g (15 mmol) of sodium-tert-butoxide, and 140 mL of xylene, the mixture was degassed under reduced pressure, and then the atmosphere in the flask was replaced with nitrogen. Then, 43 mg (74 μmol) of bis(dibenzylideneacetone)palladium(0) was added to the obtained mixture, and the mixture was refluxed for 5 hours. After the stirring, the precipitated solid was collected by suction filtration and washed with toluene, water, and ethanol, so that 3.8 g of a gray solid was obtained. The synthesis scheme of Step 3 is shown below.

[Chemical Formula 17]

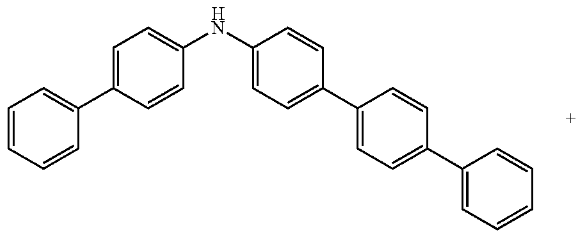

-continued

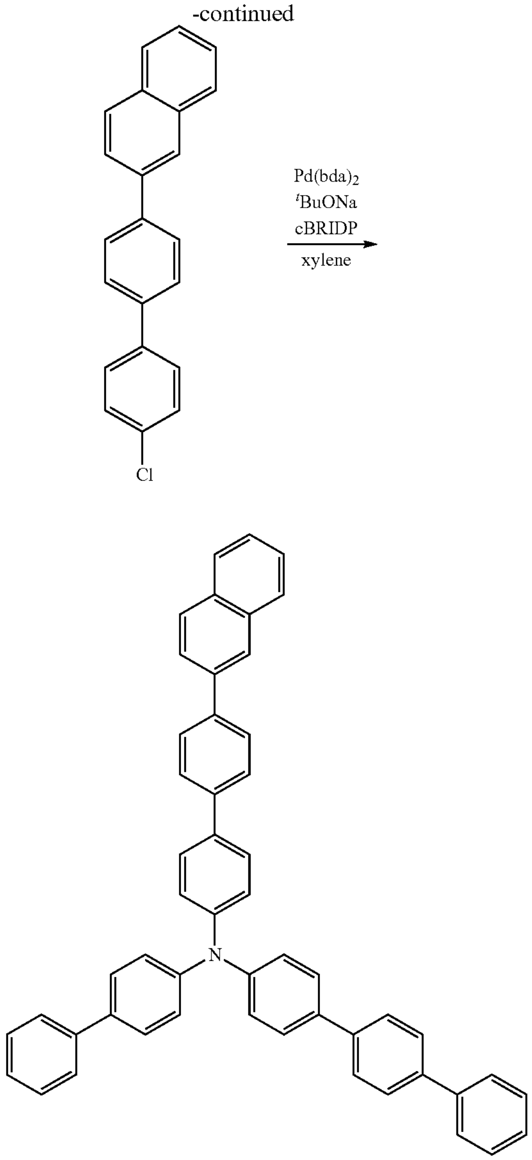

By a train sublimation method, 3.8 g of the obtained solid was purified. In the purification by sublimation, the solid was heated at 335° C. under a pressure of 3.8 Pa for 15 hours with an argon flow rate of 15 mL/min. After the purification by sublimation, 2.8 g of a target pale yellow solid was obtained at a collection rate of 74%.

Analysis results by $^1$H NMR spectroscopy of the obtained solid are shown below. The results show that TPBiAβNBi was obtained in this synthesis example. $^1$H NMR (chloroform-d, 500 MHz): δ=8.10 (d, J=1.5 Hz, 1H), 7.94 (d, J=9.0 Hz, 1H), 7.92 (d, J=7.5 Hz, 1H), 7.88 (d, J=7.5 Hz, 1H), 7.82-7.80 (m, 3H), 7.73 (d, J=8.5 Hz, 2H), 7.68 (s, 4H), 7.66 (d, J=7.0 Hz, 2H), 7.62-7.58 (m, 6H), 7.55 (d, J=8.5 Hz, 2H), 7.52-7.43 (m, 6H), 7.36 (t, J=7.0 Hz, 1H), 7.33 (t, J=7.0 Hz, 1H), 7.29-7.27 (m, 6H)

Synthesis Example 3: Synthesis Method of 4-[4-(9-Phenyl-9H-fluoren-9-yl)phenyl]-4',4''-diphenyltriphenylamine (Abbreviation: BBAFLBi)

The structural formula of BBAFLBi is shown below.

[Chemical Formula 18]

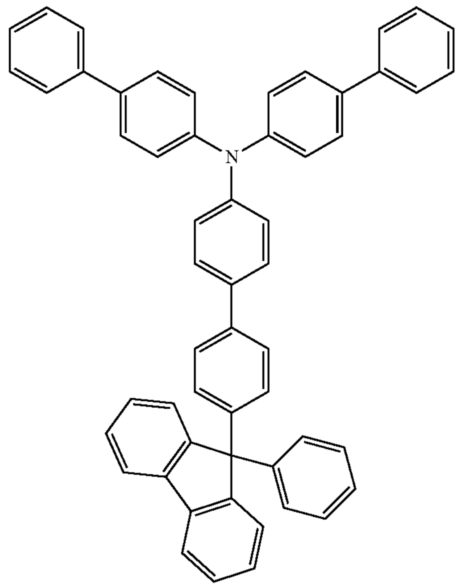

Step 1: Synthesis of 4-(9-Phenyl-9H-fluoren-9-yl)phenylboronic Acid

Into a 500 mL three-neck flask was added 15.89 g (40 mmol) of 9-(4-bromophenyl)-9-phenyl-9H-fluorene, the mixture was degassed under reduced pressure, and the atmosphere in the flask was replaced with nitrogen. Then, 200 mL of dehydrated tetrahydrofuran (abbreviation: THF) was added in the flask. After the mixture was cooled to approximately −78° C. while being stirred, 30 mL (48 mmol) of an n-butyllithium hexane solution (1.59 mol/L) was dripped to the mixture, and then the temperature of the mixture was raised to −40° C. and stirred for 1 hour. After that, 50 ml of dehydrated THF was added to the mixture and the mixture was cooled to approximately −78° C. again. Then, 6.4 ml (57 mmol) of trimethylborate was dripped to the mixture. The temperature of the mixture was raised to room temperature and stirred for 16 hours. Then, 25 mL of water and 30 mL of hydrochloric acid (1 N) were added to the solution, the solution was stirred, and the organic layer and the aqueous layer of the solution were separated. The obtained organic layer was washed with 100 mL of a saturated solution of sodium bicarbonate once and washed with 100 mL of saturated brine once. After the washing, the solution was dried with magnesium sulfate, concentrated, and recrystallized with toluene, so that 10.1 g of a white solid was obtained in a yield of 70%. The synthesis scheme of Step 1 is shown below.

[Chemical Formula 19]

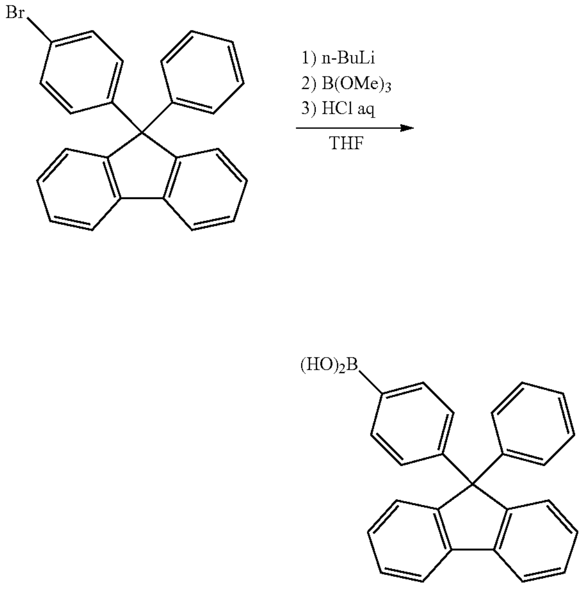

Step 2: Synthesis of BBAFLBi

Into a 200 mL three-neck flask were added 2.53 g (7 mmol) of 4-(9-phenyl-9H-fluoren-9-yl)phenylboronic acid, 3.34 g (7 mmol) of 4-bromo-4',4''-diphenyltriphenylamine, 2.90 g (7 mmol) of potassium carbonate, 70 mL of toluene, 12.5 mL of ethanol, and 10.5 mL of water, the mixture was degassed under reduced pressure, and the atmosphere in the flask was replaced with nitrogen. To this mixture were added 15.7 mg (0.07 mmol) of palladium(II) acetate and 42.2 mg (0.07 mmol) of tris(o-tolyl)phosphine, and stirring was performed under a nitrogen stream at 85° C. for 6 hours. After the mixture was cooled to room temperature, the precipitated solid was separated by filtration, and the obtained solution (filtrate) was washed with 100 mL of water twice and washed with 50 mL of saturated brine once. Then, moisture was removed with magnesium sulfate. The solid obtained here and the solid precipitated after the reaction and separated by filtration were combined, 300 mL of toluene was added to the mixture, heating was performed so that the solid was dissolved, and the solution was purified with Celite, alumina, Florisil, and Celite. The obtained filtrate was concentrated and recrystallized with ethanol, so that 4.54 g of a white solid was obtained in a yield of 89%. The synthesis scheme of Step 2 is shown below.

[Chemical Formula 20]

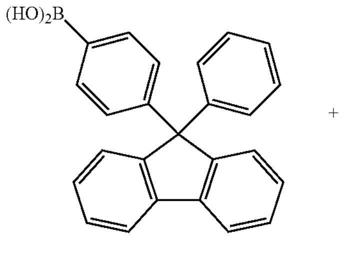

-continued

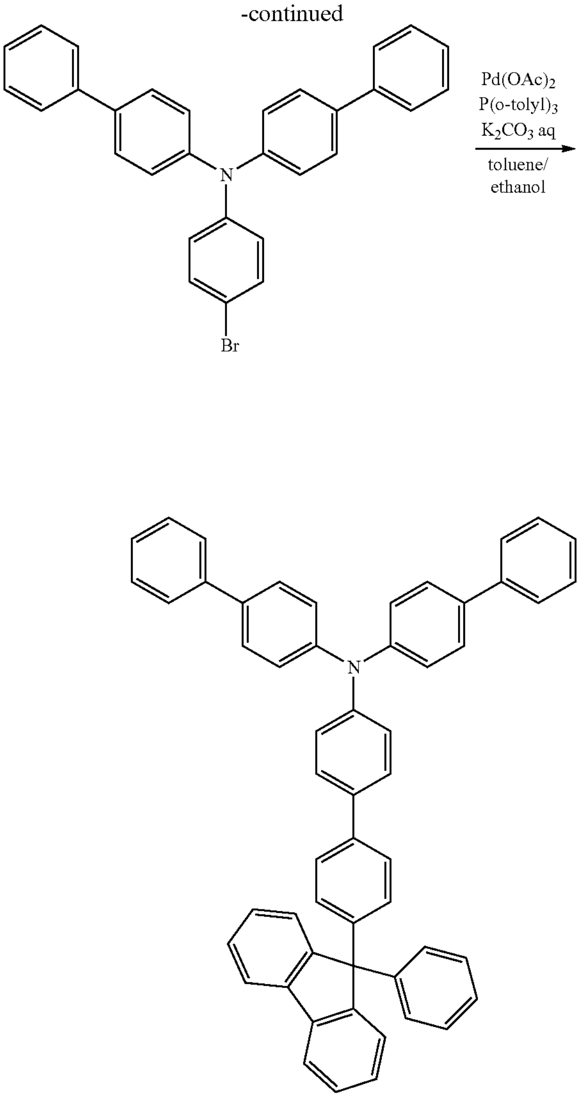

By a train sublimation method, 4.39 g of the obtained white solid was purified. In the purification by sublimation, the white solid was heated at 320° C. under a pressure of 3.5 Pa with an argon flow rate of 15 mL/min. After the purification by sublimation, 2.73 g of a white solid of BBAFLP was obtained at a collection rate of 62%.

Analysis results by $^1$H NMR spectroscopy of the obtained white solid are shown below. The results show that BBAFLP was obtained.

$^1$H NMR ($CDCl_3$, 500 MHz): δ=7.17-7.28 (m, 13H), 6=7.31 (dd, J=12.6 Hz, 7.4 Hz, 4H), 6=7.37 (dd, J=7.5 Hz, 1.1 Hz, 4H), 6=7.40-7.47 (m, 10H), 6=7.51 (d, J=8.6 Hz, 4H), 6=7.58 (d, J=8.1 Hz, 4H), 6=7.78 (d, J=7.4 Hz, 2H)

Synthesis Example 4: Synthesis Method of N-[4-(9H-Carbazol-9-yl)phenyl]-N-(1,1'-biphenyl-2-yl)-9,9'-spirobi[9H-fluoren]-2-amine (abbreviation: oYGBiSF)

The structural formula of oYGBiSF is shown below.

[Chemical Formula 21]

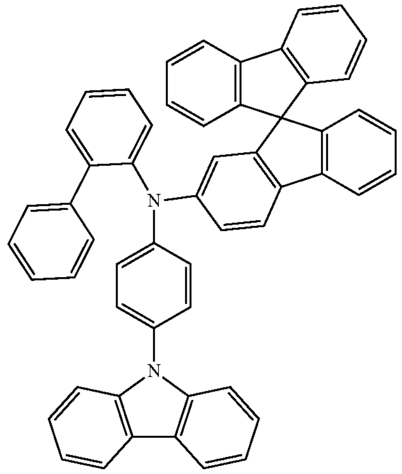

Step 1: Synthesis of N-(1,1'Biphenyl-2-yl)-9,9'-spirobi[9H-fluoren]-2-amine

Into a stoppered 200 mL three-neck flask equipped with a cooling tube and a three-way cock were added 1.8 g (10 mmol) of 2-aminobiphenyl, 4.1 g (10 mmol) of 2-bromo-9,9'-spirobi[9H-fluoren], 0.34 g (0.80 mmol) of 2-dicyclohexylphosphino-2',6'-dimethoxybiphenyl (abbreviation: S-Phos), and 2.0 g (20 mmol) of t-butoxysodium, the atmosphere in the flask was replaced with nitrogen, and 52 mL of toluene was added to the mixture. After the mixture was degassed under reduced pressure, a nitrogen stream was made to flow in the flask, and the mixture was heated and stirred at 60° C. After the temperature in the flask became 60° C., 0.24 g (0.40 mmol) of bis(dibenzylideneacetone) palladium(0) was added to the mixture, and the mixture was heated and stirred at 80° C. for 2.5 hours. After the mixture was heated and stirred, the precipitated solid was removed by suction filtration, the obtained filtrate was washed with water three times and then washed with saturated brine, and the organic layer was dried with magnesium sulfate. This mixture was gravity-filtered, and then the filtrate was concentrated, so that 3.4 g of a brown solid was obtained. The obtained brown solid was purified by silica gel column chromatography (the ratio of hexane to toluene was changed from 10:1 to 2:1 to form a gradient), so that a target white solid was obtained. The obtained solid was recrystallized with toluene and hexane, so that 3.7 g of a target white solid was obtained in a yield of 74%. The synthesis scheme of Step 1 is shown below.

[Chemical Formula 22]

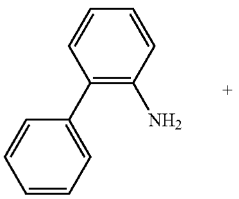

-continued

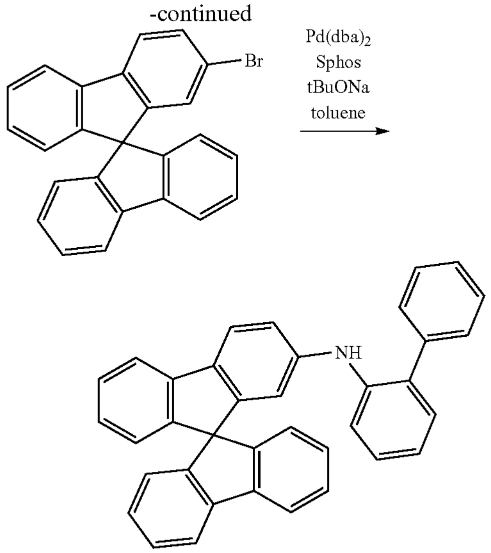

Step 2: Synthesis of N-[4-(9H-Carbazol-9-yl)phenyl]-N-(1,1'-biphenyl-2-yl)-9,9'-spirobi[9H-fluoren]-2-amine (Abbreviation: oYGBiSF)

Into a stoppered 200 mL three-neck flask equipped with a cooling tube and a three-way cock were added 2.7 g (5.5 mmol) of N-(1,1'-biphenyl-2-yl)-9,9'-spirobi[9H-fluoren]-2-amine, which was obtained in Step 1, 1.8 g (5.5 mmol) of 9-(4-bromophenyl)-9H-carbazole, 0.18 g (0.40 mmol) of 2-dicyclohexylphosphino-2',6'-dimethoxybiphenyl (abbreviation: S-Phos), and 1.1 g (11 mmol) of t-butoxysodium, the atmosphere in the flask was replaced with nitrogen, and 52 mL of toluene was added to the mixture. After the mixture was degassed under reduced pressure, a nitrogen stream was made to flow in the flask, 0.13 g (0.22 mmol) of bis(dibenzylideneacetone)palladium(0) was added to the mixture, and the mixture was heated and stirred at 80° C. After the mixture was heated and stirred, the precipitated solid was removed by suction filtration and the obtained filtrate was washed with water three times and then washed with saturated brine, and the organic layer was dried with magnesium sulfate. This mixture was gravity-filtered, and then the filtrate was concentrated, so that a brown solid was obtained. The obtained brown solid was purified by silica gel column chromatography (the ratio of hexane to toluene was changed from 10:1 to 2:1 to form a gradient), so that a target white solid was obtained. The obtained solid was recrystallized with toluene and hexane, so that 3.2 g of a target white solid was obtained in a yield of 79%.

By a train sublimation method, the obtained white solid was purified. In the purification by sublimation, 3.2 g of the white solid was heated at 310° C. for 15 hours under a pressure of 2.9 Pa with an argon flow rate of 15 mL/min. After the purification by sublimation, 2.9 g of a target colorless transparent cubic crystal was obtained at a collection rate of 91%. The synthesis scheme of Step 2 is shown below.

[Chemical Formula 23]

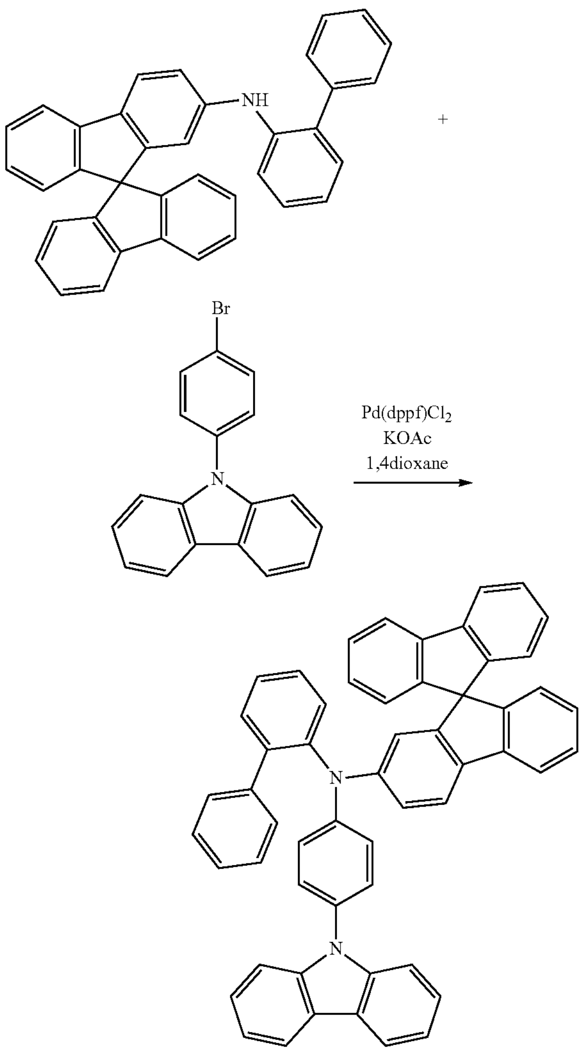

Analysis results by $^1$H NMR spectroscopy of the obtained solid are shown below. The results show that oYGBiSF was obtained. $^1$H NMR (dichloromethane-$d_2$, 500 MHz): δ=6.29 (sd, J2=2.0 Hz, 1H), 6.56 (d, J=7.5 Hz, 1H), 6.67 (d, J=7.5 Hz, 2H), 6.86 (dt, J1=9.0 Hz, J2=2.0 Hz, 2H), 6.93 (dd, J1=8.3 Hz, J2=2.0 Hz, 1H), 7.00 (td, J1=7.5 Hz, J2=1.0 Hz, 1H), 7.04-7.08 (m, 5H), 7.08-7.11 (m, 2H), 7.14 (td, J1=7.5 Hz, J2=1.0 Hz, 2H), 7.21-7.31 (m, 9H), 7.34 (td, J1=7.0 Hz, J2=1.5 Hz, 2H), 7.38 (td, J1=7.5 Hz, J2=1.0 Hz, 2H), 7.59 (d, J=8.0 Hz, 1H), 7.70 (d, J=8.0 Hz, 1H), 7.79 (d, J=8.0 Hz, 2H), 8.09 (d, J=8.0 Hz, 2H)

REFERENCE NUMERALS

101: anode, 102: cathode, 103: EL layer, 111: hole-injection layer, 112: hole-transport layer, 112-1: first hole-transport layer, 112-2: second hole-transport layer, 113: light-emitting layer, 114: electron-transport layer, 115: electron-injection layer, 116: charge generation layer, 117: p-type layer, 118: electron-relay layer, 119: electron-injection buffer layer, 201: anode, 202: cathode, 210: first layer, 211: second layer, 212: third layer, 400: substrate, 401: anode, 403: EL layer, 404: cathode, 405: sealing material, 406: sealing material,

407: sealing substrate, 412: pad, 420: IC chip, 501: anode, 502: cathode, 511: first light-emitting unit, 512: second light-emitting unit, 513: charge-generation layer, 601: driver circuit portion (source line driver circuit), 602: pixel portion, 603: driver circuit portion (gate line driver circuit), 604: sealing substrate, 605: sealing material, 607: space, 608: wiring, 609: flexible printed circuit (FPC), 610: element substrate, 611: switching FET, 612: current controlling FET, 613: anode, 614: insulator, 616: EL layer, 617: cathode, 618: light-emitting device, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film 1021: second interlayer insulating film, 1022: electrode, 1024W: anode, 1024R: anode, 1024G: anode, 1024B: anode, 1025: partition, 1028: EL layer, 1029: cathode, 1031: sealing substrate, 1032: sealing material, 1033: transparent base material, 1034R: red coloring layer, 1034G: green coloring layer, 1034B: blue coloring layer, 1035: black matrix, 1036: overcoat layer, 1037: third interlayer insulating film, 1040: pixel portion, 1041: driver circuit portion, 1042: peripheral portion, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: second display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, 9315: housing.

This application is based on Japanese Patent Application Serial No. 2018-180795 filed with Japan Patent Office on Sep. 26, 2018, Japanese Patent Application Serial No. 2018-191552 filed with Japan Patent Office on Oct. 10, 2018, and Japanese Patent Application Serial No. 2018-224074 filed with Japan Patent Office on Nov. 29, 2018, the entire contents of which are hereby incorporated by reference.

The invention claimed is:

1. A light-emitting device comprising:

an anode;

a cathode; and an EL layer between the anode and the cathode, wherein the EL layer comprises a first layer, a second layer, a third layer, a light-emitting layer, and a fourth layer in this order from an anode side, wherein the first layer is in contact with the anode, wherein the first layer comprises a first organic compound and a second organic compound, wherein the second layer comprises a third organic compound, wherein the third layer comprises a fourth organic compound, wherein the light-emitting layer comprises a fifth organic compound and a sixth organic compound, wherein the fourth layer comprises a seventh organic compound, wherein the first organic compound exhibits an electron-accepting property with respect to the second organic compound, wherein the second organic compound and the third organic compound are the same substance, wherein the fifth organic compound is an emission center substance, wherein the sixth organic compound has a heterocyclic skeleton, wherein a HOMO level of the second organic compound is higher than or equal to −5.7 eV and lower than or equal to −5.2 eV, wherein electron mobility of the seventh organic compound when a square root of electric field strength [V/cm] is 600 is higher than or equal to $1\times10^{-7}$ $cm^2/Vs$ and lower than or equal to $5\times10^{-5}$ $cm^2/Vs$, wherein a HOMO level of the fourth organic compound is deeper than a HOMO level of the third organic compound, wherein a difference between the HOMO level of the third organic compound and the HOMO level of the fourth organic compound is less than or equal to 0.2 eV, wherein a difference between the HOMO level of the fourth organic compound and a HOMO level of the sixth organic compound is less than 0.2 eV, and wherein the fourth organic compound is a compound having an aromatic amine skeleton having a substituent that includes a dibenzofuran ring, and a nitrogen directly bonded to an aromatic group in the aromatic amine skeleton is not in a carbazolyl group.

2. The light-emitting device according to claim 1, wherein the second organic compound has a first hole-transport skeleton, wherein the third organic compound has a second hole-transport skeleton, wherein the fourth organic compound has a third hole-transport skeleton, and wherein each of the first hole-transport skeleton, the second hole-transport skeleton, and the third hole-transport skeleton is independently any one of a carbazole skeleton, a dibenzofuran skeleton, a dibenzothiophene skeleton, and an anthracene skeleton.

3. The light-emitting device according to claim 1, wherein the sixth organic compound further has an anthracene skeleton.

4. The light-emitting device according to claim 1, wherein the second organic compound has a dibenzofuran skeleton.

5. The light-emitting device according to claim 1, wherein the seventh organic compound has a quinoxaline skeleton.

6. The light-emitting device according to claim 1, wherein the fifth organic compound is a blue fluorescent material.

7. A light-emitting apparatus comprising:

the light-emitting device according to claim 1; and a transistor, or a substrate.

8. A light-emitting device comprising:

an anode;

a cathode; and an EL layer between the anode and the cathode, wherein the EL layer comprises a first layer, a second layer, a third layer, a light-emitting layer, and a fourth layer in this order from an anode side, wherein the first layer is in contact with the anode, wherein the first layer comprises a first organic compound and a second organic compound, wherein the second layer comprises a third organic compound, wherein the third layer comprises a fourth organic compound, wherein the light-emitting layer comprises a fifth organic compound and a sixth organic compound, wherein the fourth layer comprises a seventh organic compound, wherein the first organic compound exhibits an electron-accepting property with respect to the second organic compound, wherein the second organic compound and the third organic compound are the same substance, wherein the fifth organic compound is an emission center substance, wherein the sixth organic compound has a heterocyclic skeleton, wherein a HOMO level of the second organic compound is higher than or equal to −5.7 eV and lower than or equal to −5.2 eV, wherein a LUMO level of the sixth organic compound is shallower than a LUMO level of the seventh organic compound, wherein a difference between the LUMO level of the sixth organic compound and the LUMO level of the seventh organic compound is greater than or equal to 0.1 eV and less than or equal to 0.3 eV, wherein a HOMO level of the fourth organic compound is deeper than a HOMO level of the third organic compound, wherein a difference between the HOMO level of the third organic compound and the HOMO level of the fourth organic compound is less than or equal to 0.2 eV, wherein a difference between the HOMO level of the fourth organic compound and a HOMO level of the sixth organic compound is less than 0.2 eV, and wherein the fourth organic compound is a compound having an aromatic amine skeleton having a substituent that includes a dibenzofuran ring, and a nitrogen directly bonded to an aromatic group in the aromatic amine skeleton is not in a carbazolyl group.

9. The light-emitting device according to claim 8, wherein the second organic compound has a first hole-transport skeleton, wherein the third organic compound has a second hole-transport skeleton, wherein the fourth organic compound has a third hole-transport skeleton, and wherein each of the first hole-transport skeleton, the second hole-transport skeleton, and the third hole-transport skeleton is independently any one of a carbazole skeleton, a dibenzofuran skeleton, a dibenzothiophene skeleton, and an anthracene skeleton.

10. The light-emitting device according to claim 8, wherein the sixth organic compound further has an anthracene skeleton.

11. The light-emitting device according to claim 8, wherein the second organic compound has a dibenzofuran skeleton.

12. The light-emitting device according to claim 8, wherein the seventh organic compound has a quinoxaline skeleton.

13. The light-emitting device according to claim 8, wherein the fifth organic compound is a blue fluorescent material.

14. A light-emitting apparatus comprising:

the light-emitting device according to claim 8; and a transistor, or a substrate.

15. A light-emitting device comprising:

an anode;

a cathode; and an EL layer between the anode and the cathode, wherein the EL layer comprises a first layer, a second layer, a third layer, a light-emitting layer, and a fourth layer in this order from an anode side, wherein the first layer is in contact with the anode, wherein the first layer comprises a first organic compound and a second organic compound, wherein the second layer comprises a third organic compound, wherein the third layer comprises a fourth organic compound, wherein the light-emitting layer comprises a fifth organic compound and a sixth organic compound, wherein the fourth layer comprises a seventh organic compound, wherein the first organic compound exhibits an electron-accepting property with respect to the second organic compound, wherein the second organic compound and the third organic compound are the same substance, wherein the fifth organic compound is an emission center substance, wherein the sixth organic compound has a heterocyclic skeleton, wherein a HOMO level of the second organic compound is higher than or equal to −5.7 eV and lower than or equal to −5.2 eV, wherein the seventh organic compound is a x-electron deficient heteroaromatic compound comprising a triazine skeleton, wherein a LUMO level of the sixth organic compound is shallower than a LUMO level of the seventh organic compound, wherein a difference between the LUMO level of the sixth organic compound and the LUMO level of the seventh organic compound is greater than or equal to 0.1 eV and less than or equal to 0.3 eV, wherein a HOMO level of the fourth organic compound is deeper than a HOMO level of the third organic compound, wherein a difference between the HOMO level of the third organic compound and the HOMO level of the fourth organic compound is less than or equal to 0.2 eV, wherein a difference between the HOMO level of the fourth organic compound and a HOMO level of the sixth organic compound is less than 0.2 eV, and wherein the fourth organic compound is a compound having an aromatic amine skeleton having a substituent that includes a dibenzofuran ring, and a nitrogen directly bonded to an aromatic group in the aromatic amine skeleton is not in a carbazolyl group.

16. The light-emitting device according to claim 15, wherein the second organic compound has a first hole-transport skeleton, wherein the third organic compound has a second hole-transport skeleton, wherein the fourth organic compound has a third hole-transport skeleton, and wherein each of the first hole-transport skeleton, the second hole-transport skeleton, and the third hole-transport skeleton is independently any one of a carbazole skeleton, a dibenzofuran skeleton, a dibenzothiophene skeleton, and an anthracene skeleton.

17. The light-emitting device according to claim 15, wherein the sixth organic compound further has an anthracene skeleton.

18. The light-emitting device according to claim 15, wherein a difference between the HOMO level of the third organic compound and a HOMO level of the fourth organic compound is less than or equal to 0.2 eV.

19. The light-emitting device according to claim 15, wherein the second organic compound has a dibenzofuran skeleton.

20. The light-emitting device according to claim 15, wherein the seventh organic compound has a quinoxaline skeleton.

21. The light-emitting device according to claim 15, wherein the fifth organic compound is a blue fluorescent material.

22. A light-emitting apparatus comprising:
the light-emitting device according to claim 15; and
a transistor, or a substrate.

23. An electronic device comprising:
the light-emitting device according to claim 1; and
a sensor, an operation button, a speaker, or a microphone.

24. An electronic device comprising:
the light-emitting device according to claim 8; and
a sensor, an operation button, a speaker, or a microphone.

25. An electronic device comprising:
the light-emitting device according to claim 15; and
a sensor, an operation button, a speaker, or a microphone.

26. A lighting device comprising:
the light-emitting device according to claim 1; and
a housing.

27. A lighting device comprising:
the light-emitting device according to claim 8; and
a housing.

28. A lighting device comprising:
the light-emitting device according to claim 15; and
a housing.

* * * * *